United States Patent
Yamazaki et al.

(10) Patent No.: US 12,170,338 B2
(45) Date of Patent: Dec. 17, 2024

(54) LOGIC CIRCUIT AND SEMICONDUCTOR DEVICE

(71) Applicant: Semiconductor Energy Laboratory Co., Ltd., Atsugi (JP)

(72) Inventors: Shunpei Yamazaki, Setagaya (JP); Jun Koyama, Sagamihara (JP); Masashi Tsubuku, Atsugi (JP); Kosei Noda, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/237,431

(22) Filed: Aug. 24, 2023

(65) Prior Publication Data
US 2023/0395726 A1    Dec. 7, 2023

Related U.S. Application Data

(63) Continuation of application No. 17/565,771, filed on Dec. 30, 2021, now Pat. No. 11,742,432, which is a
(Continued)

(30) Foreign Application Priority Data

Oct. 16, 2009  (JP) .................................. 2009-238914

(51) Int. Cl.
*H01L 33/16*   (2010.01)
*H01L 27/02*   (2006.01)
(Continued)

(52) U.S. Cl.
CPC ...... *H01L 29/7869* (2013.01); *H01L 27/0207* (2013.01); *H01L 27/1225* (2013.01);
(Continued)

(58) Field of Classification Search
CPC . H01L 22/34; H01L 27/0207; H01L 27/1225; H01L 29/7869; H01L 29/78696; H01L 2924/0002
See application file for complete search history.

(56) References Cited

U.S. PATENT DOCUMENTS 3,925,686 A    12/1975   Nomiya
4,449,224 A     5/1984   Harari
(Continued)

FOREIGN PATENT DOCUMENTS

CN    001438827 A    8/2003
CN    001691119 A    11/2005
(Continued)

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
(Continued)

*Primary Examiner* — Kurtis R Bahr
(74) *Attorney, Agent, or Firm* — Eric J. Robinson; Robinson Intellectual Property Law Office, P.C.

(57) ABSTRACT

A logic circuit includes a thin film transistor having a channel formation region formed using an oxide semiconductor, and a capacitor having terminals one of which is brought into a floating state by turning off the thin film transistor. The oxide semiconductor has a hydrogen concentration of $5\times10^{19}$ (atoms/cm$^3$) or less and thus substantially serves as an insulator in a state where an electric field is not generated. Therefore, off-state current of a thin film transistor can be reduced, leading to suppressing the leakage of electric charge stored in a capacitor, through the thin film transistor. Accordingly, a malfunction of the logic circuit can be prevented. Further, the excessive amount of current
(Continued)

which flows in the logic circuit can be reduced through the reduction of off-state current of the thin film transistor, resulting in low power consumption of the logic circuit.

3 Claims, 30 Drawing Sheets

Related U.S. Application Data continuation of application No. 16/919,441, filed on Jul. 2, 2020, now Pat. No. 11,302,824, which is a continuation of application No. 16/787,562, filed on Feb. 11, 2020, now Pat. No. 10,770,597, which is a continuation of application No. 16/555,275, filed on Aug. 29, 2019, now Pat. No. 10,593,810, which is a continuation of application No. 14/936,305, filed on Nov. 9, 2015, now Pat. No. 10,490,671, which is a continuation of application No. 13/845,424, filed on Mar. 18, 2013, now Pat. No. 10,211,344, which is a continuation of application No. 12/901,057, filed on Oct. 8, 2010, now Pat. No. 8,400,187.

(51) Int. Cl.
  *H01L 27/12* (2006.01)
  *H01L 29/786* (2006.01)
  *H01L 21/66* (2006.01)

(52) U.S. Cl.
  CPC ........ *H01L 29/78696* (2013.01); *H01L 22/34* (2013.01); *H01L 2924/0002* (2013.01)

(56) References Cited

U.S. PATENT DOCUMENTS

| | | | |
|---|---|---|---|
| 5,731,856 | A | 3/1998 | Kim et al. |
| 5,744,864 | A | 4/1998 | Cillessen et al. |
| 5,847,410 | A | 12/1998 | Nakajima |
| 5,978,256 | A | 11/1999 | Sohn et al. |
| 6,242,289 | B1 | 6/2001 | Nakajima et al. |
| 6,281,552 | B1 | 8/2001 | Kawasaki et al. |
| 6,294,274 | B1 | 9/2001 | Kawazoe et al. |
| 6,479,329 | B2 | 11/2002 | Nakajima et al. |
| 6,529,397 | B2 | 3/2003 | Takeda et al. |
| 6,563,174 | B2 | 5/2003 | Kawasaki et al. |
| 6,586,346 | B1 | 7/2003 | Yamazaki et al. |
| 6,614,076 | B2 | 9/2003 | Kawasaki et al. |
| 6,680,242 | B2 | 1/2004 | Ohtsu et al. |
| 6,714,183 | B2 | 3/2004 | Yamazaki et al. |
| 6,727,522 | B1 | 4/2004 | Kawasaki et al. |
| 6,744,479 | B2 | 6/2004 | Hasegawa |
| 6,756,816 | B2 | 6/2004 | Miyake |
| 6,759,895 | B2 | 7/2004 | Takami |
| 6,784,457 | B2 * | 8/2004 | Yamazaki ........... H01L 27/1248 257/E29.147 |
| 6,787,806 | B1 | 9/2004 | Yamazaki et al. |
| 6,801,194 | B2 | 10/2004 | Miyazawa et al. |
| 6,809,382 | B2 | 10/2004 | Kawasaki et al. |
| 6,828,950 | B2 | 12/2004 | Koyama |
| 6,853,022 | B2 | 2/2005 | Koga et al. |
| 6,933,520 | B2 | 8/2005 | Yamazaki |
| 6,960,812 | B2 | 11/2005 | Yamazaki et al. |
| 7,042,245 | B2 | 5/2006 | Hidaka |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,067,843 | B2 | 6/2006 | Carcia et al. |
| 7,105,868 | B2 | 9/2006 | Nause et al. |
| 7,132,687 | B2 | 11/2006 | Kawasaki et al. |
| 7,145,174 | B2 | 12/2006 | Chiang et al. |
| 7,189,992 | B2 | 3/2007 | Wager, II et al. |
| 7,211,825 | B2 | 5/2007 | Shih et al. |
| 7,262,463 | B2 | 8/2007 | Hoffman |
| 7,282,782 | B2 | 10/2007 | Hoffman. et al. |
| 7,297,977 | B2 | 11/2007 | Hoffman et al. |
| 7,298,084 | B2 | 11/2007 | Baude et al. |
| 7,301,211 | B2 | 11/2007 | Yamazaki et al. |
| 7,323,356 | B2 | 1/2008 | Hosono et al. |
| 7,339,187 | B2 | 3/2008 | Wager, I et al. |
| 7,355,455 | B2 | 4/2008 | Hidaka |
| 7,384,862 | B2 | 6/2008 | Yamazaki |
| 7,385,224 | B2 | 6/2008 | Ishii et al. |
| 7,397,180 | B2 | 7/2008 | Yamazaki |
| 7,402,506 | B2 | 7/2008 | Levy et al. |
| 7,411,209 | B2 | 8/2008 | Endo et al. |
| 7,435,633 | B2 | 10/2008 | Todorokihara et al. |
| 7,443,202 | B2 | 10/2008 | Kimura et al. |
| 7,445,989 | B2 | 11/2008 | Ema et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,470,607 | B2 | 12/2008 | Carcia et al. |
| 7,501,293 | B2 | 3/2009 | Ito et al. |
| 7,507,618 | B2 | 3/2009 | Dunbar |
| 7,507,998 | B2 * | 3/2009 | Tseng ................. H01L 27/1255 257/306 |
| 7,544,967 | B2 | 6/2009 | Kim et al. |
| 7,566,904 | B2 | 7/2009 | Ishii |
| 7,575,966 | B2 | 8/2009 | Lai et al. |
| 7,576,394 | B2 | 8/2009 | Furuta et al. |
| 7,601,984 | B2 | 10/2009 | Sano et al. |
| 7,608,531 | B2 | 10/2009 | Isa et al. |
| 7,609,236 | B2 | 10/2009 | Koyama |
| 7,622,371 | B2 | 11/2009 | Pan et al. |
| 7,635,889 | B2 | 12/2009 | Isa et al. |
| 7,645,478 | B2 | 1/2010 | Thelss et al. |
| 7,663,302 | B2 | 2/2010 | Shin et al. |
| 7,663,404 | B2 | 2/2010 | Kimura et al. |
| 7,674,650 | B2 | 3/2010 | Akimoto et al. |
| 7,691,665 | B2 | 4/2010 | Brown et al. |
| 7,691,666 | B2 | 4/2010 | Levy et al. |
| 7,727,847 | B2 | 6/2010 | Tanaka et al. |
| 7,732,251 | B2 | 6/2010 | Hoffman et al. |
| 7,732,819 | B2 | 6/2010 | Akimoto et al. |
| 7,732,864 | B2 | 6/2010 | Kawahara et al. |
| 7,733,015 | B2 | 6/2010 | Saito |
| 7,737,517 | B2 | 6/2010 | Kawamura et al. |
| 7,741,869 | B2 | 6/2010 | Hidaka |
| 7,767,106 | B2 | 8/2010 | Chang |
| 7,772,021 | B2 | 8/2010 | Lee et al. |
| 7,781,964 | B2 | 8/2010 | Hara et al. |
| 7,791,072 | B2 | 9/2010 | Kumomi et al. |
| 7,791,074 | B2 | 9/2010 | Iwasaki |
| 7,791,082 | B2 | 9/2010 | Iwasaki |
| 7,795,613 | B2 | 9/2010 | Ito et al. |
| 7,808,045 | B2 | 10/2010 | Kawahara et al. |
| 7,817,170 | B2 | 10/2010 | Miyagawa et al. |
| 7,829,444 | B2 | 11/2010 | Yabuta et al. |
| 7,847,287 | B2 | 12/2010 | Kim et al. |
| 7,851,797 | B2 | 12/2010 | Yamazaki et al. |
| 7,863,611 | B2 | 1/2011 | Abe et al. |
| 7,867,636 | B2 | 1/2011 | Nakagawara et al. |
| 7,868,326 | B2 | 1/2011 | Sano et al. |
| 7,872,259 | B2 | 1/2011 | Den et al. |
| 7,884,360 | B2 | 2/2011 | Takechi et al. |
| 7,888,702 | B2 | 2/2011 | Akimoto et al. |
| 7,893,431 | B2 | 2/2011 | Kim et al. |
| 7,906,777 | B2 | 3/2011 | Yano et al. |
| 7,907,224 | B2 | 3/2011 | Ito et al. |
| 7,910,490 | B2 | 3/2011 | Akimoto et al. |
| 7,928,759 | B2 | 4/2011 | Hidaka |
| 7,928,937 | B2 | 4/2011 | Ozaki |
| 7,932,521 | B2 | 4/2011 | Akimoto et al. |
| 7,935,582 | B2 | 5/2011 | Iwasaki |
| 7,935,964 | B2 | 5/2011 | Kim et al. |
| 7,943,996 | B2 | 5/2011 | Kawahara et al. |
| 7,956,361 | B2 | 6/2011 | Iwasaki |
| 7,961,006 | B2 | 6/2011 | Kimura et al. |
| 8,026,877 | B2 | 9/2011 | Osame et al. |
| 8,030,663 | B2 | 10/2011 | Yamazaki et al. |
| 8,054,279 | B2 | 11/2011 | Umezaki et al. |

(56) References Cited

U.S. PATENT DOCUMENTS

| | | |
|---|---|---|
| 8,093,589 B2 | 1/2012 | Sugihara et al. |
| 8,129,718 B2 | 3/2012 | Hayashi et al. |
| 8,134,154 B2 | 3/2012 | Gosain et al. |
| 8,134,531 B2 | 3/2012 | Osame et al. |
| 8,154,024 B2 | 4/2012 | Iwasaki |
| 8,158,974 B2 | 4/2012 | Yano et al. |
| 8,169,017 B2 | 5/2012 | Ema et al. |
| 8,174,053 B2 | 5/2012 | Kitakado |
| 8,203,146 B2 | 6/2012 | Abe et al. |
| 8,212,248 B2 | 7/2012 | Itagaki et al. |
| 8,212,284 B2 | 7/2012 | Akimoto et al. |
| 8,274,077 B2 | 9/2012 | Akimoto et al. |
| 8,278,136 B2 | 10/2012 | Tanaka et al. |
| 8,284,127 B2 | 10/2012 | Koyama |
| 8,297,773 B2 | 10/2012 | Kuromizu |
| 8,314,637 B2 | 11/2012 | Kato et al. |
| 8,349,671 B2 | 1/2013 | Miyairi et al. |
| 8,384,077 B2 | 2/2013 | Yano et al. |
| 8,400,187 B2 | 3/2013 | Yamazaki et al. |
| 8,445,902 B2 | 5/2013 | Sato et al. |
| 8,450,732 B2 | 5/2013 | Kim et al. |
| 8,461,583 B2 | 6/2013 | Yano et al. |
| 8,462,083 B2 | 6/2013 | Ahn |
| 8,466,463 B2 | 6/2013 | Akimoto et al. |
| 8,471,596 B2 | 6/2013 | Kimura et al. |
| 8,501,554 B2 | 8/2013 | Miyairi et al. |
| 8,501,564 B2 | 8/2013 | Suzawa et al. |
| 8,508,283 B2 | 8/2013 | Kawahara et al. |
| 8,513,661 B2 | 8/2013 | Takahashi et al. |
| 8,563,977 B2 * | 10/2013 | Shimada ............ H01L 29/66969 |
| | | 438/482 |
| 8,564,195 B2 | 10/2013 | Ha et al. |
| 8,576,155 B2 | 11/2013 | Osame et al. |
| 8,592,861 B2 | 11/2013 | Akimoto et al. |
| 8,618,545 B2 | 12/2013 | Gosain et al. |
| 8,629,069 B2 | 1/2014 | Akimoto et al. |
| 8,659,523 B2 | 2/2014 | Osame et al. |
| 8,669,550 B2 | 3/2014 | Akimoto et al. |
| 8,703,560 B2 | 4/2014 | Miyairi et al. |
| 8,723,175 B2 | 5/2014 | Yano et al. |
| 8,742,412 B2 | 6/2014 | Goyal et al. |
| 8,743,044 B2 | 6/2014 | Umezaki et al. |
| 8,748,215 B2 | 6/2014 | Yamazaki |
| 8,779,419 B2 | 7/2014 | Yano et al. |
| 8,785,240 B2 | 7/2014 | Watanabe |
| 8,790,959 B2 | 7/2014 | Akimoto et al. |
| 8,791,457 B2 | 7/2014 | Yano et al. |
| 8,796,069 B2 | 8/2014 | Akimoto et al. |
| 8,884,651 B2 | 11/2014 | Yamazaki et al. |
| 8,902,145 B2 | 12/2014 | Umezaki et al. |
| 8,981,369 B2 | 3/2015 | Yano et al. |
| 8,994,439 B2 | 3/2015 | Kaneyasu et al. |
| 9,099,562 B2 | 8/2015 | Akimoto et al. |
| 9,249,032 B2 | 2/2016 | Inoue et al. |
| 9,300,771 B2 | 3/2016 | Osame et al. |
| 9,536,903 B2 | 1/2017 | Umezaki et al. |
| 9,698,207 B2 | 7/2017 | Osame et al. |
| 9,842,861 B2 | 12/2017 | Umezaki et al. |
| 10,297,618 B2 | 5/2019 | Umezaki et al. |
| 10,490,671 B2 | 11/2019 | Yamazaki et al. |
| 10,930,683 B2 | 2/2021 | Umezaki et al. |
| 11,967,598 B2 | 4/2024 | Umezaki et al. |
| 2001/0046027 A1 | 11/2001 | Tai et al. |
| 2002/0037634 A1 * | 3/2002 | Hiraoka ............ C23C 16/452 |
| | | 438/478 |
| 2002/0056838 A1 | 5/2002 | Ogawa |
| 2002/0132454 A1 | 9/2002 | Ohtsu et al. |
| 2002/0135554 A1 | 9/2002 | Yamazaki et al. |
| 2003/0034806 A1 | 2/2003 | Azami |
| 2003/0052324 A1 | 3/2003 | Kimura |
| 2003/0129853 A1 | 7/2003 | Nakajima et al. |
| 2003/0189401 A1 | 10/2003 | Kido et al. |
| 2003/0218221 A1 | 11/2003 | Wager, I et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0217778 A1 | 11/2004 | Miyake |
| 2005/0017302 A1 | 1/2005 | Hoffman |
| 2005/0162578 A1 | 7/2005 | Yamazaki et al. |
| 2005/0199959 A1 | 9/2005 | Chiang et al. |
| 2005/0199960 A1 | 9/2005 | Hoffman et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0118869 A1 * | 6/2006 | Lan .................. H01L 29/66606 |
| | | 257/E29.151 |
| 2006/0169973 A1 | 8/2006 | Isa et al. |
| 2006/0170111 A1 | 8/2006 | Isa. et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0240602 A1 * | 10/2006 | Roca I Cabarrocas ..................... |
| | | H01L 29/66765 |
| | | 257/E21.414 |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0141784 A1 | 6/2007 | Wager, III et al. |
| 2007/0152217 A1 | 7/2007 | Lai et al. |
| 2007/0161165 A1 | 7/2007 | Liu et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0054319 A1 | 3/2008 | Mouli |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0108198 A1 | 5/2008 | Wager, III et al. |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0191621 A1 * | 8/2008 | Ha .................. H10K 50/165 |
| | | 428/688 |
| 2008/0203387 A1 | 8/2008 | Kang et al. |
| 2008/0206959 A1 | 8/2008 | Takayama et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0277663 A1 | 11/2008 | Kang et al. |
| 2008/0291350 A1 | 11/2008 | Hayashi et al. |
| 2008/0296568 A1 | 12/2008 | Ryu et al. |
| 2008/0299702 A1 | 12/2008 | Son et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |

(56) References Cited

U.S. PATENT DOCUMENTS

| | | |
|---|---|---|
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0027083 A1 | 1/2009 | Kimura et al. |
| 2009/0045397 A1 | 2/2009 | Iwasaki |
| 2009/0061721 A1* | 3/2009 | Isa .................. H01L 27/1266 445/24 |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0090914 A1 | 4/2009 | Yano et al. |
| 2009/0114910 A1 | 5/2009 | Chang |
| 2009/0134399 A1 | 5/2009 | Sakakura et al. |
| 2009/0134468 A1 | 5/2009 | Tsuchiya et al. |
| 2009/0140250 A1* | 6/2009 | Yamazaki ......... H01L 21/67207 257/E29.273 |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0206332 A1 | 8/2009 | Son et al. |
| 2009/0239335 A1 | 9/2009 | Akimoto et al. |
| 2009/0256784 A1 | 10/2009 | Ahn |
| 2009/0269880 A1 | 10/2009 | Itagaki et al. |
| 2009/0278122 A1 | 11/2009 | Hosono et al. |
| 2009/0280600 A1 | 11/2009 | Hosono et al. |
| 2009/0310734 A1 | 12/2009 | Umezaki |
| 2010/0001273 A1 | 1/2010 | Kitakado |
| 2010/0006845 A1* | 1/2010 | Seo .................. H01L 33/58 257/E33.003 |
| 2010/0025676 A1 | 2/2010 | Yamazaki et al. |
| 2010/0025677 A1 | 2/2010 | Yamazaki et al. |
| 2010/0025678 A1 | 2/2010 | Yamazaki et al. |
| 2010/0025679 A1 | 2/2010 | Yamazaki et al. |
| 2010/0044701 A1 | 2/2010 | Sano et al. |
| 2010/0051949 A1 | 3/2010 | Yamazaki et al. |
| 2010/0056751 A1 | 3/2010 | Toyohara et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0117999 A1 | 5/2010 | Matsunaga et al. |
| 2010/0267198 A1 | 10/2010 | Yabuta et al. |
| 2010/0276689 A1 | 11/2010 | Iwasaki |
| 2010/0279462 A1 | 11/2010 | Iwasaki |
| 2010/0295042 A1 | 11/2010 | Yano et al. |
| 2011/0003427 A1 | 1/2011 | Sasaki et al. |
| 2011/0012105 A1* | 1/2011 | Yamazaki ............ H01L 27/1233 257/E29.296 |
| 2011/0031496 A1* | 2/2011 | Yamazaki .......... H10K 59/1213 257/E33.053 |
| 2011/0089414 A1 | 4/2011 | Yamazaki et al. |
| 2011/0090183 A1 | 4/2011 | Yamazaki et al. |
| 2011/0090184 A1 | 4/2011 | Yamazaki et al. |
| 2011/0102018 A1 | 5/2011 | Shionoiri et al. |
| 2011/0104851 A1 | 5/2011 | Akimoto et al. |
| 2011/0121290 A1 | 5/2011 | Akimoto et al. |
| 2011/0163779 A1 | 7/2011 | Hidaka |
| 2011/0175090 A1 | 7/2011 | Sugihara et al. |
| 2011/0220889 A1 | 9/2011 | Kurokawa. et al. |
| 2011/0260157 A1 | 10/2011 | Yano et al. |
| 2012/0132908 A1 | 5/2012 | Sugihara et al. |
| 2012/0132911 A1 | 5/2012 | Shimada et al. |
| 2013/0221348 A1 | 8/2013 | Yano et al. |
| 2015/0340513 A1 | 11/2015 | Akimoto et al. |
| 2018/0019292 A1 | 1/2018 | Osame et al. |
| 2021/0320128 A1 | 10/2021 | Umezaki et al. |
| 2024/0153963 A1 | 5/2024 | Umezaki et al. |

FOREIGN PATENT DOCUMENTS

| | | |
|---|---|---|
| CN | 001806322 A | 7/2006 |
| CN | 001993723 A | 7/2007 |
| CN | 101090266 A | 12/2007 |
| CN | 101241972 A | 8/2008 |
| CN | 101258607 A | 9/2008 |
| CN | 101309864 A | 11/2008 |
| EP | 1158529 A | 11/2001 |
| EP | 1607931 A | 12/2005 |
| EP | 1737044 A | 12/2006 |
| EP | 1770788 A | 4/2007 |
| EP | 1906414 A | 4/2008 |
| EP | 1950177 A | 7/2008 |
| EP | 1956667 A | 8/2008 |
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| EP | 2339639 A | 6/2011 |
| EP | 3223283 A | 9/2017 |
| JP | 44-006940 B | 3/1969 |
| JP | 46-010222 B | 3/1971 |
| JP | 49-059543 A | 6/1974 |
| JP | 49-068634 A | 7/1974 |
| JP | 50-091233 A | 7/1975 |
| JP | 50-113164 A | 9/1975 |
| JP | 57-122562 A | 7/1982 |
| JP | 57-171841 A | 10/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-062797 A | 3/1990 |
| JP | 03-231472 A | 10/1991 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2000-340801 A | 12/2000 |
| JP | 2001-175198 A | 6/2001 |
| JP | 2002-076356 A | 3/2002 |
| JP | 2002-123219 A | 4/2002 |
| JP | 2002-289859 A | 10/2002 |
| JP | 2002-368226 A | 12/2002 |
| JP | 2003-086000 A | 3/2003 |
| JP | 2003-086808 A | 3/2003 |
| JP | 2004-022736 A | 1/2004 |
| JP | 2004-103957 A | 4/2004 |
| JP | 2004-147175 A | 5/2004 |
| JP | 2004-273614 A | 9/2004 |
| JP | 2004-273732 A | 9/2004 |
| JP | 2004-303609 A | 10/2004 |
| JP | 2005-039261 A | 2/2005 |
| JP | 2005-167212 A | 6/2005 |
| JP | 2006-005116 A | 1/2006 |
| JP | 2006-106106 A | 4/2006 |
| JP | 2006-126855 A | 5/2006 |
| JP | 2006-165527 A | 6/2006 |
| JP | 2006-165528 A | 6/2006 |
| JP | 2006-165529 A | 6/2006 |
| JP | 2006-165531 A | 6/2006 |
| JP | 2006-165532 A | 6/2006 |
| JP | 2006-317926 A | 11/2006 |
| JP | 2007-042730 A | 2/2007 |
| JP | 2007-096055 A | 4/2007 |
| JP | 2007-103918 A | 4/2007 |
| JP | 2007-123861 A | 5/2007 |
| JP | 2007-142196 A | 6/2007 |
| JP | 2007-219533 A | 8/2007 |
| JP | 2007-310352 A | 11/2007 |
| JP | 2008-053617 A | 3/2008 |
| JP | 2008-077074 A | 4/2008 |
| JP | 2008-089915 A | 4/2008 |
| JP | 2008-276212 A | 11/2008 |
| JP | 2008-281988 A | 11/2008 |
| JP | 2008-286911 A | 11/2008 |
| JP | 2008-299928 A | 12/2008 |
| JP | 2008-311342 A | 12/2008 |
| JP | 2009-021612 A | 1/2009 |
| JP | 2009-081422 A | 4/2009 |

(56) References Cited

FOREIGN PATENT DOCUMENTS

| | | |
|---|---|---|
| JP | 2009-099887 A | 5/2009 |
| JP | 2009-099944 A | 5/2009 |
| JP | 2009-135140 A | 6/2009 |
| JP | 2009-164393 A | 7/2009 |
| JP | 2009-176865 A | 8/2009 |
| JP | 2009-188213 A | 8/2009 |
| JP | 2009-206508 A | 9/2009 |
| JP | 2009-224354 A | 10/2009 |
| JP | 2010-530634 | 9/2010 |
| JP | 2010-531059 | 9/2010 |
| KR | 2008-0074888 A | 8/2008 |
| KR | 2009-0068366 A | 6/2009 |
| TW | 329558 | 4/1998 |
| TW | 483117 | 4/2002 |
| TW | 200614518 | 5/2006 |
| TW | 200631208 | 9/2006 |
| TW | 200937638 | 9/2009 |
| WO | WO-2004/038757 | 5/2004 |
| WO | WO-2004/114391 | 12/2004 |
| WO | WO-2006/013799 | 2/2006 |
| WO | WO-2006/048092 | 5/2006 |
| WO | WO-2007/029844 | 3/2007 |
| WO | WO-2007/119386 | 10/2007 |
| WO | WO-2008/023630 | 2/2008 |
| WO | WO-2008/029544 | 3/2008 |
| WO | WO-2008/044666 | 4/2008 |
| WO | WO-2008/105347 | 9/2008 |
| WO | WO-2008/117739 | 10/2008 |
| WO | WO-2008/126879 | 10/2008 |
| WO | WO-2008/126884 | 10/2008 |
| WO | WO-2008/136505 | 11/2008 |
| WO | WO-2008/139860 | 11/2008 |
| WO | WO-2008/156311 | 12/2008 |
| WO | WO-2008/156312 | 12/2008 |
| WO | WO-2009/041544 | 4/2009 |
| WO | WO-2009/050916 | 4/2009 |
| WO | WO-2009/075281 | 6/2009 |
| WO | WO-2009/081885 | 7/2009 |
| WO | WO-2009/087943 | 7/2009 |
| WO | WO-2009/093625 | 7/2009 |
| WO | WO-2009/093722 | 7/2009 |
| WO | WO-2009/096608 | 8/2009 |

OTHER PUBLICATIONS

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Li.C et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:AL and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper: World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT",

(56) References Cited

OTHER PUBLICATIONS

SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kimizuka.N et al., "Spinel, YBFE2O4, and YB2FE3O7 Types of Structures for Compounds in the In2O3 and Sc2O3—A2O3—Bo Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
International Search Report (Application No. PCT/JP2010/067195) Dated Nov. 16, 2010.
Written Opinion (Application No. PCT/JP2010/067195) Dated Nov. 16, 2010.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Nakamura.M, "Synthesis of Homologous Compound with New Long-Period Structure", NIRIM Newsletter, Mar. 1, 1995, vol. 150, pp. 1-4.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects In ZnO", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water", Appl. Phys. Lett. (Applied Physics Letters) 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies In ZnO", Appl. Phys. Lett. (Applied Physics Letters) , 2005, vol. 87, pp. 122102-1-122102-3.
Oba.F et al., "Defect energetics in ZnO: a hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clark.S et al., "First Principles Methods Using CASTEP", Zeitschrift fur Kristallographie, 2005, vol. 220, pp. 567-570.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ueno.K et al., "Field-Effect Transistor on SiTiO3 With Sputtered Al2O3 Gate Insulator", Appl. Phys. Lett. (Applied Physics Letters), Sep. 1, 2003, vol. 83, No. 9, pp. 1755-1757.

(56) References Cited

OTHER PUBLICATIONS

Chinese Office Action (Application No. 201080047701.0) Dated Jun. 26, 2014.
Park.S et al., "Suppression of Leakage Current in Solid-Phase Crystallization Silicon Thin-Film Transistors Employing Off-State-Bias Annealing", Jpn. J. Appl. Phys. (Japanese Journal of Applied Physics), 2009, vol. 48, pp. 111202-1-111202-4, The Japan Society of Applied Physics.
European Office Action (Application No. 10823293.5) Dated Jul. 17, 2015.
Korean Office Action (Application No. 2012-7012536) Dated Oct. 25, 2016.
Taiwanese Office Action (Application No. 104137890) Dated Dec. 22, 2016.
Chinese Office Action (Application No. 201510217808.X) Dated Jul. 3, 2017.
Malaysian Office Action (Application No. 2016-001431) Dated Oct. 23, 2020.
Chinese Office Action (Application No. 201811233695.2) Dated Nov. 4, 2020.
Chinese Office Action (Application No. 201811233695.2) Dated Jun. 10, 2021.

* cited by examiner 394  393  391          397

399

395a          395b

396

398                392

390

LOGIC CIRCUIT AND SEMICONDUCTOR DEVICE

TECHNICAL FIELD

One aspect of the present invention relates to a logic circuit including a field-effect transistor formed using an oxide semiconductor. Further, one aspect of the present invention relates to a semiconductor device including the logic circuit.

Note that a semiconductor device in this specification indicates all the devices that can operate by using semiconductor characteristics, and electro-optical devices, semiconductor circuits, and electronic appliances are all included in the category of the semiconductor devices.

BACKGROUND ART

Much attention has been paid to a technology of forming a thin film transistor (TFT), by using a thin semiconductor film that is formed over a substrate having an insulating surface. A thin film transistor is used for a display device typified by a liquid crystal television. A silicon-based semiconductor material is known as a material for a thin semiconductor film applicable to a thin film transistor. Other than a silicon-based semiconductor material, an oxide semiconductor has attracted attention.

As a material for the oxide semiconductor, zinc oxide and a material containing zinc oxide as its component are known. Further, a thin film transistor formed using an amorphous oxide (oxide semiconductor) having an electron carrier density of less than $10^{18}/cm^3$ is disclosed (Patent Documents 1 to 3).

REFERENCES

Patent Documents

[Patent Document 1] Japanese Published Patent Application No. 2006-165527
[Patent Document 2] Japanese Published Patent Application No. 2006-165528
[Patent Document 3] Japanese Published Patent Application No. 2006-165529

DISCLOSURE OF INVENTION

However, a difference from the stoichiometric composition in the oxide semiconductor arises in a thin film formation process. For example, electrical conductivity of the oxide semiconductor changes due to the excess or deficiency of oxygen. Further, hydrogen that enters the thin oxide semiconductor film during the formation of the thin film forms an oxygen (O)-hydrogen (H) bond and serves as an electron donor, which is a factor of changing electrical conductivity. Furthermore, since the O—H bond is a polar molecule, it serves as a factor of varying characteristics of an active device such as a thin film transistor manufactured using an oxide semiconductor.

Even when having an electron carrier density of less than $10^{18}/cm^3$, an oxide semiconductor is a substantially n-type oxide semiconductor. Therefore, an on-off ratio of about $10^3$ of the thin film transistor disclosed in the Patent Document has been obtained. Such a low on-off ratio of the thin film transistor is due to large off-state current.

The on-off ratio is a measure of characteristics of a switch. Operation of a circuit including a thin film transistor with a low on-off ratio becomes unstable. Further, current flows excessively due to large off-state current; thus, power consumption is increased.

In view of the foregoing problems, an object of an embodiment of the present invention is to suppress a malfunction of a logic circuit including a thin film transistor formed using an oxide semiconductor.

Further, an object of an embodiment of the present invention is to reduce power consumption of a logic circuit including a thin film transistor formed using an oxide semiconductor.

According to an embodiment of the present invention, a logic circuit includes a thin film transistor having a channel formation region formed using an oxide semiconductor which is made intrinsic or substantially intrinsic by removing impurities (e.g., hydrogen and water) having possibilities of being electron donors (or donors), and has an energy gap larger than that of a silicon semiconductor.

Specifically, a logic circuit includes a thin film transistor having a channel formation region formed using an oxide semiconductor in which the concentration of hydrogen is set to $5\times10^{19}/cm^3$ or less, preferably $5\times10^{18}/cm^3$ or less, still preferably $5\times10^{17}/cm^3$ or less to remove hydrogen or an O—H bond included in the oxide semiconductor, and the carrier density is set to $5\times10^{14}/cm^3$ or less, preferably $5\times10^{12}/cm^3$ or less.

The energy gap of the oxide semiconductor is set to 2 eV or more, preferably 2.5 eV or more, still preferably 3 eV or more to reduce as much impurities (e.g., hydrogen), which form donors, as possible. Further, the carrier density of the oxide semiconductor is set to $1\times10^{14}/cm^3$ or less, preferably $1\times10^{12}/cm^3$ or less.

The thus purified oxide semiconductor is used for a channel formation region of a thin film transistor. Accordingly, even in the case where the channel width is 10 mm, the drain current of $1\times10^{-13}$ [A] or less is obtained at drain voltages of 1 V and 10 V and gate voltages in the range of −5 V to −20 V.

That is, an embodiment of the present invention is a logic circuit including a thin film transistor and a capacitor having terminals one of which is electrically connected to a node which is brought into a floating state by turning off the thin film transistor. A channel formation region of the thin film transistor is formed using an oxide semiconductor with a hydrogen concentration of $5\times10^{19}$ (atoms/$cm^3$).

Note that in this specification, the concentration is measured by secondary ion mass spectrometry (hereinafter referred to as SIMS). However, there is no limitation particularly when descriptions of other measurement methods are made.

Further, a semiconductor device including the logic circuit is also an embodiment of the present invention.

In accordance with an embodiment of the present invention, a logic circuit includes a thin film transistor having a channel formation region formed using an oxide semiconductor; and a capacitor having terminals one of which is brought into a floating state by turning off the thin film transistor. The oxide semiconductor is an oxide semiconductor with reduced hydrogen concentration. Specifically, the hydrogen concentration of the oxide semiconductor is $5\times10^{19}$ (atoms/$cm^3$) or less, and when there is no electric field, the oxide semiconductor serves as an insulator or a semiconductor which is close to an insulator (the semiconductor which is close to an insulator is substantially an insulator). Therefore, off-state current of the thin film transistor can be reduced. Thus, the leakage of electric charge stored in the capacitor, through the thin film transistor, can be suppressed. Thus, a malfunction of the logic circuit can be prevented. Further, a period where the one terminal of the capacitor is in a floating state can be made long. In other words, the number of times of data rewriting to the capacitor (also referred to as refreshing) can be reduced.

Furthermore, the excessive amount of current which flows in the logic circuit can be reduced through the reduction of off-state current of the thin film transistor. Thus, power consumption of the logic circuit can be reduced.

BEST MODE FOR CARRYING OUT THE INVENTION

Hereinafter, embodiments of the present invention will be described in detail with reference to drawings. Note that the present invention is not limited to the description below, and it is easily understood by those skilled in the art that a variety of changes and modifications can be made without departing from the spirit and scope of the present invention. Therefore, the present invention should not be limited to the descriptions of the embodiments below.

Note that since a source terminal and a drain terminal of a transistor change depending on the structure, the operating condition, and the like of the transistor, it is difficult to define which is a source terminal or a drain terminal. Therefore, in this specification, one of a source terminal and a drain terminal is referred to as a first terminal and the other thereof is referred to as a second terminal for distinction, hereinafter.

Note that the size, the thickness of a layer, or a region of each structure illustrated in drawings or the like in embodiments is exaggerated for simplicity in some cases. Therefore, embodiments of the present invention are not limited to such scales. Further, in this specification, ordinal numbers such as "first", "second", and "third" are used in order to avoid confusion among components, and the terms do not limit the components numerically.

Embodiment 1

In this embodiment, examples of logic circuits are described. Specifically, examples of inverters each including a thin film transistor having a channel formation region which is formed using an oxide semiconductor are described with reference to FIGS. 1A to 1D and FIGS. 2A to 2D.

Figure 1A:
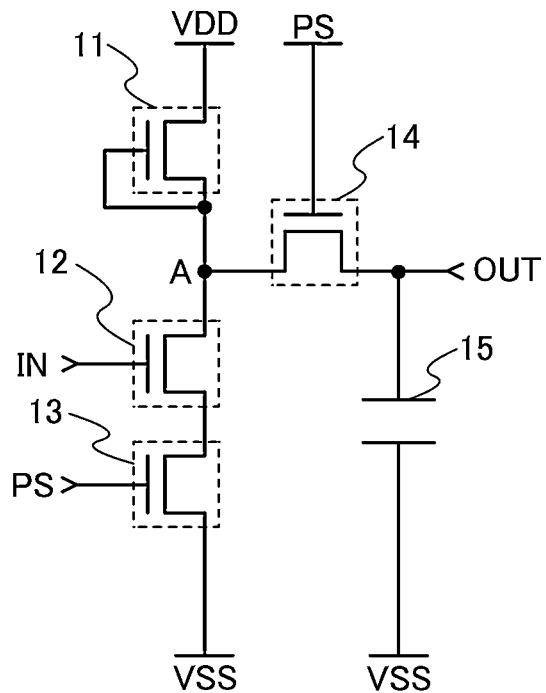
FIGS. 1A and 1C are circuit diagrams illustrating examples of inverters.

FIG. 1A is a circuit diagram illustrating an example of an inverter of this embodiment. The inverter illustrated in FIG. 1A includes thin film transistors 11 to 14 and a capacitor 15. Here, the thin film transistor 11 is a depletion type transistor and the thin film transistors 12 to 14 are enhancement type transistors. Note that in this specification, an n-channel transistor whose threshold voltage is positive is referred to as an enhancement type transistor, and an n-channel transistor whose threshold voltage is negative is referred to as a depletion type transistor.

A first terminal of the thin film transistor 11 is electrically connected to a wiring for supplying a high power supply potential ($V_{DD}$) (hereinafter, such a wiring is also referred to as a high power supply potential line).

A gate terminal of the thin film transistor 12 is electrically connected to a wiring for supplying an input signal (IN) (hereinafter, such a wiring is also referred to as an input signal line), and a first terminal of the thin film transistor 12 is electrically connected to a gate terminal and a second terminal of the thin film transistor 11.

A gate terminal of the thin film transistor 13 is electrically connected to a wiring for supplying a pulse signal (PS) (hereinafter, such a wiring is also referred to as a pulse signal line), a first terminal of the thin film transistor 13 is electrically connected to a second terminal of the thin film transistor 12, and a second terminal of the thin film transistor 13 is electrically connected to a wiring for supplying a low power supply potential ($V_{SS}$) (hereinafter, such a wiring is also referred to as a low power supply potential line).

A gate terminal of the thin film transistor 14 is electrically connected to a pulse signal line, a first terminal of the thin film transistor 14 is electrically connected to the gate terminal and the second terminal of the thin film transistor 11 and the first terminal of the thin film transistor 12, and a second terminal of the thin film transistor 14 is electrically connected to a wiring for outputting an output signal (hereinafter, such a wiring is also referred to as an output signal line).

One terminal of the capacitor 15 is electrically connected to the second terminal of the thin film transistor 14 and the output signal line, and the other terminal of the capacitor 15 is electrically connected to a low power supply potential line.

Note that the thin film transistor 11 is a depletion type transistor in which the first terminal is electrically connected to the high power supply potential line and the gate terminal is electrically connected to the second terminal. That is, the thin film transistor 11 is maintained in an on state in any period. In other words, the thin film transistor 11 is used as a resistor.

Further, in this specification, the high power supply potential ($V_{DD}$) and the low power supply potential ($V_{SS}$) may be any potentials as long as the high power supply potential ($V_{DD}$) is higher than the low power supply potential ($V_{SS}$). For example, a ground potential, 0 V, or the like can be used as the low power supply potential ($V_{SS}$), and a given positive potential or the like can be used as the high power supply potential ($V_{DD}$).

Figure 1B:
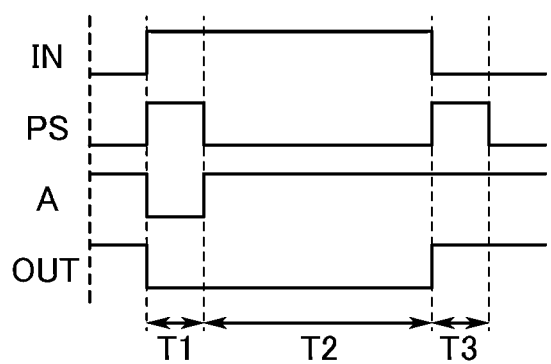
FIGS. 1B and 1D are timing charts illustrating the examples of the inverters.

Next, an operation of the circuit illustrated in FIG. 1A is described with reference to a timing chart in FIG. 1B. Note that FIG. 1B is illustrated while a node where the gate terminal and the second terminal of the thin film transistor 11, the first terminal of the thin film transistor 12, and the first terminal of the thin film transistor 14 are electrically connected to each other is regarded as a node A.

In a period T1, the potentials of the input signal (IN) and the pulse signal (PS) are increased to a high level. Therefore, the thin film transistors 12 to 14 are turned on. Thus, the node A and the one terminal of the capacitor are electrically connected to the low power supply potential line; i.e., the potential of the node A and an output signal (OUT) of the inverter are decreased to a low level. Electric charge is not stored in the capacitor 15.

In a period T2, the potential of the pulse signal (PS) is decreased to a low level. Therefore, the thin film transistors 13 and 14 are turned off. When the thin film transistor 13 is turned off, the potential of the node A is increased to a high level. When the thin film transistor 14 is turned off, the one terminal of the capacitor 15 is brought into a floating state. Therefore, the output signal (OUT) of the inverter is maintained at a low level.

In a period T3, the potential of the input signal (IN) is decreased to a low level, and the potential of the pulse signal (PS) is increased to a high level. Therefore, the thin film transistor 12 is turned off, and the thin film transistors 13 and 14 are turned on. Thus, the node A and the one terminal of the capacitor 15 are electrically connected to the high power supply potential line through the thin film transistor 11; i.e., the potential of the node A and the output signal (OUT) of the inverter are increased to a high level. Positive electric charge is stored in the one terminal of the capacitor 15.

In each of the plurality of thin film transistors included in the inverter of this embodiment, a channel formation region is formed using an oxide semiconductor. The oxide semiconductor is an oxide semiconductor with reduced hydrogen concentration. Specifically, the hydrogen concentration of the oxide semiconductor is $5 \times 10^{19}$ (atoms/cm$^3$) or less, and when there is no electric field, the oxide semiconductor serves as an insulator or a semiconductor which is close to an insulator (the semiconductor which is close to an insulator is substantially an insulator). Therefore, off-state current of the thin film transistor having the channel formation region formed using the oxide semiconductor can be reduced. Thus, the leakage of electric charge through the thin film transistor can be suppressed.

For example, with a channel formation region of the thin film transistor 14, which is formed using the oxide semiconductor, the level of change in potential in a period where the one terminal of the capacitor 15 is in a floating state (i.e., the period T2), such as increase in potential in the period T2, can be suppressed. Thus, a malfunction of the inverter can be prevented. Further, the period where the one terminal of the capacitor 15 is in a floating state can be made long. In other words, the number of times of data rewriting to the capacitor 15 (also referred to as refreshing) can be reduced.

Further, a channel formation region of the thin film transistor 13 which is formed using the oxide semiconductor can reduce a through current which flows from the high power supply potential line to the low power supply potential line in a period where the potential of the input signal (IN) is at a high level and the potential of the pulse signal (PS) is at a low level (i.e., the period T2). Thus, power consumption of the inverter can be reduced.

Note that the inverter of this embodiment is not limited to the inverter illustrated in FIG. 1A. An example of the inverter which is different from the inverter illustrated in FIG. 1A is described below with reference to FIG. 1C.

Figure 1C:
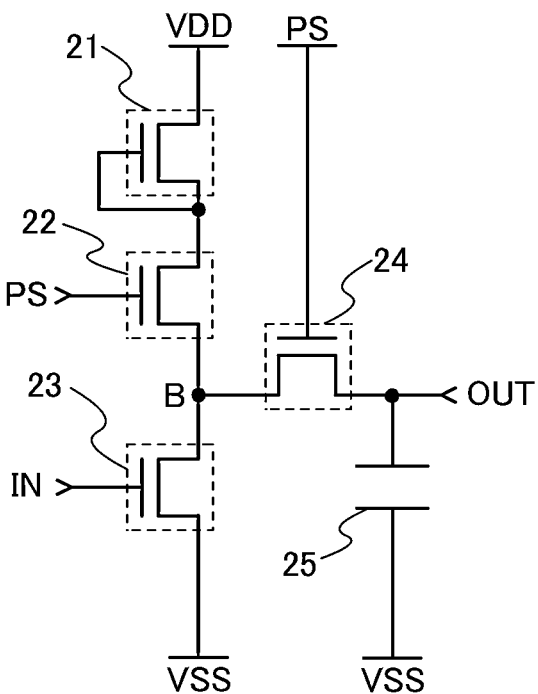

The inverter illustrated in FIG. 1C includes thin film transistors 21 to 24 and a capacitor 25. Here, the thin film transistor 21 is a depletion type transistor and the thin film transistors 22 to 24 are enhancement type transistors.

A first terminal of the thin film transistor 21 is electrically connected to a high power supply potential line.

A gate terminal of the thin film transistor 22 is electrically connected to a pulse signal line, and a first terminal of the thin film transistor 22 is electrically connected to a gate terminal and a second terminal of the thin film transistor 21.

A gate terminal of the thin film transistor 23 is electrically connected to an input signal line, a first terminal of the thin film transistor 23 is electrically connected to a second terminal of the thin film transistor 22, and a second terminal of the thin film transistor 23 is electrically connected to a low power supply potential line.

A gate terminal of the thin film transistor 24 is electrically connected to a pulse signal line, a first terminal of the thin film transistor 24 is electrically connected to the second terminal of the thin film transistor 22 and the first terminal of the thin film transistor 23, and a second terminal of the thin film transistor 24 is electrically connected to an output signal line.

One terminal of the capacitor 25 is electrically connected to the second terminal of the thin film transistor 24 and the output signal line, and the other terminal of the capacitor 25 is electrically connected to a low power supply potential line.

To put it simply, the inverter illustrated in FIG. 1C is a circuit in which the thin film transistor 13 in FIG. 1A is replaced with the thin film transistor 22.

Figure 1D:
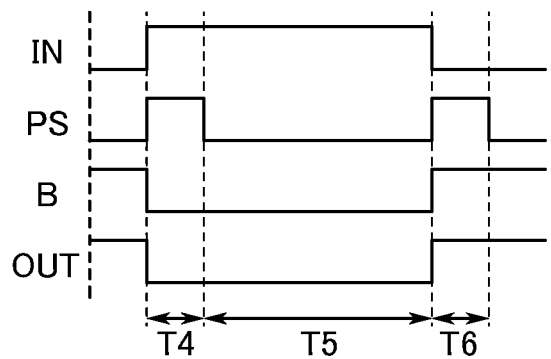

Next, an operation of the circuit illustrated in FIG. 1C is described with reference to a timing chart in FIG. 1D. Note that FIG. 1D is illustrated while a node where the second terminal of the thin film transistor 22, the first terminal of the thin film transistor 23, and the first terminal of the thin film transistor 24 are electrically connected to each other is regarded as a node B.

In a period T4, the potentials of the input signal (IN) and the pulse signal (PS) are increased to a high level. Therefore, the thin film transistors 22 to 24 are turned on. Thus, the node B and the one terminal of the capacitor 25 are electrically connected to the low power supply potential line; i.e., the potential of the node B and the output signal (OUT) of the inverter are decreased to a low level. Electric charge is not stored in the capacitor 25.

In a period T5, the potential of the pulse signal (PS) is decreased to a low level. Therefore, the thin film transistors 22 and 24 are turned off. When the thin film transistor 24 is turned off, the one terminal of the capacitor 25 is brought into a floating state. Thus, the output signal (OUT) of the inverter is maintained at a low level. Note that the potential of the node B is at a low level.

In a period T6, the potential of the input signal (IN) is decreased to a low level, and the potential of the pulse signal (PS) is increased to a high level. Therefore, the thin film transistor 23 is turned off, and the thin film transistors 22 and 24 are turned on. Thus, the node B and the one terminal of the capacitor 25 are electrically connected to the high power supply potential line through the thin film transistor 21; i.e., the potential of the node B and the output signal (OUT) of the inverter are increased to a high level. Positive electric charge is accumulated in the one terminal of the capacitor 25.

In each of the plurality of thin film transistors included in the inverter illustrated in FIG. 1C, a channel formation region is formed using an oxide semiconductor. The oxide semiconductor is an oxide semiconductor with reduced hydrogen concentration. Specifically, the hydrogen concentration of the oxide semiconductor is $5 \times 10^{19}$ (atoms/cm$^3$) or less, and when there is no electric field, the oxide semiconductor serves as an insulator or a semiconductor which is close to an insulator (the semiconductor which is close to an insulator is substantially an insulator). Therefore, off-state current of the thin film transistor having the channel formation region formed using the oxide semiconductor can be reduced. Thus, the leakage of electric charge through the thin film transistor can be suppressed.

For example, with a channel formation region of the thin film transistor 24, which is formed using the oxide semiconductor, the level of change in potential in a period where the one terminal of the capacitor 25 is in a floating state can be suppressed. Thus, a malfunction of the inverter can be prevented. Further, the period where the node B is in a floating state can be made long. In other words, the number of times of data rewriting to the capacitor 25 (also referred to as refreshing) can be reduced.

Further, a channel formation region of the thin film transistor 22 which is formed using the oxide semiconductor can reduce a through current which flows from the high power supply potential line to the low power supply potential line in a period where the potential of the input signal (IN) is at a high level and the potential of the pulse signal (PS) is at a low level (i.e., the period T5). Thus, power consumption of the inverter can be reduced.

Figure 2A:
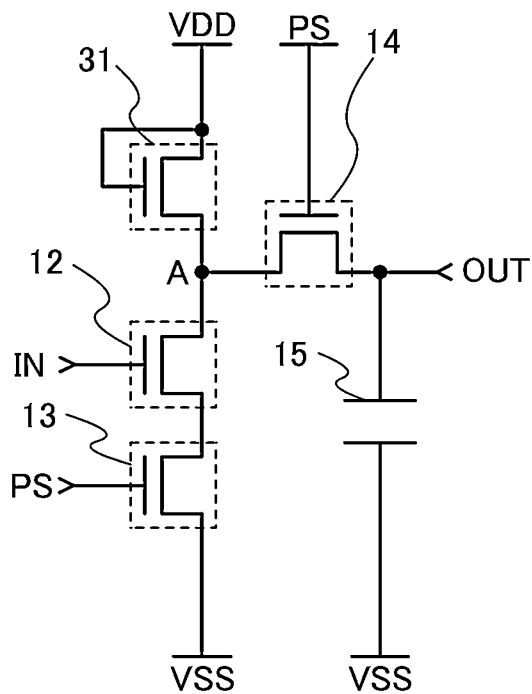
FIGS. 2A to 2D are circuit diagrams illustrating examples of inverters.
Figure 2B:
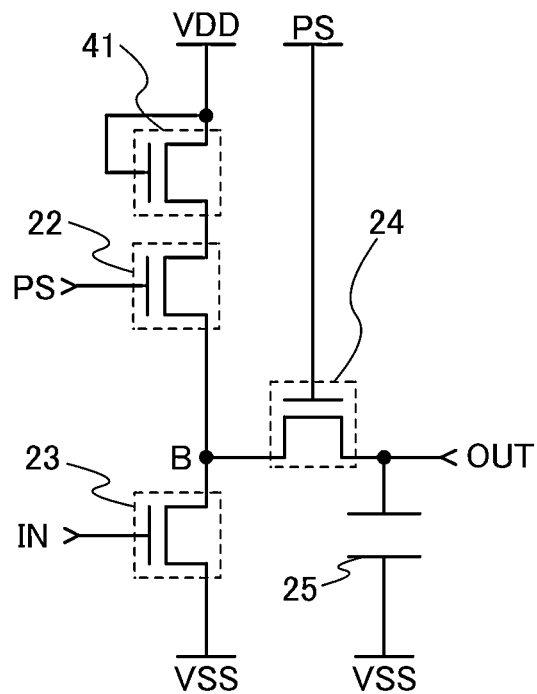

Although a depletion type transistor is used for a thin film transistor which is electrically connected to the high power supply potential line in the inverter, an enhancement type transistor can be used for the thin film transistor. FIG. 2A is a circuit diagram in which the thin film transistor 11 included in the inverter illustrated in FIG. 1A is replaced with a thin film transistor 31 which is an enhancement type transistor. Similarly, FIG. 2B is a circuit diagram in which the thin film transistor 21 included in the inverter illustrated in FIG. 1C is replaced with a thin film transistor 41 which is an enhancement type transistor. Note that a gate terminal and a first terminal of each of the thin film transistors 31 and 41 are electrically connected to a high power supply potential line.

Figure 2C:
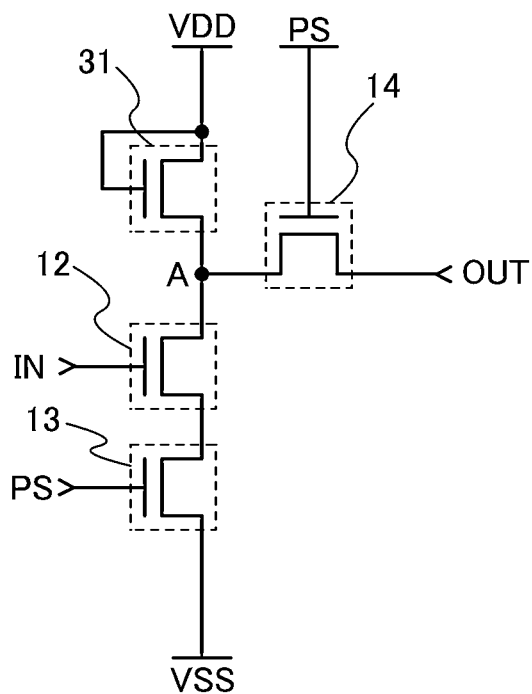
Figure 2D:
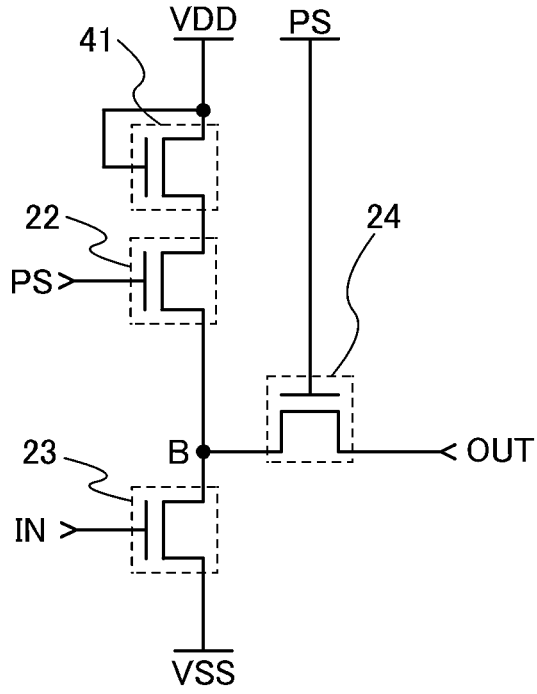

Although a capacitor is included in each of the inverters, each of the inverters can be operated without the capacitor. FIG. 2C illustrates a circuit diagram in which the capacitor 15 is removed from the inverter illustrated in FIG. 2A. Similarly, FIG. 2D illustrates a circuit diagram in which the capacitor 25 is removed from the inverter illustrated in FIG. 2B.

This embodiment can be implemented in appropriate combination with any of the other embodiments.

Embodiment 2

In this embodiment, examples of logic circuits are described. Specifically, examples of shift registers each including the inverter in Embodiment 1 are described with reference to FIGS. 3A and 3B and FIGS. 4A and 4B.

A shift register of this embodiment includes a plurality of pulse output circuits; a wiring for supplying a first clock signal (CK1), which is electrically connected to odd-numbered pulse output circuits of the plurality of pulse output circuits (hereinafter, such a wiring is also referred to as a first clock signal line); and a wiring for supplying a second clock signal (CK2), which is electrically connected to even-numbered pulse output circuits of the plurality of pulse output circuits (hereinafter, such a wiring is also referred to as a second clock signal line). Further, an input terminal of each pulse output circuit is electrically connected to a wiring for supplying a start pulse signal (SP) (hereinafter, such a wiring is also referred to as a start pulse line) or an output terminal of a pulse output circuit of a prior stage.

Figure 3A:
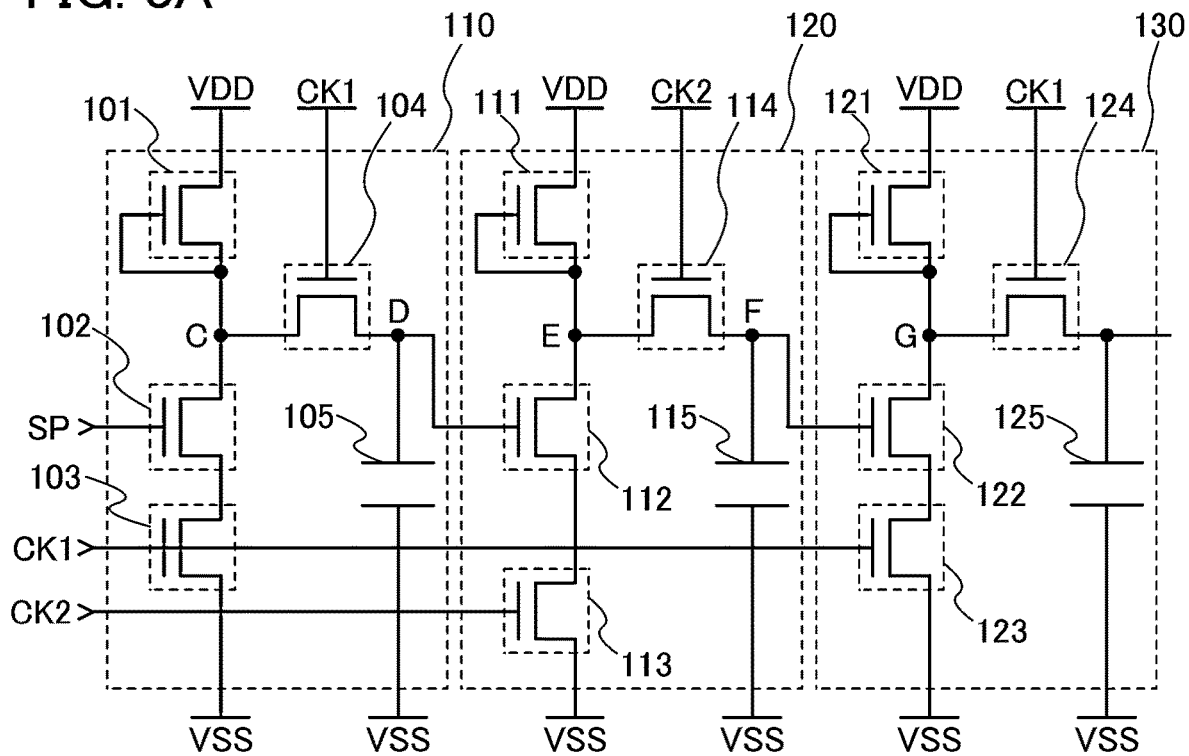
FIG. 3A is a circuit diagram illustrating an example of a shift register.

A specific example of a circuit configuration of a pulse output circuit is described with reference to FIG. 3A. Note that pulse output circuits 110, 120, and 130 are illustrated in FIG. 3A.

The pulse output circuit 110 includes thin film transistors 101 to 104 and a capacitor 105. Here, the thin film transistor 101 is a depletion type transistor, and the thin film transistors 102 to 104 are enhancement type transistors.

A first terminal of the thin film transistor 101 is electrically connected to a high power supply potential line.

A gate terminal of the thin film transistor 102 is electrically connected to a start pulse line, and a first terminal of the thin film transistor 102 is electrically connected to a gate terminal and a second terminal of the thin film transistor 101.

A gate terminal of the thin film transistor 103 is electrically connected to a first clock signal line, a first terminal of the thin film transistor 103 is electrically connected to a second terminal of the thin film transistor 102, and a second terminal of the thin film transistor 103 is electrically connected to a low power supply potential line.

A gate terminal of the thin film transistor 104 is electrically connected to a first clock signal line, and a first terminal of the thin film transistor 104 is electrically connected to the gate terminal and the second terminal of the thin film transistor 101 and the first terminal of the thin film transistor 102.

One terminal of the capacitor 105 is electrically connected to a second terminal of the thin film transistor 104, and the other terminal of the capacitor 105 is electrically connected to a low power supply potential line.

That is, the pulse output circuit 110 illustrated in FIG. 3A is formed using the inverter illustrated in FIG. 1A.

Note that "input terminal of the pulse output circuit 110" refers to a terminal to which a start pulse signal (SP) or an output signal of a pulse output circuit of a prior stage is input, and "output terminal of the pulse output circuit 110" refers to a terminal from which a signal is output to a pulse input terminal of a subsequent stage. That is, here, the gate terminal of the thin film transistor 102 is electrically connected to the input terminal of the pulse output circuit, and the second terminal of the thin film transistor 104 and the one terminal of the capacitor 105 are electrically connected to the output terminal. In the case where components corresponding to the output terminal and the input terminal are not given, the gate terminal of the thin film transistor 102 can be referred to as the input terminal of the pulse output circuit, and the second terminal of the thin film transistor 104 and the one terminal of the capacitor 105 can be referred to as the output terminals of the pulse output circuit.

A specific circuit configuration of the pulse output circuit 120 is similar to that of the pulse output circuit 110; thus, the description is to be referred to here. Note that the pulse output circuit 120 is different from the pulse output circuit 110 in that an input terminal of the pulse output circuit 120 is electrically connected to the output terminal of the pulse output circuit 110 and that the second clock signal (CK2) is input to a terminal corresponding to the terminal to which the first clock signal (CK1) is input in the pulse output circuit 110.

The circuit configurations of pulse output circuits which are subsequent to the pulse output circuit 120 are the same as those of the pulse output circuits 110 and 120. Therefore, the description is to be referred to here. Further, as described above, the odd-numbered pulse output circuits are electrically connected to the first clock signal line and the even-numbered pulse output circuits are electrically connected to the second clock signal line.

Figure 3B:
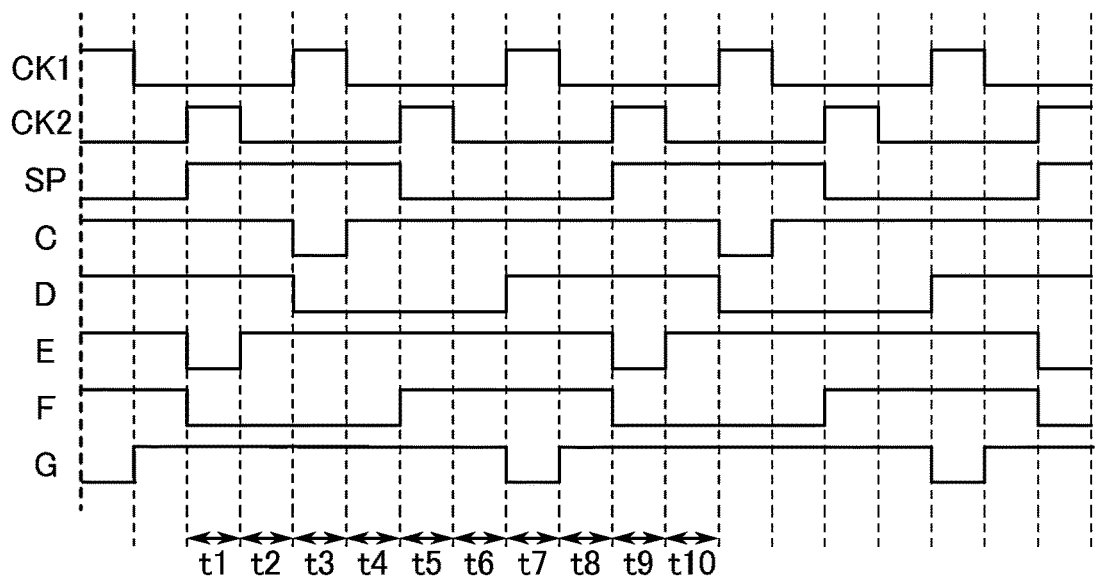
FIG. 3B is a timing chart illustrating the example of the shift register.

Next, an operation of the circuit illustrated in FIG. 3A is described with reference to a timing chart of FIG. 3B. Note that specific nodes of the circuit in FIG. 3A are denoted by C to G for convenience, and the change in potential of each node is referred to in order to describe the timing chart of FIG. 3B.

In a period t1, the potential of the start pulse signal (SP) is increased to a high level. Therefore, the thin film transistor 102 is turned on. The thin film transistor 101 is a depletion type transistor in which the gate terminal is electrically connected to the second terminal. That is, the thin film transistor 101 is maintained in an on state in any period. In other words, the thin film transistor 101 is used as a resistor.

In a period t2, the potential of the start pulse signal (SP) is maintained at a high level. Therefore, the thin film transistor 102 is maintained in an on state.

In a period t3, the potential of the first clock signal (CK1) is increased to a high level. Therefore, the thin film transistors 103 and 104 are turned on. Further, the potential of the start pulse signal (SP) is maintained at a high level. Therefore, the thin film transistor 102 is maintained in an on state. Thus, the nodes C and D are electrically connected to the low power supply potential line; i.e., the potentials of the nodes C and D are decreased to a low level.

In a period t4, the potential of the first clock signal (CK1) is decreased to a low level. Therefore, the thin film transistors 103 and 104 are turned off. Thus, the node C is electrically connected to the high power supply potential line through the thin film transistor 101, and the node D is brought into a floating state. That is, the potential of the node C is increased to a high level, and the potential of the node D is maintained at a low level.

In a period t5, the potential of the start pulse signal (SP) is decreased to a low level. Therefore, the thin film transistor 102 is turned off. Further, the potential of the second clock signal (CK2) is increased to a high level. Therefore, the thin film transistors 113 and 114 are turned on. Thus, the node F is electrically connected to the high power supply potential line through the thin film transistor 111; i.e., the potential of the node F is increased to a high level. Therefore, the thin film transistor 122 is turned on.

In a period t6, the potential of the second clock signal (CK2) is decreased to a low level. Therefore, the thin film transistors 113 and 114 are turned off. Thus, the node F is brought into a floating state; i.e., the potentials of the nodes E and F are maintained at a high level.

In a period t7, the potential of the first clock signal (CK1) is increased to a high level. Therefore, the thin film transistors 103, 104, 123, and 124 are turned on. When the thin film transistor 104 is turned on, the node D is electrically connected to the high power supply potential line through the thin film transistor 101; i.e., the potential of the node D is increased to a high level. Therefore, the thin film transistor 112 is turned on. The potential of the node F is maintained at a high level; therefore, the thin film transistor 122 is maintained in an on state. Thus, the node G is electrically connected to the low power supply potential line; i.e., the potential of the node G is decreased to a low level.

In a period t8, the potential of the first clock signal (CK1) is decreased to a low level. Therefore, the thin film transistors 103, 104, 123, and 124 are turned off. When the thin film transistor 104 is turned off, the node C is electrically connected to the high power supply potential line through the thin film transistor 101, and the node D is brought into the floating state. Thus, the nodes C and D are maintained at a high level. When the thin film transistor 123 is turned off, the node G is electrically connected to the high power supply potential line through the thin film transistor 121; i.e., the potential of the node G is increased to a high level.

In a period t9, the potential of the second clock signal (CK2) is increased to a high level. Therefore, the thin film transistors 113 and 114 are turned on. The potential of the node D is maintained at a high level, so that the thin film transistor 112 is maintained in an on state. Thus, the nodes E and F are electrically connected to the low power supply potential line: i.e., the potentials of the nodes E and F are decreased to a low level. Therefore, the thin film transistor 122 is turned off. Further, the potential of the start pulse (SP) is increased to a high level again. Note that the operation accompanying the increase in potential of the start pulse (SP) in periods subsequent to the period is the same as the operation in periods subsequent to the period t1. Therefore, the description is to be referred to here.

In a period t10, the potential of the second clock signal (CK2) is decreased to a low level. Therefore, the thin film transistors 113 and 114 are turned off. Thus, the node F is brought into a floating state; i.e., the potential of the node F is maintained at a low level. Further, the node E is electrically connected to the high power supply potential line through the thin film transistor 111; i.e., the potential of the node E is increased to a high level.

Regarding the operation in periods subsequent to the period t10, the aforementioned operation is repeated. Therefore, the description is to be referred to here.

Note that the capacitors (e.g., capacitor 105, 115, and 125) included in the pulse output circuits are provided in order to maintain an output signal of each pulse output circuit.

In each of the plurality of thin film transistors included in the shift register of this embodiment, a channel formation region is formed using an oxide semiconductor. The oxide semiconductor is an oxide semiconductor with reduced hydrogen concentration. Specifically, the hydrogen concentration of the oxide semiconductor is $5 \times 10^{19}$ (atoms/cm$^3$) or less, and when there is no electric field, the oxide semiconductor serves as an insulator or a semiconductor which is close to an insulator (the semiconductor which is close to an insulator is substantially an insulator). Therefore, off-state current of the thin film transistor having the channel formation region formed using the oxide semiconductor can be reduced. Thus, the leakage of electric charge through the thin film transistor can be suppressed.

For example, with a channel formation region of the thin film transistor 104, which is formed using the oxide semiconductor, the level of change in potential of the node D in a period where the node D is in a floating state (e.g., the periods t4 to t6), such as increase in potential in the periods t4 to t6, can be suppressed. Thus, a malfunction of the shift register can be prevented. Further, the period where the node D is in a floating state can be made long. In other words, the number of times of data rewriting to the capacitor 105 (also referred to as refreshing) can be reduced.

Further, a channel formation region of the thin film transistor 103 which is formed using the oxide semiconductor can reduce a through current which flows from the high power supply potential line to the low power supply potential line in a period where the potential of the start pulse (SP) is at a high level and the potential of the first clock signal (CK1) is at a low level (e.g., the periods t1, t2, and t4). Thus, power consumption of the shift register can be reduced.

Note that the shift register of this embodiment is not limited to the shift register illustrated in FIG. 3A. An example of the shift register which is different from the shift register illustrated in FIGS. 3A and 3B is described with reference to FIGS. 4A and 4B.

Figure 4A:
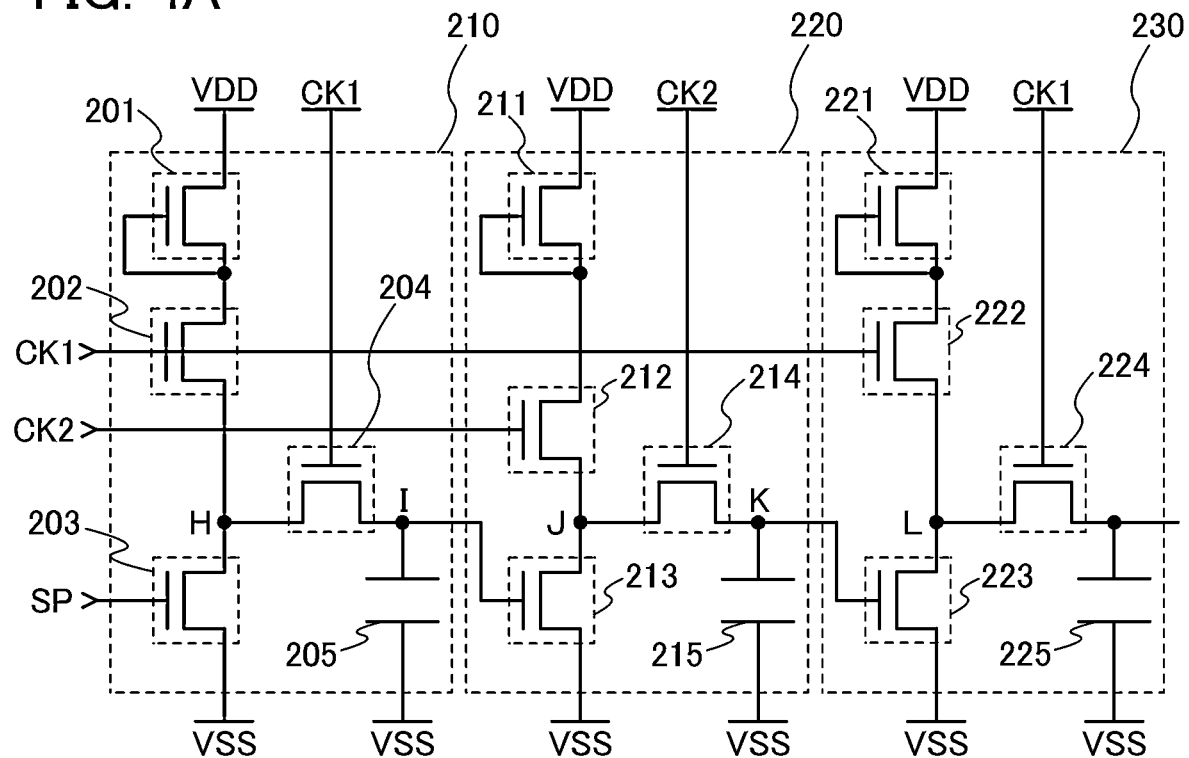
FIG. 4A is a circuit diagram illustrating an example of a shift register.

The shift register illustrated in FIG. 4A includes pulse output circuits 210, 220, and 230. The pulse output circuit 210 includes thin film transistors 201 to 204 and a capacitor 205. Here, the thin film transistor 201 is a depletion type transistor, and the thin film transistors 202 to 204 are enhancement type transistors.

A first terminal of the thin film transistor 201 is electrically connected to a high power supply potential line.

A gate terminal of the thin film transistor 202 is electrically connected to a first clock signal line, and a first terminal of the thin film transistor 202 is electrically connected to a gate terminal and a second terminal of the thin film transistor 201.

A gate terminal of the thin film transistor 203 is electrically connected to a start pulse line, a first terminal of the thin film transistor 203 is electrically connected to a second terminal of the thin film transistor 202, and a second terminal of the thin film transistor 203 is electrically connected to a low power supply potential line.

A gate terminal of the thin film transistor 204 is electrically connected to a first clock signal line, and a first terminal of the thin film transistor 204 is electrically connected to the second terminal of the thin film transistor 202 and the first terminal of the thin film transistor 203.

One terminal of the capacitor 205 is electrically connected to a second terminal of the thin film transistor 204, and the other terminal of the capacitor 205 is electrically connected to a low power supply potential line.

To put it simply, the pulse output circuit 210 illustrated in FIG. 4A is a circuit in which the thin film transistor 103 included in the pulse output circuit 110 in FIG. 3A is replaced with the thin film transistor 202.

Figure 4B:
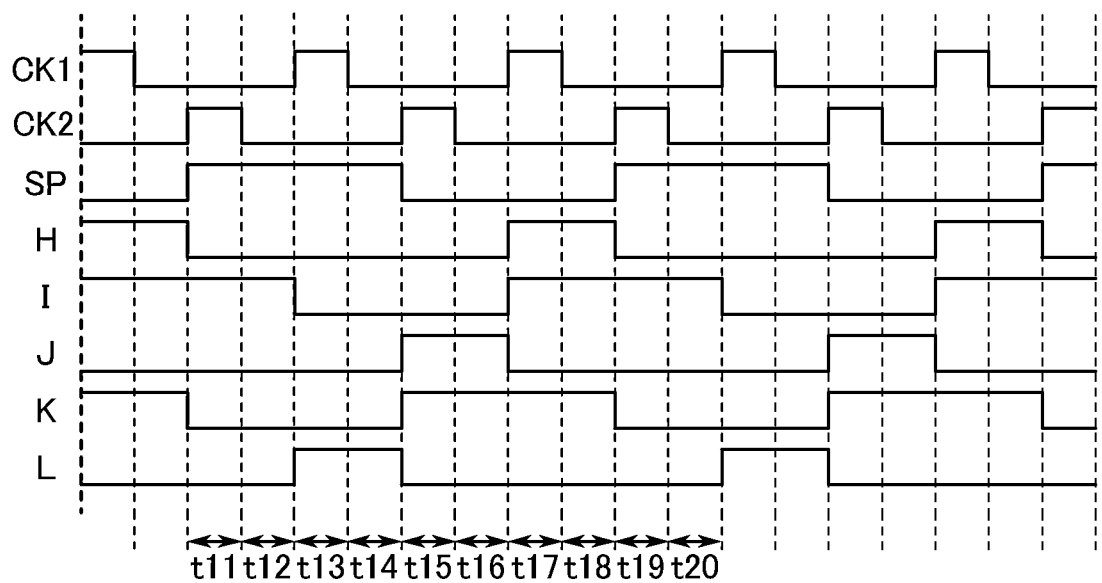
FIG. 4B is a timing chart illustrating the example of the shift register.

FIG. 4B is a timing chart illustrating an operation of the circuit in FIG. 4A. Note that specific nodes of the circuit in FIG. 4A are denoted by H to L for convenience, and the change in potential of each node is referred to in order to describe the timing chart with reference to FIG. 4B.

In a period t11, the potential of the start pulse signal (SP) is increased to a high level. Therefore, the thin film transistor 203 is turned on. Thus, the node H is electrically connected to the low power supply potential line; i.e., the potential of the node H is decreased to a low level.

In a period t12, the potential of the start pulse signal (SP) is maintained at a high level. That is, the potential of the node H is maintained at a low level.

In a period t13, the potential of the first clock signal (CK1) is increased to a high level. Therefore, the thin film transistors 202 and 204 are turned on. Further, the potential of the start pulse signal (SP) is maintained at a high level, so that the thin film transistor 203 is maintained in an on state. Thus, the node I is electrically connected to the low power supply potential line; i.e., the potential of the node I is decreased to a low level.

In a period t14, the potential of the first clock signal (CK1) is decreased to a low level. Therefore, the thin film transistors 202 and 204 are turned off. Thus, the node I is brought into a floating state, so that the potential of the node I is maintained at a low level.

In a period t15, the potential of the start pulse signal (SP) is decreased to a low level. Therefore, the thin film transistor 203 is turned off. Thus, the node H is brought into a floating state, so that the potential of the node H is maintained at a low level. Further, the potential of the second clock signal (CK2) is increased to a high level. Therefore, the thin film transistors 212 and 214 are turned on. Thus, the nodes J and K are electrically connected to the high power supply potential line through the thin film transistor 211; i.e., the potentials of the nodes J and K are increased to a high level. Therefore, the thin film transistor 223 is turned on. Thus, the node L is electrically connected to the low power supply potential line; i.e., the potential of the node L is decreased to a low level.

In a period t16, the potential of the second clock signal (CK2) is decreased to a low level. Therefore, the thin film transistors 212 and 214 are turned off, so that the nodes J and K are brought into a floating state. Thus, the potentials of the nodes J and K are maintained at a high level, and the potential of the node L is maintained at a low level.

In a period t17, the potential of the first clock signal (CK1) is increased to a high level. Therefore, the thin film transistors 202, 204, 222, and 224 are turned on. When the thin film transistors 202 and 204 are turned on, the nodes H and I are electrically connected to the high power supply potential line through the thin film transistor 201; i.e., the potentials of the nodes H and I are increased to a high level. Therefore, the thin film transistor 213 is turned on. Thus, the node J is electrically connected to the low power supply potential line; i.e., the potential of the node J is decreased to a low level.

In a period t18, the potential of the first clock signal (CK1) is decreased to a low level. Therefore, the thin film transistors 202, 204, 222, and 224 are turned off. When the thin film transistors 202 and 204 are turned off, the nodes H and I are brought into a floating state. Thus, the potentials of the nodes H and I are maintained at a high level.

In a period t19, the potential of the second clock signal (CK2) is increased to a high level. Therefore, the thin film transistors 212 and 214 are turned on. Further, the potential of the node I is maintained at a high level, so that the thin film transistor 213 is maintained in an on state. Thus, the nodes J and K are electrically connected to the low power supply potential line; i.e., the potential of the node J is maintained at a low level, and the potential of the node K is decreased to a low level. Therefore, the thin film transistor 223 is turned off. Thus, the node L is electrically connected to the low power supply potential line; i.e., the potential of the node L is maintained at a low level. Further, the potential of the start pulse (SP) is increased to a high level again. Note that the operation accompanying the increase in potential of the start pulse (SP) in periods subsequent to the period is the same as the operation in periods subsequent to the period t11. Therefore, the description is to be referred to here.

In a period t20, the potential of the second clock signal (CK2) is decreased to a low level. Therefore, the thin film transistors 212 and 214 are turned off. Thus, the nodes J and K are brought into a floating state. As a result, the potentials of the nodes J and K are maintained at a low level.

Regarding the operation in periods subsequent to the period t20, the aforementioned operation is repeated. Therefore, the description is to be referred to here.

Note that the capacitors (e.g., capacitors 205, 215, and 225) included in the pulse output circuits are provided in order to maintain an output signal of each pulse output circuit.

In each of the plurality of thin film transistors included in the shift register illustrated in FIG. 4A, a channel formation region is formed using an oxide semiconductor. The oxide semiconductor is an oxide semiconductor with reduced hydrogen concentration. Specifically, the hydrogen concentration of the oxide semiconductor is $5\times10^{19}$ (atoms/cm³) or less, and when there is no electric field, the oxide semiconductor serves as an insulator or a semiconductor which is close to an insulator (the semiconductor which is close to an insulator is substantially an insulator). Therefore, off-state current of the thin film transistor having the channel formation region formed using the oxide semiconductor can be reduced. Thus, the leakage of electric charge through the thin film transistor can be suppressed.

For example, with a channel formation region of the thin film transistor 204, which is formed using the oxide semiconductor, the level of change in potential in a period where the node I is in a floating state (e.g., the periods t11, t12, t14 to t16, and t18 to t20), such as decrease of potential in the periods t11, t12, t19, t20, etc., can be suppressed. Thus, a malfunction of the shift register can be prevented. Further, the period where the node I is in a floating state can be made long. In other words, the number of times of data rewriting to the capacitor 205 (also referred to as refreshing) can be reduced.

Further, a channel formation region of the thin film transistor 202 which is formed using the oxide semiconductor can reduce a through current which flows from the high power supply potential line to the low power supply potential line in a period where the potential of the start pulse (SP) is at a high level and the potential of the first clock signal (CK1) is at a low level (e.g., the periods t11, t12, t14 to t16, and t18 to t20). Thus, power consumption of the shift register can be reduced.

Although a depletion type transistor is used for a thin film transistor which is electrically connected to the high power supply potential line in the above-described shift register, an enhancement type transistor can alternatively be used for the thin film transistor. That is, the inverters illustrated in FIGS. 2A and 2B can be used for the pulse output circuits of this embodiment.

Although a capacitor is included in each of the pulse output circuits of the shift registers, each of the shift registers can be operated without the capacitor. That is, the inverters illustrated in FIGS. 2C and 2D can be used for the pulse output circuits of this embodiment.

This embodiment can be implemented in appropriate combination with any of the other embodiments.

Embodiment 3

In this embodiment, an example of thin film transistors included in the logic circuit in Embodiment 1 or Embodiment 2 is described.

One embodiment of a thin film transistor and a manufacturing method of the thin film transistor of this embodiment is described with reference to FIGS. 5A and 5B and FIGS. 6A to 6E.

Figure 5A:
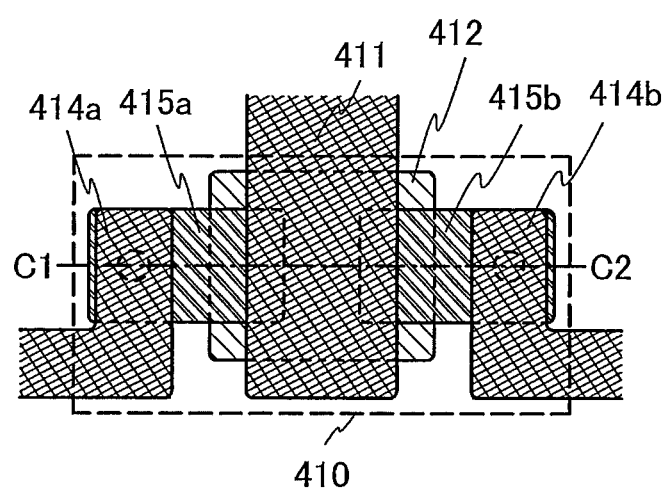
FIG. 5A is a plan view illustrating an example of a thin film transistor.
Figure 5B:
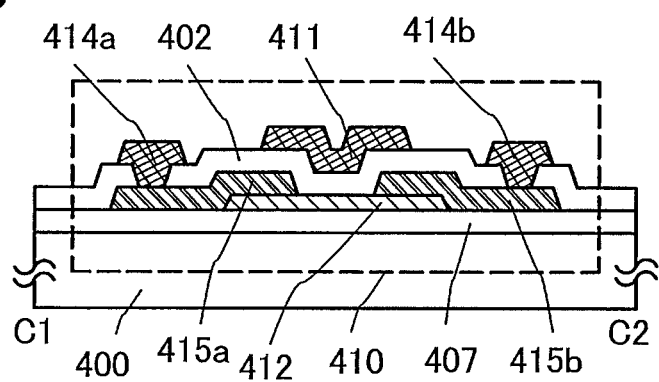
FIG. 5B is a cross-sectional view illustrating the example of the thin film transistor.

FIGS. 5A and 5B illustrate an example of a planar structure and a cross-sectional structure of a thin film transistor. A thin film transistor 410 illustrated in FIGS. 5A and 5B is one of top gate thin film transistors.

FIG. 5A is a plan view of the thin film transistor 410 having a top-gate structure and FIG. 5B is a cross-sectional view taken along a line C1-C2 in FIG. 5A.

The thin film transistor 410 includes, over a substrate 400 having an insulating surface, an insulating layer 407, an oxide semiconductor layer 412, a source or drain electrode layer 415a, a source or drain electrode layer 415b, a gate insulating layer 402, and a gate electrode layer 411. A wiring layer 414a and a wiring layer 414b are provided so as to be in contact with and electrically connected to the source or drain electrode layer 415a and the source or drain electrode layer 415b, respectively.

Although description is given using a single-gate thin film transistor as the thin film transistor 410, a multi-gate thin film transistor including a plurality of channel formation regions may be formed as needed.

A process of manufacturing the thin film transistor 410 over the substrate 400 is described below with reference to FIGS. 6A to 6E.

There is no particular limitation on a substrate that can be used as the substrate 400 having an insulating surface as long as it has at least heat resistance to withstand heat treatment performed later. A glass substrate formed using barium borosilicate glass, aluminoborosilicate glass, or the like can be used.

When the temperature of the heat treatment performed later is high, a substrate having a strain point of 730° C. or higher is preferably used as the glass substrate. As a material of the glass substrate, a glass material such as aluminosilicate glass, aluminoborosilicate glass, or barium borosilicate glass is used, for example. Note that by containing barium oxide (BaO) and boron oxide ($B_2O_3$) so that the amount of BaO is larger than that of $B_2O_3$, a glass substrate is heat-resistant and of more practical use. Therefore, a glass substrate containing BaO than $B_2O_3$ so that the amount of BaO is larger than that of $B_2O_3$ is preferably used.

Note that, instead of the glass substrate described above, a substrate formed using an insulator, such as a ceramic substrate, a quartz substrate, or a sapphire substrate, may be used as the substrate. Alternatively, a crystallized glass or the like may be used. Still alternatively, a plastic substrate or the like can be used as appropriate.

First, the insulating layer 407 which serves as a base film is formed over the substrate 400 having an insulating surface. As the insulating layer 407 in contact with the oxide semiconductor layer, an oxide insulating layer such as a silicon oxide layer, a silicon oxynitride layer, an aluminum oxide layer, or an aluminum oxynitride layer is preferably used. Although a plasma CVD method, a sputtering method, or the like can be employed as a method for forming the insulating layer 407, the insulating layer 407 is preferably formed with a sputtering method so that hydrogen is contained in the insulating layer 407 as little as possible.

In this embodiment, a silicon oxide layer is formed as the insulating layer 407 with a sputtering method. The substrate 400 is transferred to a treatment chamber and a sputtering gas from which hydrogen and moisture is removed and which contains high-purity oxygen is introduced, whereby a silicon oxide layer is formed as the insulating layer 407 over the substrate 400 with the use of a silicon semiconductor target. The substrate 400 may be at a room temperature or may be heated.

For example, a silicon oxide layer is formed with an RF sputtering method under the following condition: quartz (preferably, synthetic quartz) is used as a target; the substrate temperature is 108° C.; the distance between the substrate and the target (the T-S distance) is 60 mm; the pressure is 0.4 Pa; the electric power of the high frequency power source is 1.5 kW; and the atmosphere is an atmosphere containing oxygen and argon (the flow ratio of oxygen to argon is 1:1 (each flow rate is 25 sccm). The thickness of the silicon oxide layer is 100 nm. Note that instead of quartz (preferably, synthetic quartz), a silicon target can be used as a target used when the silicon oxide layer is formed. As a sputtering gas, oxygen or a mixed gas of oxygen and argon is used.

In that case, the insulating layer 407 is preferably formed while removing moisture remaining in the treatment chamber. This is for preventing hydrogen, a hydroxyl group, and moisture from being contained in the insulating layer 407.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the deposition chamber which is evacuated with the cryopump, a hydrogen atom, a compound containing a hydrogen atom, such as water ($H_2O$), and the like are evacuated, whereby the concentration of an impurity in the insulating layer 407 formed in the deposition chamber can be reduced.

It is preferable to use a high-purity gas from which an impurity such as hydrogen, water, a hydroxyl group, or hydride is removed to a concentration expressed by a level of ppm or ppb, as a sputtering gas used when the insulating layer 407 is formed.

Examples of a sputtering method include an RF sputtering method in which a high-frequency power source is used as a sputtering power source, a DC sputtering method in which a DC power source is used, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or plural kinds of materials can be discharged for film formation at the same time in the same chamber.

In addition, there are a sputtering apparatus provided with a magnet system inside the chamber, which is for a magnetron sputtering method, and a sputtering apparatus which is used for an ECR sputtering method in which plasma produced with the use of microwaves is used without using glow discharge.

Furthermore, as a deposition method using a sputtering method, there are also a reactive sputtering method in which a target substance and a sputtering gas component are chemically reacted with each other during deposition to form a thin compound film thereof, and a bias sputtering method in which voltage is also applied to a substrate during deposition.

Further, the insulating layer 407 may have a layered structure in which for example, a nitride insulating layer such as a silicon nitride layer, a silicon nitride oxide layer, an aluminum nitride layer, or an aluminum nitride oxide layer and an oxide insulating layer are stacked in this order from the substrate 400 side.

For example, a sputtering gas from which hydrogen and moisture are removed and which contains high-purity nitrogen is introduced and a silicon target is used, whereby a silicon nitride layer is formed between a silicon oxide layer and a substrate. In this case, the silicon nitride layer is preferably formed while removing moisture remaining in a treatment chamber, similarly to the silicon oxide layer.

In the case of forming the silicon nitride layer, a substrate may be heated in film formation.

In the case where the stack of the silicon nitride layer and the silicon oxide layer is provided as the insulating layer 407, the silicon nitride layer and the silicon oxide layer can be formed with the use of a common silicon target in the same treatment chamber. After a sputtering gas containing nitrogen is introduced first, a silicon nitride layer is formed using a silicon target mounted in the treatment chamber, and then, the sputtering gas is switched to a sputtering gas containing oxygen and the same silicon target is used to form a silicon oxide layer. Since the silicon nitride layer and the silicon oxide layer can be formed successively without being exposed to the air, impurities such as hydrogen and moisture can be prevented from adsorbing onto a surface of the silicon nitride layer.

Then, an oxide semiconductor film is formed to a thickness of 2 nm to 200 nm inclusive over the gate insulating layer 407.

Further, in order that hydrogen, a hydroxyl group, and moisture be contained in the oxide semiconductor layer as little as possible, it is preferable that the substrate 400 over which the insulating layer 407 is formed be preheated in a preheating chamber of a sputtering apparatus as pretreatment for film formation so that impurities such as hydrogen and moisture adsorbed to the substrate 400 are eliminated and evacuated. Note that a cryopump is preferable as an evacuation unit provided in the preheating chamber. Note that this preheating treatment may be omitted. Further, this preheating may be similarly performed on the substrate 400 over which the gate insulating layer 402 has not been formed and the substrate 400 over which layers up to the source or drain electrode layer 415a and the source or drain electrode layer 415b have been formed.

Note that before the oxide semiconductor layer is formed with a sputtering method, dust attached to a surface of the insulating layer 407 is preferably removed with reverse sputtering in which an argon gas is introduced and plasma is generated. The reverse sputtering refers to a method in which without application of a voltage to the target side, a high frequency power source is used for application of a voltage to the substrate side in an argon atmosphere so that plasma is generated to modify a surface of the substrate. Note that instead of an argon atmosphere, a nitrogen atmosphere, a helium atmosphere, an oxygen atmosphere, or the like may be used.

The oxide semiconductor layer is formed with a sputtering method. The oxide semiconductor layer is formed using an In—Ga—Zn—O-based oxide semiconductor layer, an In—Sn—Zn—O-based oxide semiconductor layer, an In—Al—Zn—O-based oxide semiconductor layer, a Sn—Ga—Zn—O-based oxide semiconductor layer, an Al—Ga—Zn—O-based oxide semiconductor layer, a Sn—Al—Zn—O-based oxide semiconductor layer, an In—Zn—O-based oxide semiconductor layer, a Sn—Zn—O-based oxide semiconductor layer, an Al—Zn—O-based oxide semiconductor layer, an In—O-based oxide semiconductor layer, a Sn—O-based oxide semiconductor layer, or a Zn—O-based oxide semiconductor layer. In this embodiment, the oxide semiconductor layer is formed with a sputtering method with the use of an In—Ga—Zn—O-based metal oxide target. Further, the oxide semiconductor layer can be formed with a sputtering method in a rare gas (typically, argon) atmosphere, an oxygen atmosphere, or a mixed atmosphere containing a rare gas (typically, argon) and oxygen. In the case of employing a sputtering method, a target containing $SiO_2$ at 2 wt % to 10 wt % inclusive may be used for film formation.

It is preferable to use a high-purity gas from which an impurity such as hydrogen, water, a hydroxyl group, or hydride is removed to a concentration expressed by a level of ppm or ppb, as a sputtering gas used when the oxide semiconductor layer is formed.

As a target for forming the oxide semiconductor layer with a sputtering method, a metal oxide target containing zinc oxide as its main component can be used. As another example of a metal oxide target, a metal oxide target containing In, Ga, and Zn (in a composition ratio, $In_2O_3$:$Ga_2O_3$:ZnO=1:1:1 [mol], In:Ga:Zn=1:1:0.5 [atom]) can be used. Alternatively, a metal oxide target containing In, Ga, and Zn (the composition ratio of In:Ga:Zn=1:1:1 or 1:1:2 [atom]) may be used. The proportion of the volume of a portion except for an area occupied by a space and the like with respect to the total volume of the metal oxide target formed (also referred to as the fill rate of the metal oxide target) is 90% to 100% inclusive, preferably, 95% to 99.9% inclusive. With the use of the metal oxide target with high fill rate, a dense oxide semiconductor layer is formed.

The substrate is held in a treatment chamber kept under reduced pressure, a sputtering gas from which hydrogen and moisture are removed is introduced into the treatment chamber from which remaining moisture is being removed, and the oxide semiconductor layer is formed over the substrate 400 with the use of a metal oxide as a target. To remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the deposition chamber which is evacuated with the cryopump, a hydrogen atom, a compound containing a hydrogen atom, such as water ($H_2O$), (more preferably, also a compound containing a carbon atom), and the like are evacuated, whereby the concentration of an impurity in the oxide semiconductor layer formed in the deposition chamber can be reduced. The substrate may be heated when the oxide semiconductor layer is formed.

An example of the deposition condition is as follows: the substrate temperature is room temperature, the distance between the substrate and the target is 60 mm, the pressure is 0.4 Pa, the electric power of the DC power source is 0.5 kW, and the atmosphere is an atmosphere containing oxygen and argon (the flow ratio of oxygen to argon is 15 sccm:30 sccm). It is preferable that a pulsed DC power source be used because powder substances (also referred to as particles or dust) generated in film formation can be reduced and the film thickness can be uniform. The oxide semiconductor layer preferably has a thickness of 5 nm to 30 nm inclusive. Note that the appropriate thickness depends on an oxide semiconductor material used and the thickness may be selected in accordance with a material.

Figure 6A:
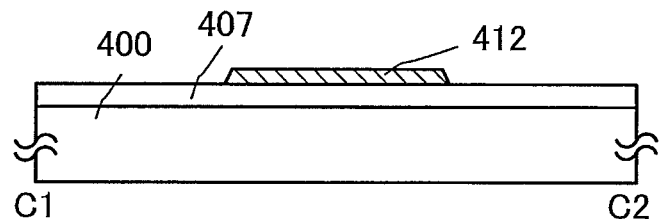
FIGS. 6A to 6E are cross-sectional views illustrating an example of a method for manufacturing a thin film transistor.
Figure 6B:
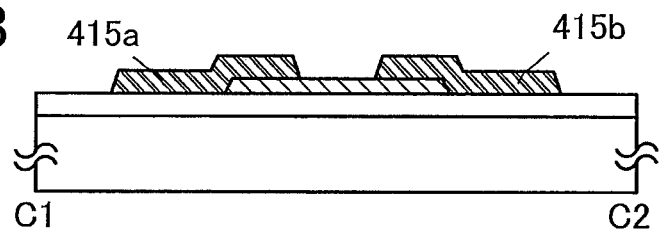

Then, in a first photolithography process, the oxide semiconductor layer is processed into an island-shaped oxide semiconductor layer 412 (see FIG. 6A). A resist mask for forming the island-shaped oxide semiconductor layer 412 may be formed with an inkjet method. When the resist mask is formed with an inkjet method, a photomask is not used; therefore, manufacturing costs can be reduced.

Note that the etching of the oxide semiconductor layer may be dry etching, wet etching, or both dry etching and wet etching.

As the etching gas for dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the film into a desired shape, the etching condition (the amount of electric power applied to a coil-shaped electrode, the amount of electric power applied to an electrode on the substrate side, the temperature of the electrode on the substrate side, or the like) is adjusted as appropriate.

As an etchant used for wet etching, a mixed solution of phosphoric acid, acetic acid, and nitric acid, or the like can be used. Alternatively, ITO07N (produced by KANTO CHEMICAL CO., INC.) may be used.

The etchant used in the wet etching is removed by cleaning together with the material which is etched off. The waste liquid including the etchant and the material etched off may be purified and the material may be reused. When a material such as indium included in the oxide semiconductor layer is collected from the waste liquid after the etching and reused, the resources can be efficiently used and the cost can be reduced.

The etching conditions (such as an etchant, etching time, and temperature) are appropriately adjusted depending on the material so that the oxide semiconductor layer can be etched to have a desired shape.

In this embodiment, the oxide semiconductor layer is processed into the island-shaped oxide semiconductor layer 412 with a wet etching method with a mixed solution of phosphoric acid, acetic acid, and nitric acid as an etchant.

In this embodiment, the oxide semiconductor layer 412 is subjected to first heat treatment. The temperature of the first heat treatment is higher than or equal to 400° C. and lower than or equal to 750° C., preferably higher than or equal to 400° C. and lower than the strain point of the substrate. Here, the substrate is introduced into an electric furnace which is one of heat treatment apparatuses, heat treatment is performed on the oxide semiconductor layer in a nitrogen atmosphere at 450° C. for one hour, and then, the oxide semiconductor layer is not exposed to the air so that entry of water and hydrogen into the oxide semiconductor layer is prevented; thus, the oxide semiconductor layer is obtained. Through the first heat treatment, dehydration or dehydrogenation of the oxide semiconductor layer 412 can be conducted.

The apparatus for the heat treatment is not limited to the electric furnace and may be the one provided with a device for heating an object to be processed, using heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which hardly reacts with an object to be processed due to heat treatment, such as nitrogen or a rare gas such as argon is used.

For example, as the first heat treatment, GRTA may be performed as follows. The substrate is transferred and put in an inert gas which has been heated to a high temperature of 650° C. to 700° C., heated for several minutes, and transferred and taken out of the inert gas which has been heated to a high temperature. GRTA enables high-temperature heat treatment in a short time.

Note that in the first heat treatment, it is preferable that water, hydrogen, and the like be not included in nitrogen or a rare gas such as helium, neon, or argon. Alternatively, it is preferable that nitrogen or a rare gas such as helium, neon, or argon introduced into an apparatus for the heat treatment have a purity of 6N (99.9999%) or more, preferably, 7N (99.99999%) or more (that is, an impurity concentration is set to 1 ppm or lower, preferably, 0.1 ppm or lower).

Further, the oxide semiconductor layer might be crystallized to be a microcrystalline film or a polycrystalline film depending on a condition of the first heat treatment or a material of the oxide semiconductor layer 412. For example, the oxide semiconductor layer may be crystallized to become a microcrystalline oxide semiconductor layer having a degree of crystallization of 90% or more, or 80% or more. Further, depending on the condition of the first heat treatment and the material of the oxide semiconductor layer 412, the oxide semiconductor layer may become an amorphous oxide semiconductor layer containing no crystalline component. The oxide semiconductor layer might become an oxide semiconductor layer in which a microcrystalline portion (with a grain diameter greater than or equal to 1 nm and less than or equal to 20 nm, typically greater than or equal to 2 nm and less than or equal to 4 nm) is mixed into an amorphous oxide semiconductor.

Alternatively, the first heat treatment may be performed on the oxide semiconductor layer which has not yet been processed into the island-shaped oxide semiconductor layer 412. In that case, after the first heat treatment, the substrate is taken out of the heating apparatus and a photolithography process is performed.

The heat treatment having an effect of dehydration or dehydrogenation on the oxide semiconductor layer may be performed at any of the following timings: after the oxide semiconductor layer is formed; after a source electrode layer and a drain electrode layer are formed over the oxide semiconductor layer 412; and after a gate insulating layer is formed over the source electrode layer and the drain electrode layer.

Next, a conductive layer is formed over the insulating layer 407 and the oxide semiconductor layer 412. The conductive layer may be formed with, for example, a sputtering method or a vacuum evaporation method. As the material of the conductive layer, there are an element selected from Al, Cr, Cu, Ta, Ti, Mo, or W; an alloy including any of the above elements; and the like. Further, one or more materials selected from manganese, magnesium, zirconium, beryllium, and thorium may be used. The conductive layer may have a single-layer structure or a layered structure of two or more layers. For example, a single-layer structure of an aluminum layer including silicon, a two-layer structure in which a titanium layer is stacked over an aluminum layer, a three-layer structure in which a Ti layer, an aluminum layer, and a Ti layer are stacked in the order presented, and the like can be given. Alternatively, a layer, an alloy layer, or a nitride layer of a combination of Al and one or plurality of elements selected from the followings may be used: titanium (Ti), tantalum (Ta), tungsten (W), molybdenum (Mo), chromium (Cr), neodymium (Nd), and scandium (Sc).

A second photolithography process is performed. A resist mask is formed over the conductive layer and selective etching is performed, so that the source or drain electrode layer 415a and the source or drain electrode layer 415b are formed. Then, the resist mask is removed (see FIG. 6B). Note that the source electrode layer and the drain electrode layer preferably have tapered shapes because coverage with the gate insulating layer stacked thereover can be improved.

In this embodiment, a titanium layer is formed to a thickness of 150 nm with a sputtering method for the source or drain electrode layer 415a and the source or drain electrode layer 415b.

Note that materials and etching conditions are adjusted as appropriate so that the oxide semiconductor layer 412 is not removed and the insulating layer 407 under the oxide semiconductor layer 412 is not exposed when the conductive layer is etched.

In this embodiment, a Ti layer is used as the conductive film, an In—Ga—Zn—O-based oxide semiconductor is used as the oxide semiconductor layer 412, and an ammonia hydrogen peroxide solution (a mixture of ammonia, water, and a hydrogen peroxide solution) is used as an etchant.

Note that in the second photolithography process, only part of the oxide semiconductor layer 412 is etched, whereby an oxide semiconductor layer having a groove (a depressed portion) might be formed. The resist mask used for forming the source or drain electrode layer 415a and the source or drain electrode layer 415b may be formed with an inkjet method. When the resist mask is formed with an inkjet method, a photomask is not used; therefore, manufacturing costs can be reduced.

Ultraviolet, a KrF laser beam, or an ArF laser beam is used for light exposure for forming the resist mask in the second photolithography process. A channel length L of the thin film transistor to be formed later depends on a width of an interval between a bottom portion of the source electrode layer and a bottom portion of the drain electrode layer which are adjacent to each other over the oxide semiconductor layer 412. Note that when light exposure is performed in the case where the channel length L is shorter than 25 nm, extreme ultraviolet with extremely short wavelengths of several nanometers to several tens of nanometers is used for light exposure for forming the resist mask in the second photolithography process. Light exposure with extreme ultraviolet leads to a high resolution and a large focal depth. Accordingly, the channel length L of the thin film transistor to be formed later can be set to 10 nm to 1000 nm inclusive. Thus, the operation speed of a circuit can be increased, and further, an off-state current can be significantly small so that low power consumption can be achieved.

Figure 6C:
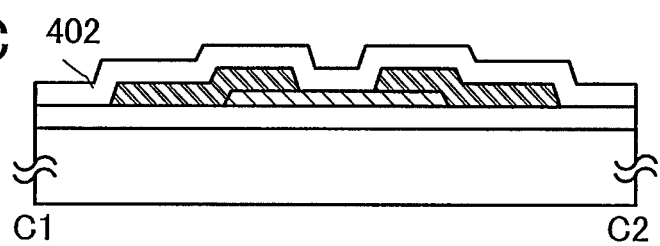
Figure 6D:
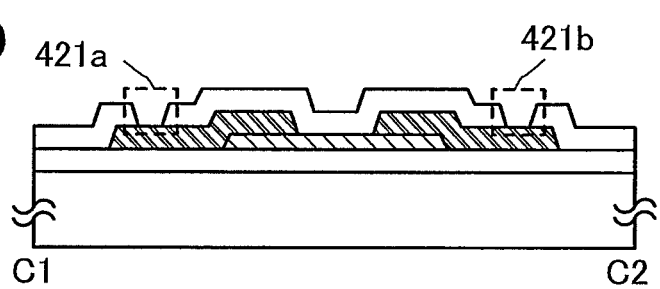

Next, a gate insulating layer 402 is formed over the insulating layer 407, the oxide semiconductor layer 412, the source or drain electrode layer 415a, and the source or drain electrode layer 415b (see FIG. 6C).

The gate insulating layer 402 can be formed with a single-layer structure or a layered structure using any of a silicon oxide layer, a silicon nitride layer, a silicon oxynitride layer, a silicon nitride oxide layer, and an aluminum oxide layer with a plasma CVD method, a sputtering method, or the like. Note that the gate insulating layer 402 is preferably formed with a sputtering method so that the gate insulating layer 402 contains hydrogen as little as possible. In the case where a silicon oxide layer is formed with a sputtering method, a silicon target or a quartz target is used as a target and oxygen or a mixed gas of oxygen and argon is used as a sputtering gas.

The gate insulating layer 402 may have a structure where a silicon oxide layer and a silicon nitride layer are stacked from the side of the source or drain electrode layer 415a and the source or drain electrode layer 415b. For example, a silicon oxide layer ($SiO_x$ (x>0)) with a thickness of 5 nm to 300 nm inclusive is formed as a first gate insulating layer and a silicon nitride layer ($SiN_y$ (y>0)) with a thickness of 50 nm to 200 nm inclusive is stacked as a second gate insulating layer over the first gate insulating layer; thus, the gate insulating layer with a thickness of 100 nm may be formed. In this embodiment, a silicon oxide layer is formed to a thickness of 100 nm with an RF sputtering method under the following condition: the pressure is 0.4 Pa; the electric power of the high frequency power source is 1.5 kW; and the atmosphere is an atmosphere containing oxygen and argon (the flow ratio of oxygen to argon is 1:1 (each flow rate is 25 sccm).

Then, a third photolithography process is performed. A resist mask is formed and selective etching is performed to remove parts of the gate insulating layer 402, so that openings 421a and 421b reaching the source or drain electrode layer 415a and the source or drain electrode layer 415b, respectively, are formed (see FIG. 6D).

Then, after a conductive layer is formed over the gate insulating layer 402 and in the openings 421a and 421b, the gate electrode layer 411 and the wiring layers 414a and 414b are formed in a fourth photolithography process. Note that a resist mask may be formed with an inkjet method. When the resist mask is formed with an inkjet method, a photomask is not used; therefore, manufacturing costs can be reduced.

Further, the gate electrode layer 411 and the wiring layers 414a and 414b can be formed with a single-layer structure or a layered structure using any of metal materials such as molybdenum, titanium, chromium, tantalum, tungsten, aluminum, copper, neodymium, and scandium, and an alloy material including any of these materials as a main component.

As a two-layer structure of each of the gate electrode layer 411 and the wiring layers 414a and 414b, for example, a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, or a two-layer structure in which a titanium nitride layer and a molybdenum layer are stacked is preferable. As a three-layer structure, a stack of a tungsten layer or a tungsten nitride layer, an alloy layer of aluminum and silicon or an alloy layer of aluminum and titanium, and a titanium nitride layer or a titanium layer is preferable. Note that the gate electrode layer may be formed using a light-transmitting conductive layer. A light-transmitting conductive oxide can be given as an example of the light-transmitting conductive layer.

In this embodiment, a titanium layer is formed to a thickness of 150 nm with a sputtering method for the gate electrode layer 411 and the wiring layers 414a and 414b.

Next, second heat treatment (preferably 200° C. to 400° C. inclusive, for example, from 250° C. to 350° C. inclusive) is performed in an inert gas atmosphere or an oxygen gas atmosphere. In this embodiment, the second heat treatment is performed in a nitrogen atmosphere at 250° C. for one hour. The second heat treatment may be performed after a protective insulating layer or a planarization insulating layer is formed over the thin film transistor 410.

Further, heat treatment may be performed at 100° C. to 200° C. inclusive for one hour to 30 hours inclusive in the air. This heat treatment may be performed at a fixed heating temperature. Alternatively, the following change in the heating temperature may be conducted plural times repeatedly: the heating temperature is increased from a room temperature to a temperature of 100° C. to 200° C. inclusive and then decreased to a room temperature. Further, this heat treatment may be performed under a reduced pressure. Under a reduced pressure, the heating time can be shortened.

Figure 6E:
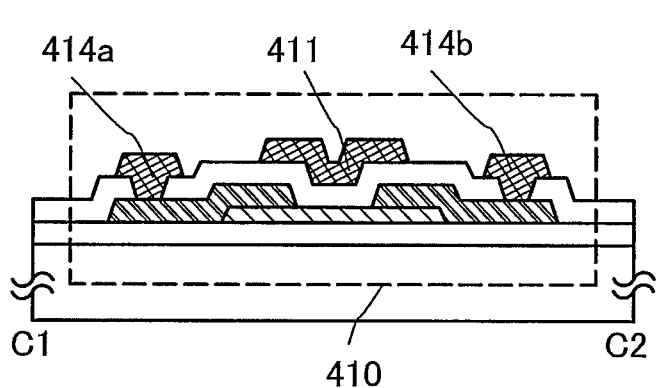

Through the above steps, the thin film transistor 410 including the oxide semiconductor layer 412 in which the concentration of hydrogen, moisture, hydride, or hydroxide is reduced can be formed (see FIG. 6E). The thin film transistor 410 can be used as the thin film transistor included in the logic circuit in Embodiment 1 or Embodiment 2.

A protective insulating layer or a planarization insulating layer for planarization may be provided over the thin film transistor 410. For example, the protective insulating layer may be formed with a single-layer structure or a layered structure using any of a silicon oxide layer, a silicon nitride layer, a silicon oxynitride layer, a silicon nitride oxide layer, and an aluminum oxide layer.

Although not illustrated, the planarization insulating layer can be formed using a heat-resistant organic material such as polyimide, an acrylic resin, a benzocyclobutene resin, polyamide, or an epoxy resin. Other than such organic materials, it is also possible to use a low-dielectric constant material (a low-k material), a siloxane-based resin, PSG (phosphosilicate glass), BPSG (borophosphosilicate glass), or the like. Note that the planarization insulating layer may be formed by stacking a plurality of insulating layers formed using any of these materials.

Note that a siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. Moreover, the organic group may include a fluoro group.

There is no particular limitation on the method of forming the planarization insulating layer, and the following method or means can be employed depending on the material: a method such as a sputtering method, an SOG method, a spin coating method, a dipping method, a spray coating method, or a droplet discharge method (e.g., an inkjet method, screen printing, or offset printing), or a tool such as a doctor knife, a roll coater, a curtain coater, or a knife coater.

Moisture remaining in a reaction atmosphere is removed as described above in forming the oxide semiconductor layer, whereby the concentration of hydrogen and hydride in the oxide semiconductor layer can be reduced. Accordingly, the oxide semiconductor layer can be stable.

The logic circuits in Embodiments 1 and 2 including the above-described thin film transistors can have stable electric characteristics and high reliability.

This embodiment can be implemented in appropriate combination with the other embodiments.

Embodiment 4

In this embodiment, another example of thin film transistors included in the logic circuit in Embodiment 1 or Embodiment 2 is described. The same portions as those in Embodiment 3 and portions having functions similar to those of the portions in Embodiment 3 and steps similar to those in Embodiment 3 may be handled as in Embodiment 3, and repeated description is omitted. In addition, detailed description of the same portions is also omitted.

One embodiment of a thin film transistor and a manufacturing method of the thin film transistor of this embodiment is described with reference to FIGS. 7A and 7B and FIGS. 8A to 8E.

Figure 7A:
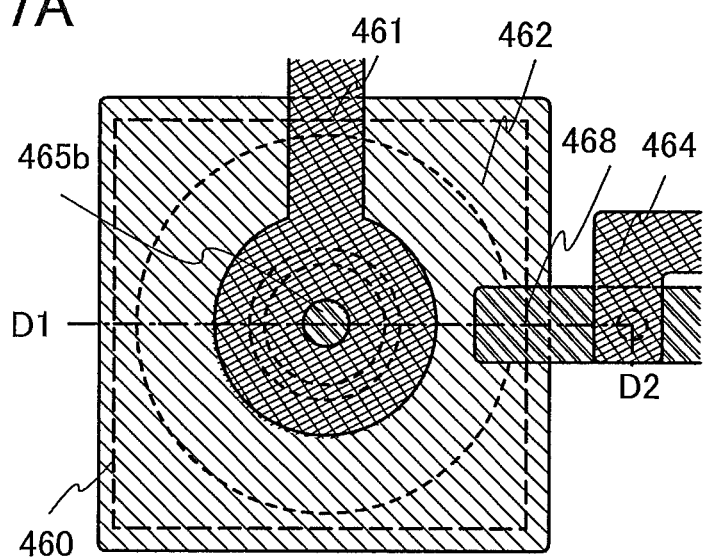
FIG. 7A is a plan view illustrating an example of a thin film transistor.
Figure 7B:
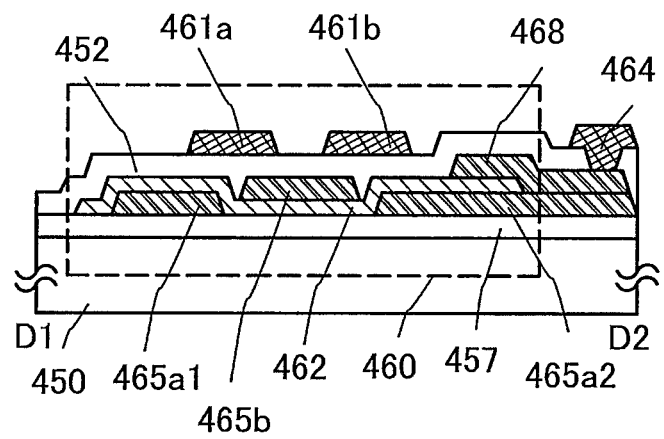
FIG. 7B is a cross-sectional view illustrating the example of the thin film transistor.

FIGS. 7A and 7B illustrate an example of a planar structure and a cross-sectional structure of a thin film transistor. A thin film transistor 460 illustrated in FIGS. 7A and 7B is one of top gate thin film transistors.

FIG. 7A is a plan view of the thin film transistor 460 having a top-gate structure and FIG. 7B is a cross-sectional view taken along a line D1-D2 in FIG. 7A.

The thin film transistor 460 includes, over a substrate 450 having an insulating surface, an insulating layer 457, a source or drain electrode layer 465a (465a1 and 465a2), an oxide semiconductor layer 462, a source or drain electrode layer 465b, a wiring layer 468, a gate insulating layer 452, and a gate electrode layer 461 (461a and 461b). The source or drain electrode layer 465a (465a1 and 465a2) is electrically connected to a wiring layer 464 through the wiring layer 468. Although not illustrated, the source or drain electrode layer 465b is electrically connected to a wiring layer through an opening formed in the gate insulating layer 452.

A process of manufacturing the thin film transistor 460 over the substrate 450 is described below with reference to FIGS. 8A to 8E.

First, the insulating layer 457 which serves as a base film is formed over the substrate 450 having an insulating surface.

In this embodiment, a silicon oxide layer is formed as the insulating layer 457 with a sputtering method. The substrate 450 is transferred to a treatment chamber and a sputtering gas from which hydrogen and moisture is removed and which contains high-purity oxygen is introduced, whereby a silicon oxide layer is formed as the insulating layer 457 over the substrate 450 with the use of a silicon target or a quartz (preferably synthetic quartz). As a sputtering gas, oxygen or a mixed gas of oxygen and argon is used.

For example, a silicon oxide layer is formed with an RF sputtering method under the following condition: the purity of a sputtering gas is 6N; quartz (preferably, synthetic quartz) is used; the substrate temperature is 108° C.; the distance between the substrate and the target (the T-S distance) is 60 mm; the pressure is 0.4 Pa; the electric power of the high frequency power source is 1.5 kW; and the atmosphere is an atmosphere containing oxygen and argon (the flow ratio of oxygen to argon is 1:1 (each flow rate is 25 sccm). The thickness of the silicon oxide layer is 100 nm. Note that instead of quartz (preferably, synthetic quartz), a silicon target can be used as a target used when the silicon oxide layer is formed.

In that case, the insulating layer 457 is preferably formed while removing moisture remaining in the treatment chamber. This is for preventing hydrogen, a hydroxyl group, and moisture from being contained in the insulating layer 457. In the deposition chamber which is evacuated with a cryopump, a hydrogen atom, a compound containing a hydrogen atom, such as water ($H_2O$), and the like are evacuated, whereby the concentration of an impurity in the insulating layer 457 formed in the deposition chamber can be reduced.

It is preferable to use a high-purity gas from which an impurity such as hydrogen, water, a hydroxyl group, or hydride is removed to a concentration expressed by a level of ppm or ppb, as a sputtering gas used when the insulating layer 457 is formed.

Further, the insulating layer 457 may have a layered structure in which for example, a nitride insulating layer such as a silicon nitride layer, a silicon nitride oxide layer, an aluminum nitride layer, or an aluminum nitride oxide layer and an oxide insulating layer are stacked in this order from the substrate 450 side.

For example, a sputtering gas from which hydrogen and moisture are removed and which contains high-purity nitrogen is introduced and a silicon target is used, whereby a silicon nitride layer is formed between a silicon oxide layer and a substrate. In this case, the silicon nitride layer is preferably formed while removing remaining moisture in a treatment chamber, similarly to the silicon oxide layer.

Next, a conductive layer is formed over the insulating layer 457 and a first photolithography process is performed. A resist mask is formed over the conductive layer and selective etching is performed, so that the source or drain electrode layer 465a1 and 465a2 is formed. Then, the resist mask is removed (see FIG. 8A). It seems in cross section as if the source or drain electrode layer 465a1 and 465a2 is divided; however, the source or drain electrode layer 465a1 and 465a2 is a continuous layer. Note that the source electrode layer and the drain electrode layer preferably have tapered shapes because coverage with the gate insulating layer stacked thereover can be improved.

As the material of the source or drain electrode layer 465a1 and 465a2, there are an element selected from Al, Cr, Cu, Ta, Ti, Mo, or W; an alloy including any of the above elements; and the like. Further, one or more materials selected from manganese, magnesium, zirconium, beryllium, and thorium may be used. The conductive layer may have a single-layer structure or a layered structure of two or more layers. For example, a single-layer structure of an aluminum layer including silicon, a two-layer structure in which a titanium layer is stacked over an aluminum layer, a three-layer structure in which a Ti layer, an aluminum layer, and a Ti layer are stacked in the order presented, and the like can be given. Alternatively, a layer, an alloy layer, or a nitride layer of a combination of Al and one or plurality of elements selected from the followings may be used: titanium (Ti), tantalum (Ta), tungsten (W), molybdenum (Mo), chromium (Cr), neodymium (Nd), and scandium (Sc).

In this embodiment, a titanium layer is formed to a thickness of 150 nm with a sputtering method for the source or drain electrode layer 465a*l* and 465a2.

Then, an oxide semiconductor layer is formed to a thickness of 2 nm to 200 nm inclusive over the gate insulating layer 457 and the source or drain electrode layer 465a*l* and 465a2.

Figure 8A:
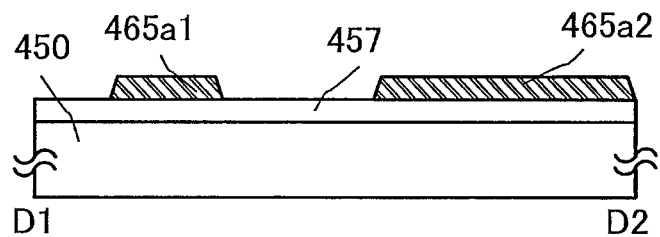
FIGS. 8A to 8E are cross-sectional views illustrating an example of a method for manufacturing a thin film transistor.
Figure 8B:
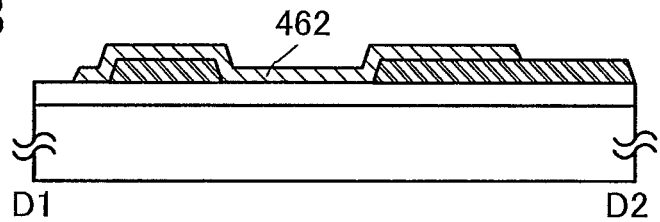
Figure 8C:
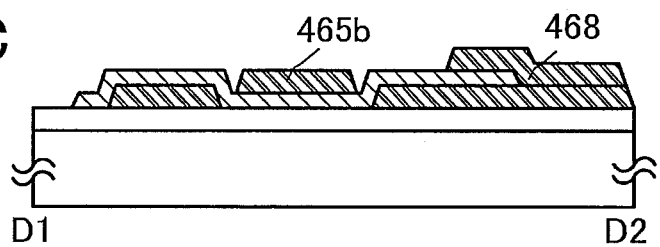
Figure 8D:
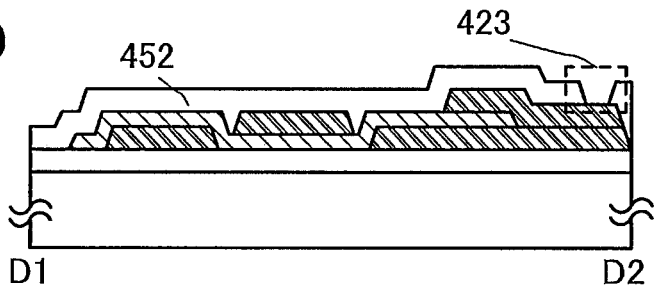

Then, an oxide semiconductor layer is formed and in a second photolithography process, the oxide semiconductor layer is processed into an island-shaped oxide semiconductor layer 462 (see FIG. 8B). In this embodiment, the oxide semiconductor layer is formed with a sputtering method with the use of an In—Ga—Zn—O-based metal oxide target.

The substrate is held in a treatment chamber kept under reduced pressure, a sputtering gas from which hydrogen and moisture are removed is introduced into the treatment chamber from which remaining moisture is being removed, and the oxide semiconductor layer is deposited over the substrate 450 with the use of a metal oxide as a target. To remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the deposition chamber which is evacuated with the cryopump, a hydrogen atom, a compound containing a hydrogen atom, such as water ($H_2O$), (more preferably, also a compound containing a carbon atom), and the like are evacuated, whereby the concentration of an impurity in the oxide semiconductor layer formed in the deposition chamber can be reduced. The substrate may be heated when the oxide semiconductor layer is formed.

It is preferable to use a high-purity gas from which an impurity such as hydrogen, water, a hydroxyl group, or hydride is removed to a concentration expressed by a level of ppm or ppb, as a sputtering gas used when the oxide semiconductor layer is formed.

An example of the deposition condition is as follows: the substrate temperature is room temperature, the distance between the substrate and the target is 60 mm, the pressure is 0.4 Pa, the electric power of the DC power source is 0.5 kW, and the atmosphere is an atmosphere containing oxygen and argon (the flow ratio of oxygen to argon is 15 sccm:30 sccm). It is preferable that a pulsed DC power source be used because powder substances (also referred to as particles or dust) generated in film formation can be reduced and the film thickness can be uniform. The oxide semiconductor layer preferably has a thickness of 5 nm to 30 nm inclusive. Note that the appropriate thickness depends on an oxide semiconductor material used and the thickness may be selected in accordance with a material.

In this embodiment, the oxide semiconductor layer is processed into the island-shaped oxide semiconductor layer 462 with a wet etching method with a mixed solution of phosphoric acid, acetic acid, and nitric acid as an etchant.

Next, the oxide semiconductor layer 462 is subjected to first heat treatment. The temperature of first heat treatment for the first heat treatment is higher than or equal to 400° C. and lower than or equal to 750° C., preferably higher than or equal to 400° C. and lower than the strain point of the substrate. Here, the substrate is introduced into an electric furnace which is one of heat treatment apparatuses, heat treatment is performed on the oxide semiconductor layer in a nitrogen atmosphere at 450° C. for one hour, and then, the oxide semiconductor layer is not exposed to the air so that entry of water and hydrogen into the oxide semiconductor layer is prevented; thus, the oxide semiconductor layer is obtained. Through the first heat treatment, dehydration or dehydrogenation of the oxide semiconductor layer 462 can be conducted.

The apparatus for the heat treatment is not limited to the electric furnace and may be the one provided with a device for heating an object to be processed, using heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. For example, as the first heat treatment, GRTA may be performed as follows. The substrate is transferred and put in an inert gas which has been heated to a high temperature of 650° C. to 700° C., heated for several minutes, and transferred and taken out of the inert gas which has been heated to a high temperature. GRTA enables high-temperature heat treatment in a short time.

Note that in the first heat treatment, it is preferable that water, hydrogen, and the like be not included in nitrogen or a rare gas such as helium, neon, or argon. Alternatively, it is preferable that nitrogen or a rare gas such as helium, neon, or argon introduced into an apparatus for the heat treatment have a purity of 6N (99.9999%) or more, preferably, 7N (99.99999%) or more (that is, an impurity concentration is set to 1 ppm or lower, preferably, 0.1 ppm or lower).

Further, the oxide semiconductor layer might be crystallized to be a microcrystalline layer or a polycrystalline layer depending on a condition of the first heat treatment or a material of the oxide semiconductor layer.

Alternatively, the first heat treatment of the oxide semiconductor layer may be performed on the oxide semiconductor layer which has not yet been processed into the island-shaped oxide semiconductor layer. In that case, after the first heat treatment, the substrate is taken out of the heating apparatus and a photolithography process is performed.

The heat treatment has an effect of dehydration or dehydrogenation on the oxide semiconductor layer may be performed at any of the following timings: after the oxide semiconductor layer is formed; after a source electrode layer and a drain electrode layer are formed over the oxide semiconductor layer; and after a gate insulating layer is formed over the source electrode layer and the drain electrode layer.

Next, a conductive layer is formed over the insulating layer 457 and the oxide semiconductor layer 462 and a third photolithography process is performed. A resist mask is formed over the conductive layer and selective etching is performed, so that the source or drain electrode layer 465b and the wiring layer 468 are formed. Then, the resist mask is removed (see FIG. 8C). The source or drain electrode layer 465b and the wiring layer 468 may be formed using a material and steps similar to those of the source or drain electrode layer 465a*l* and 465a2.

In this embodiment, a titanium layer is formed to a thickness of 150 nm with a sputtering method for the source or drain electrode layer 465b and the wiring layer 468. In this embodiment, the same titanium layer is used for the source or drain electrode layer 465a*l* and 465a2 and the source or drain electrode layer 465b, so that the etching selectivity of the source or drain electrode layer 465a*l* and 465a2 is the same as or substantially the same as that of the source or drain electrode layer 465b. Therefore, the wiring layer 468 is provided over a portion of the source or drain electrode layer 465a2, which is not covered with the oxide semiconductor layer 462, to prevent the source or drain electrode layer 465a*l* and 465a2 from being etched when the source or drain electrode layer 465b is etched. In the case of using different materials which provide high selectivity ratio of the source or drain electrode layer 465b to the source or drain electrode layer 465a*l* and 465a2 in the etching step, the wiring layer 468 which protects the source or drain electrode layer 465a2 in etching is not necessarily provided.

Note that materials and etching conditions are adjusted as appropriate so that the oxide semiconductor layer 462 is not removed when the conductive layer is etched.

In this embodiment, a Ti layer is used as the conductive film, an In—Ga—Zn—O-based oxide semiconductor is used as the oxide semiconductor layer 462, and an ammonia hydrogen peroxide solution (a mixture of ammonia, water, and a hydrogen peroxide solution) is used as an etchant.

Note that in the third photolithography process, part of the oxide semiconductor layer 462 is etched, whereby an oxide semiconductor layer having a groove (a depressed portion) might be formed. The resist mask used for forming the source or drain electrode layer 465b and the wiring layer 468 may be formed with an inkjet method. When the resist mask is formed with an inkjet method, a photomask is not used; therefore, manufacturing costs can be reduced.

Next, a gate insulating layer 452 is formed over the insulating layer 457, the oxide semiconductor layer 462, the source or drain electrode layer 465a*l* and 465a2, the source or drain electrode layer 465b, and the wiring layer 468.

The gate insulating layer 452 can be formed with a single-layer structure or a layered structure using any of a silicon oxide layer, a silicon nitride layer, a silicon oxynitride layer, a silicon nitride oxide layer, and an aluminum oxide layer with a plasma CVD method, a sputtering method, or the like. Note that the gate insulating layer 452 is preferably formed with a sputtering method so that the gate insulating layer 452 contains hydrogen as little as possible. In the case where a silicon oxide film is formed with a sputtering method, a silicon target or a quartz target is used as a target and a mixed gas of oxygen and argon is used as a sputtering target.

The gate insulating layer 452 may have a structure where a silicon oxide layer and a silicon nitride layer are stacked from the side of the source or drain electrode layer 465a*l* and 465a2 and the source or drain electrode layer 465b. In this embodiment, a silicon oxide layer is formed to a thickness of 100 nm with an RF sputtering method under the following condition: the pressure is 0.4 Pa; the electric power of the high frequency power source is 1.5 kW; and the atmosphere is an atmosphere containing oxygen and argon (the flow ratio of oxygen to argon is 1:1 (each flow rate is 25 sccm).

Next, a fourth photolithography process is performed. A resist mask is formed and selective etching is performed to remove part of the gate insulating layer 452, so that an opening 423 reaching the wiring layer 468 is formed (see FIG. 8D). Although not illustrated, in forming the opening 423, an opening reaching the source or drain electrode layer 465b may be formed. In this embodiment, the opening reaching the source or drain electrode layer 465b is formed after an interlayer insulating layer is further stacked, and a wiring layer for electrical connection is formed in the opening.

Then, after a conductive layer is formed over the gate insulating layer 452 and in the opening 423, the gate electrode layer 461 (461a and 461b) and the wiring layer 464 are formed in a fifth photolithography process. Note that a resist mask may be formed with an inkjet method. When the resist mask is formed with an inkjet method, a photomask is not used; therefore, manufacturing costs can be reduced.

Further, the gate electrode layer 461 (461a and 461b) and the wiring layer 464 can be formed with a single-layer structure or a layered structure using any of metal materials such as molybdenum, titanium, chromium, tantalum, tungsten, aluminum, copper, neodymium, and scandium, and an alloy material including any of these materials as a main component.

In this embodiment, a titanium layer is formed to a thickness of 150 nm with a sputtering method for the gate electrode layer 461 (461a and 461b) and the wiring layer 464.

Next, second heat treatment (preferably 200° C. to 400° C. inclusive, for example, from 250° C. to 350° C. inclusive) is performed in an inert gas atmosphere or an oxygen gas atmosphere. In this embodiment, the second heat treatment is performed in a nitrogen atmosphere at 250° C. for one hour. The second heat treatment may be performed after a protective insulating layer or a planarization insulating layer is formed over the thin film transistor 460.

Further, heat treatment may be performed at 100° C. to 200° C. inclusive for one hour to 30 hours inclusive in the air. This heat treatment may be performed at a fixed heating temperature. Alternatively, the following change in the heating temperature may be conducted plural times repeatedly: the heating temperature is increased from a room temperature to a temperature of 100° C. to 200° C. inclusive and then decreased to a room temperature. Further, this heat treatment may be performed under a reduced pressure. Under a reduced pressure, the heating time can be shortened.

Figure 8E:
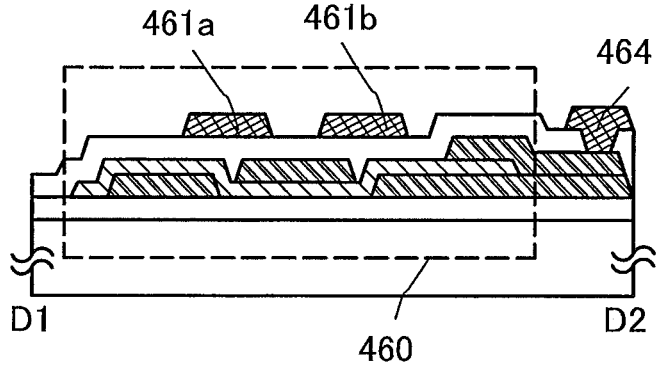

Through the above steps, the thin film transistor 460 including the oxide semiconductor layer 462 in which the concentration of hydrogen, moisture, hydride, or hydroxide is reduced can be formed (see FIG. 8E).

A protective insulating layer or a planarization insulating layer for planarization may be provided over the thin film transistor 460. Although not illustrated, an opening reaching the source or drain electrode layer 465b may be formed. In this embodiment, the opening reaching the source or drain electrode layer 465b is formed in the gate insulating layer 452, the protective insulating layer, and the planarization layer, and a wiring layer for electrical connection to the source or drain electrode layer 465b is formed in the opening.

Moisture remaining in a reaction atmosphere is removed as described above in forming the oxide semiconductor film, whereby the concentration of hydrogen and hydride in the oxide semiconductor film can be reduced. Accordingly, the oxide semiconductor film can be stable.

The logic circuits in Embodiments 1 and 2 including the above-described thin film transistors can have stable electric characteristics and high reliability.

This embodiment can be implemented in appropriate combination with the other embodiments.

Embodiment 5

In this embodiment, another example of thin film transistors included in the logic circuit in Embodiment 1 or Embodiment 2 is described. The same portions as those in Embodiment 3 or Embodiment 4 and portions having functions similar to those of the portions in Embodiment 3 or Embodiment 4 and steps similar to those in Embodiment 3 or Embodiment 4 may be handled as in Embodiment 3 or Embodiment 4, and repeated description is omitted. In addition, detailed description of the same portions is also omitted.

The thin film transistors of this embodiment are described with reference to FIGS. 9A and 9B.

Figure 9A:
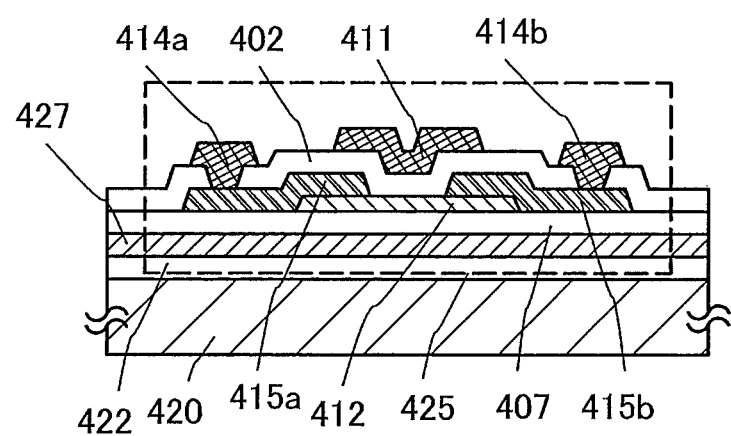
FIGS. 9A and 9B are cross-sectional views illustrating examples of thin film transistors.
Figure 9B:
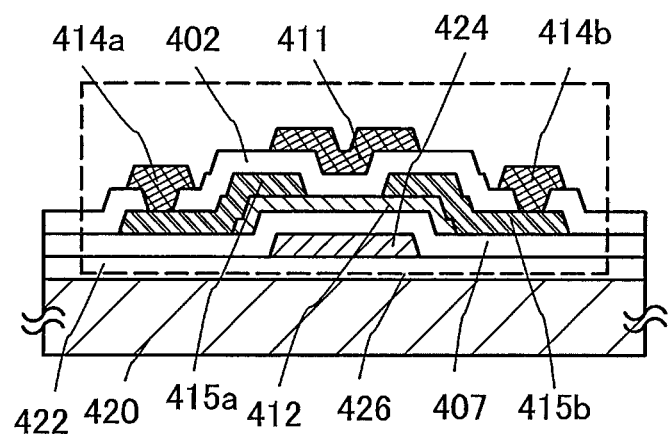

FIGS. 9A and 9B illustrate examples of cross-sectional structures of the thin film transistors. The thin film transistors 425 and 426 in FIGS. 9A and 9B are each one of thin film transistors where an oxide semiconductor layer is sandwiched between a conductive layer and a gate electrode layer.

In addition, in FIGS. 9A and 9B, a silicon substrate is used as a substrate and the thin film transistors 425 and 426 are provided over an insulating layer 422 which is formed over a silicon substrate 420.

In FIG. 9A, a conductive layer 427 is formed between the insulating layer 422 and the insulating layer 407 over the silicon substrate 420 so as to overlap with at least the whole oxide semiconductor layer 412.

Note that FIG. 9B illustrates an example where the conductive layer between the insulating layer 422 and the insulating layer 407 is processed like the conductive layer 424 by etching and overlaps with part of the oxide semiconductor layer 412, which includes at least a channel formation region.

The conductive layers 427 and 424 may each be formed using a metal material which can resist temperature for heat treatment to be performed in a later step: an element selected from titanium (Ti), tantalum (Ta), tungsten (W), molybdenum (Mo), chromium (Cr), neodymium (Nd), and scandium (Sc), an alloy film containing a combination of any of these elements, a nitride containing any of the above elements as its component, or the like. Further, the conductive layers 427 and 424 may each have either a single-layer structure or a layered structure, and for example, a single layer of a tungsten layer or a stack of a tungsten nitride layer and a tungsten layer can be used.

A potential of the conductive layers 427 and 424 may be the same as or different from that of the gate electrode layer 411 of the thin film transistors 425 and 426. The conductive layers 427 and 424 can each also function as a second gate electrode layer. The potential of the conductive layers 427 and 424 may be a fixed potential such as GND or 0 V.

Electric characteristics of the thin film transistors 425 and 426 can be controlled by the conductive layers 427 and 424.

This embodiment can be implemented in appropriate combination with the other embodiments.

Embodiment 6

In this embodiment, an example of thin film transistors included in the logic circuit in Embodiment 1 or Embodiment 2 is described.

One embodiment of a thin film transistor and a manufacturing method of the thin film transistor of this embodiment is described with reference to FIGS. 10A to 10E.

Figure 10A:
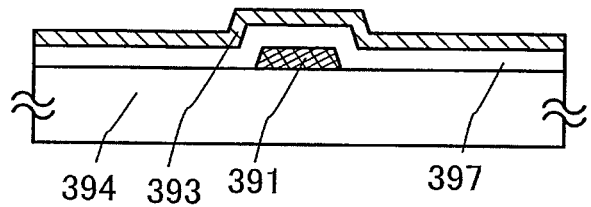
FIGS. 10A to 10E are cross-sectional views illustrating an example of a method for manufacturing a thin film transistor.
Figure 10B:
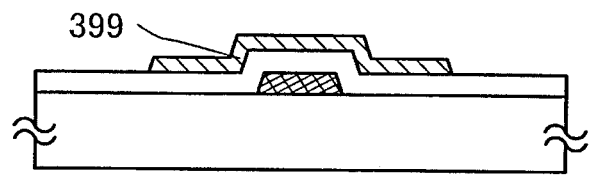
Figure 10C:
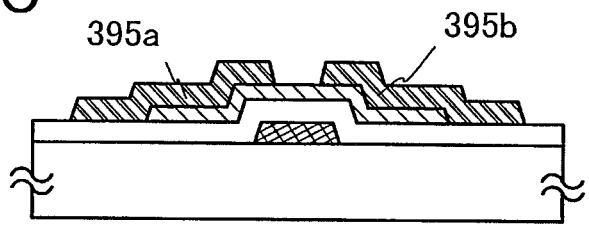
Figure 10D:
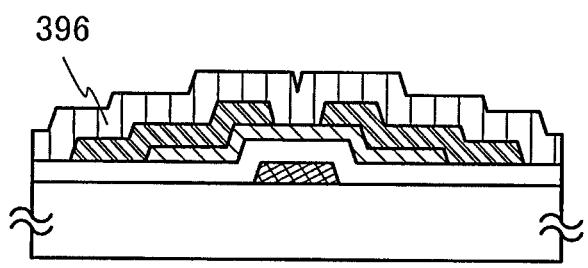
Figure 10E:
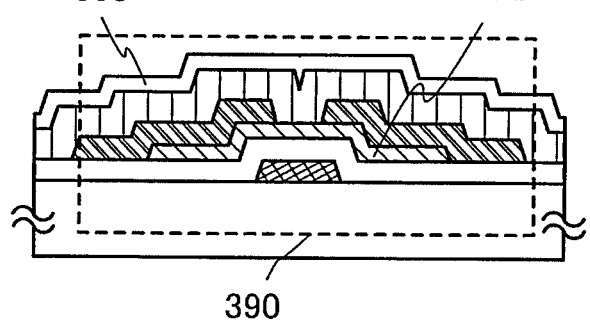

FIG. 10E illustrate an example of a cross-sectional structure of a thin film transistor. A thin film transistor 390 illustrated in FIG. 10E is one of bottom gate thin film transistors and is also referred to as an inverted staggered thin film transistor.

Although description is given using a single-gate thin film transistor as the thin film transistor 390, a multi-gate thin film transistor including a plurality of channel formation regions may be formed as needed.

A process of manufacturing the thin film transistor 390 over a substrate 394 is described below with reference to FIGS. 10A to 10E.

First, after a conductive layer is formed over the substrate 394 having an insulating surface, a gate electrode layer 391 is formed in a first photolithography process. The gate electrode layer preferably has a tapered shape because coverage with a gate insulating layer stacked thereover can be improved. Note that a resist mask may be formed with an inkjet method. When the resist mask is formed with an inkjet method, a photomask is not used; therefore, manufacturing costs can be reduced.

There is no particular limitation on a substrate that can be used as the substrate 394 having an insulating surface as long as it has at least heat resistance to withstand heat treatment performed later. A glass substrate formed using barium borosilicate glass, aluminoborosilicate glass, or the like can be used.

When the temperature of the heat treatment performed later is high, a substrate having a strain point of 730° C. or higher is preferably used as the glass substrate. As a material of the glass substrate, a glass material such as aluminosilicate glass, aluminoborosilicate glass, or barium borosilicate glass is used, for example. Note that in general, by containing a larger amount of barium oxide (BaO) than boron oxide ($B_2O_3$), a glass substrate is heat-resistant and of more practical use. Therefore, a glass substrate containing a larger amount of BaO than $B_2O_3$ is preferably used.

Note that, instead of the glass substrate described above, a substrate formed using an insulator such as a ceramic substrate, a quartz substrate, or a sapphire substrate may be used as the substrate 394. Alternatively, a crystallized glass substrate or the like may be used. Still alternatively, a plastic substrate or the like can be used as appropriate.

An insulating layer serving as a base layer may be provided between the substrate 394 and the gate electrode layer 391. The base layer has a function of preventing diffusion of an impurity element from the substrate 394, and can be formed with a single-layer structure or a layered structure using any of a silicon nitride layer, a silicon oxide layer, a silicon nitride oxide layer, and a silicon oxynitride layer.

Further, the gate electrode layer 391 can be formed with a single-layer structure or a layered structure using any of metal materials such as molybdenum, titanium, chromium, tantalum, tungsten, aluminum, copper, neodymium, and scandium, and an alloy material including any of these materials as a main component.

As a two-layer structure of the gate electrode layer 391, for example, a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, a two-layer structure in which a titanium nitride layer and a molybdenum layer are stacked, or a two-layer structure in which a tungsten nitride layer and a tungsten layer are stacked is preferable. As a three-layer structure, a stack of a tungsten layer or a tungsten nitride layer, an alloy layer of aluminum and silicon or an alloy layer of aluminum and titanium, and a titanium nitride layer or a titanium layer is preferable. Note that the gate electrode layer may be formed using a light-transmitting conductive layer. A light-transmitting conductive oxide can be given as an example of the light-transmitting conductive layer.

Then, the gate insulating layer 397 is formed over the gate electrode layer 391.

The gate insulating layer 397 can be formed with a single-layer structure or a layered structure using any of a silicon oxide layer, a silicon nitride layer, a silicon oxynitride layer, a silicon nitride oxide layer, and an aluminum oxide layer with a plasma CVD method, a sputtering method, or the like. Note that the gate insulating layer 397 is preferably formed with a sputtering method so that the gate insulating layer 397 contains hydrogen as little as possible. In the case where a silicon oxide layer is formed with a sputtering method, a silicon target or a quartz target is used as a target and oxygen or a mixed gas of oxygen and argon is used as a sputtering gas.

The gate insulating layer 397 may have a structure where a silicon nitride layer and a silicon oxide layer are stacked from the gate electrode layer 391 side. For example, a silicon nitride layer ($SiN_y$ (y>0)) with a thickness of 50 nm to 200 nm inclusive is formed with a sputtering method as a first gate insulating layer and a silicon oxide layer ($SiO_x$ (x>0)) with a thickness of 5 nm to 300 nm inclusive is stacked as a second gate insulating layer over the first gate insulating layer; thus, the gate insulating layer with a thickness of 100 nm may be formed.

Further, in order that hydrogen, a hydroxyl group, and moisture might be contained in the gate insulating layer 397 and an oxide semiconductor layer 393 to be formed later as little as possible, it is preferable that the substrate 394 over which the gate electrode layer 391 is formed or the substrate 394 over which layers up to the gate insulating layer 397 are formed be preheated in a preheating chamber of a sputtering apparatus as pretreatment for film formation so that impurities such as hydrogen and moisture adsorbed to the substrate 394 is eliminated and evacuated. The temperature for the preheating is 100° C. to 400° C. inclusive, preferably 150° C. to 300° C. inclusive. Note that a cryopump is preferable as an evacuation unit provided in the preheating chamber. Note that this preheating treatment may be omitted. Further, this preheating may be similarly performed on the substrate 394 over which an oxide insulating layer 396 has not been formed and the substrate 394 over which layers up to a source electrode layer 395a and a drain electrode layer 395b have been formed.

Then, the oxide semiconductor layer 393 is formed to a thickness of 2 nm to 200 nm inclusive over the gate insulating layer 397 (see FIG. 10A).

Note that before the oxide semiconductor layer 393 is formed with a sputtering method, dust attached to a surface of the gate insulating layer 397 is preferably removed with reverse sputtering in which an argon gas is introduced and plasma is generated. The reverse sputtering refers to a method in which, without application of a voltage to a target side, an RF power source is used for application of a voltage to a substrate side in an argon atmosphere to modify a surface. Note that instead of an argon atmosphere, a nitrogen atmosphere, a helium atmosphere, an oxygen atmosphere, or the like may be used.

The oxide semiconductor layer 393 is formed with a sputtering method. The oxide semiconductor layer 393 is formed using an In—Ga—Zn—O-based oxide semiconductor layer, an In—Sn—Zn—O-based oxide semiconductor layer, an In—Al—Zn—O-based oxide semiconductor layer, a Sn—Ga—Zn—O-based oxide semiconductor layer, an Al—Ga—Zn—O-based oxide semiconductor layer, a Sn—Al—Zn—O-based oxide semiconductor layer, an In—Zn—O-based oxide semiconductor layer, a Sn—Zn—O-based oxide semiconductor layer, an Al—Zn—O-based oxide semiconductor layer, an In—O-based oxide semiconductor layer, a Sn—O-based oxide semiconductor layer, or a Zn—O-based oxide semiconductor layer. In this embodiment, the oxide semiconductor layer 393 is formed with a sputtering method with the use of an In—Ga—Zn—O-based metal oxide target. Further, the oxide semiconductor layer 393 can be formed with a sputtering method in a rare gas (typically, argon) atmosphere, an oxygen atmosphere, or a mixed atmosphere containing a rare gas (typically, argon) and oxygen. In the case of employing a sputtering method, a target containing $SiO_2$ at 2 wt % to 10 wt % inclusive may be used for film formation.

As a target for forming the oxide semiconductor layer 393 with a sputtering method, a metal oxide target containing zinc oxide as its main component can be used. As another example of a metal oxide target, an oxide semiconductor film formation target containing In, Ga, and Zn (in a composition ratio, $In_2O_3$:$Ga_2O_3$:ZnO=1:1:1 [mol], In:Ga:Zn=1:1:0.5 [atom]) can be used. Alternatively, a metal oxide target containing In, Ga, and Zn (the composition ratio of In:Ga:Zn=1:1:1 or 1:1:2 [atom]) may be used. The fill rate of the metal oxide target is 90% to 100% inclusive, preferably, 95% to 99.9% inclusive. With the use of the metal oxide target with high fill rate, a dense oxide semiconductor layer is formed.

The substrate is held in a treatment chamber kept under reduced pressure, and the substrate is heated to room temperature or a temperature of lower than 400° C. Then, a sputtering gas from which hydrogen and moisture are removed is introduced into the treatment chamber from which remaining moisture is being removed, and the oxide semiconductor layer 393 is formed over the substrate 394 with the use of a metal oxide as a target. To remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the deposition chamber which is evacuated with the cryopump, a hydrogen atom, a compound containing a hydrogen atom, such as water ($H_2O$), (more preferably, also a compound containing a carbon atom), and the like are evacuated, whereby the concentration of an impurity in the oxide semiconductor film formed in the deposition chamber can be reduced. By performing deposition by sputtering while removing moisture remaining in the treatment chamber using a cryopump, a substrate temperature when the oxide semiconductor layer 393 is formed can be higher than or equal to room temperature and lower than 400° C.

An example of the deposition condition is as follows: the distance between the substrate and the target is 100 mm, the pressure is 0.6 Pa, the electric power of the DC power source is 0.5 kW, and the atmosphere is an oxygen atmosphere (the flow rate of oxygen is 100%). It is preferable that a pulsed DC power source be used because powder substances generated in film formation can be reduced and the film thickness can be uniform. The oxide semiconductor layer preferably has a thickness of 5 nm to 30 nm inclusive. Note that the appropriate thickness depends on an oxide semiconductor material used and the thickness may be selected in accordance with a material.

Examples of a sputtering method include an RF sputtering method in which a high-frequency power source is used as a sputtering power source, a DC sputtering method in which a DC power source is used, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or plural kinds of materials can be discharged for film formation at the same time in the same chamber.

In addition, there are a sputtering apparatus provided with a magnet system inside the chamber, which is for a magnetron sputtering method, and a sputtering apparatus which is used for an ECR sputtering method in which plasma produced with the use of microwaves is used without using glow discharge.

Furthermore, as a deposition method using a sputtering method, there are also a reactive sputtering method in which a target substance and a sputtering gas component are chemically reacted with each other during deposition to form a thin compound film thereof, and a bias sputtering method in which voltage is also applied to a substrate during deposition.

Then, in a second photolithography process, the oxide semiconductor layer 393 is processed into an island-shaped oxide semiconductor layer 399 (see FIG. 10B). A resist mask for forming the island-shaped oxide semiconductor layer 399 may be formed with an inkjet method. When the resist mask is formed with an inkjet method, a photomask is not used; therefore, manufacturing costs can be reduced.

In the case of forming a contact hole in the gate insulating layer 397, the step may be performed in forming the oxide semiconductor layer 399.

Note that the etching of the oxide semiconductor layer 393 may be dry etching, wet etching, or both dry etching and wet etching.

As the etching gas for dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the layer into a desired shape, the etching condition (the amount of electric power applied to a coil-shaped electrode, the amount of electric power applied to an electrode on the substrate side, the temperature of the electrode on the substrate side, or the like) is adjusted as appropriate.

As an etchant used for wet etching, a mixed solution of phosphoric acid, acetic acid, and nitric acid, or the like can be used. Alternatively, ITO07N (produced by KANTO CHEMICAL CO., INC.) may be used.

The etchant used in the wet etching is removed by cleaning together with the material which is etched off. The waste liquid including the etchant and the material etched off may be purified and the material may be reused. When a material such as indium included in the oxide semiconductor layer is collected from the waste liquid after the etching and reused, the resources can be efficiently used and the cost can be reduced.

The etching conditions (such as an etchant, etching time, and temperature) are appropriately adjusted depending on the material so that the oxide semiconductor layer can be etched to have a desired shape.

Note that it is preferable to perform reverse sputtering before formation of a conductive layer in the following step so that a resist residue and the like attached to surfaces of the oxide semiconductor layer 399 and the gate insulating layer 397 can be removed.

Next, a conductive layer is formed over the gate insulating layer 397 and the oxide semiconductor layer 399. The conductive layer may be formed with a sputtering method or a vacuum evaporation method. As the material of the conductive layer, there are an element selected from Al, Cr, Cu, Ta, Ti, Mo, or W; an alloy layer containing a combination of any of these elements; and the like. Further, one or more materials selected from manganese, magnesium, zirconium, beryllium, and thorium may be used. The metal conductive layer may have a single-layer structure or a layered structure of two or more layers. For example, a single-layer structure of an aluminum film including silicon, a two-layer structure in which a titanium layer is stacked over an aluminum layer, a three-layer structure in which a Ti layer, an aluminum layer, and a Ti layer are stacked in the order presented, and the like can be given. Alternatively, a layer, an alloy layer, or a nitride layer of a combination of Al and one or plurality of elements selected from the followings may be used: titanium (Ti), tantalum (Ta), tungsten (W), molybdenum (Mo), chromium (Cr), neodymium (Nd), and scandium (Sc).

A third photolithography process is performed. A resist mask is formed over the conductive layer and selective etching is performed, so that the source electrode layer 395*a* and the drain electrode layer 395*b* are formed. Then, the resist mask is removed (see FIG. 10C).

Ultraviolet, a KrF laser beam, or an ArF laser beam is used for light exposure for forming the resist mask in the third photolithography process. A channel length L of the thin film transistor to be formed later depends on a width of an interval between a bottom portion of the source electrode layer and a bottom portion of the drain electrode layer which are adjacent to each other over the oxide semiconductor layer 399. Note that when light exposure is performed in the case where the channel length L is shorter than 25 nm, extreme ultraviolet with extremely short wavelengths of several nanometers to several tens of nanometers is used for light exposure for forming the resist mask in the third photolithography process. Light exposure with extreme ultraviolet leads to a high resolution and a large focal depth. Accordingly, the channel length L of the thin film transistor to be formed later can be set to 10 nm to 1000 nm inclusive. Thus, the operation speed of a circuit can be increased, and further, an off-state current is significantly small, so that low power consumption can be achieved.

Note that materials and etching conditions are adjusted as appropriate so that the oxide semiconductor layer 399 is not removed when the conductive layer is etched.

In this embodiment, a Ti layer is used as the metal conductive film, an In—Ga—Zn—O-based oxide semiconductor is used as the oxide semiconductor layer 399, and an ammonia hydrogen peroxide solution (a mixture of ammonia, water, and a hydrogen peroxide solution) is used as an etchant.

Note that in the third photolithography process, only part of the oxide semiconductor layer 399 is etched, whereby an oxide semiconductor layer having a groove (a depressed portion) might be formed. The resist mask used for forming the source electrode layer 395*a* and the drain electrode layer 395b may be formed with an inkjet method. When the resist mask is formed with an inkjet method, a photomask is not used; therefore, manufacturing costs can be reduced.

To reduce the number of photomasks and steps in a photolithography step, etching may be performed with the use of a resist mask formed using a multi-tone mask which is a light-exposure mask through which light is transmitted so as to have a plurality of intensities. Since a resist mask formed using a multi-tone mask has a plurality of thicknesses and can be further changed in shape by performing etching, the resist mask can be used in a plurality of etching steps to provide different patterns. Thus, a resist mask corresponding to at least two kinds of different patterns can be formed by using a multi-tone mask. Accordingly, the number of light-exposure masks can be reduced and the number of corresponding photolithography steps can be also reduced, whereby simplification of a process can be realized.

With plasma treatment with a gas such as $N_2O$, $N_2$, or Ar, water adsorbed to a surface of an exposed portion of the oxide semiconductor layer may be removed. Alternatively, plasma treatment may be performed using a mixed gas of oxygen and argon.

In the case of performing the plasma treatment, the oxide insulating layer 396 is formed without exposure to the air as an oxide insulating layer which serves as a protective insulating layer and is in contact with part of the oxide semiconductor layer 396 (see FIG. 10D). In this embodiment, the oxide insulating layer 396 is formed in contact with the oxide semiconductor layer 399 in a region where the oxide semiconductor layer 399 does not overlap with the source electrode layer 395a and the drain electrode layer 395b.

In this embodiment, the substrate 394 over which layers up to the island-shaped oxide semiconductor layer 399, the source electrode layer 395a, the drain electrode layer 395b have been formed is heated to room temperature or a temperature of lower than 100° C. and a sputtering gas from which hydrogen and moisture are removed and which contains high-purity oxygen is introduced, and a silicon target is used, whereby a silicon oxide layer having a defect is formed as the oxide insulating layer 396.

For example, the silicon oxide layer is formed with a pulsed DC sputtering method in which the purity of a sputtering gas is 6N, a boron-doped silicon target (the resistivity is 0.01 Ω·cm) is used, the distance between the substrate and the target (T-S distance) is 89 mm, the pressure is 0.4 Pa, the electric power of the DC power source is 6 kW, and the atmosphere is an oxygen atmosphere (the oxygen flow rate is 100%). The thickness of the silicon oxide layer is 300 nm. Note that instead of a silicon target, quartz (preferably, synthetic quartz) can be used as a target used when the silicon oxide layer is formed. As a sputtering gas, oxygen or a mixed gas of oxygen and argon is used.

In that case, the oxide insulating layer 396 is preferably formed while removing moisture remaining in the treatment chamber. This is for preventing hydrogen, a hydroxyl group, and moisture from being contained in the oxide semiconductor layer 399 and the oxide insulating layer 396.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the deposition chamber which is evacuated with the cryopump, a hydrogen atom, a compound containing a hydrogen atom, such as water ($H_2O$), and the like are evacuated, whereby the concentration of an impurity in the oxide insulating layer 396 formed in the deposition chamber can be reduced.

Note that as the oxide insulating layer 396, a silicon oxynitride layer, an aluminum oxide layer, an aluminum oxynitride layer, or the like may be used instead of the silicon oxide layer.

Further, heat treatment may be performed at 100° C. to 400° C. while the oxide insulating layer 396 and the oxide semiconductor layer 399 are in contact with each other. Since the oxide insulating layer 396 in this embodiment has a lot of defects, with this heat treatment, an impurity such as hydrogen, moisture, a hydroxyl group, or hydride contained in the oxide semiconductor layer 399 can be diffused to the oxide insulating layer 396 so that the impurity in the oxide semiconductor layer 399 can be further reduced.

Through the above steps, the thin film transistor 390 including the oxide semiconductor layer 392 in which the concentration of hydrogen, moisture, hydride, or hydroxide is reduced can be formed (see FIG. 10E).

Moisture remaining in a reaction atmosphere is removed as described above in forming the oxide semiconductor layer, whereby the concentration of hydrogen and hydride in the oxide semiconductor layer can be reduced. Accordingly, the oxide semiconductor layer can be stable.

A protective insulating layer may be provided over the oxide insulating layer. In this embodiment, the protective insulating layer 398 is formed over the oxide insulating layer 396. As the protective insulating layer 398, a silicon nitride layer, a silicon nitride oxide layer, an aluminum nitride layer, an aluminum nitride oxide layer, or the like is used.

The substrate 394 over which layers up to the oxide insulating layer 396 have been formed is heated to a temperature of 100° C. to 400° C., a sputtering gas from which hydrogen and moisture are removed and which contains high-purity nitrogen is introduced, and a silicon semiconductor target is used, whereby a silicon nitride layer is formed as the protective insulating layer 398. In this case, the protective insulating layer 398 is preferably formed while removing moisture remaining in a treatment chamber, similarly to the oxide insulating layer 396.

In the case where the protective insulating layer 398 is formed, the substrate 394 is heated to 100° C. to 400° C. in forming the protective insulating layer 398, whereby hydrogen or water contained in the oxide semiconductor layer can be diffused to the oxide insulating layer. In that case, heat treatment is not necessarily performed after formation of the oxide insulating layer 396.

In the case where the silicon oxide layer is formed as the oxide insulating layer 396 and the silicon nitride layer is stacked thereover as the protective insulating layer 398, the silicon oxide layer and the silicon nitride layer can be formed with the use of a common silicon target in the same treatment chamber. After a sputtering gas containing oxygen is introduced first, a silicon oxide layer is formed using a silicon target mounted in the treatment chamber, and then, the sputtering gas is switched to a sputtering gas containing nitrogen and the same silicon target is used to form a silicon nitride layer. Since the silicon oxide layer and the silicon nitride layer can be formed successively without being exposed to the air, impurities such as hydrogen and moisture can be prevented from adsorbing onto a surface of the silicon oxide layer. In that case, after the silicon oxide layer is formed as the oxide insulating layer 396 and the silicon nitride layer is stacked thereover as the protective insulating layer 398, heat treatment (at a temperature of 100° C. to 400°

C.) for diffusing hydrogen or moisture contained in the oxide semiconductor layer to the oxide insulating layer is preferably performed.

After the protective insulating layer is formed, heat treatment may be further performed at 100° C. to 200° C. inclusive for one hour to 30 hours inclusive in the air. This heat treatment may be performed at a fixed heating temperature. Alternatively, the following change in the heating temperature may be conducted plural times repeatedly: the heating temperature is increased from a room temperature to a temperature of 100° C. to 200° C. inclusive and then decreased to a room temperature. Further, this heat treatment may be performed under a reduced pressure before formation of the oxide insulating layer. Under a reduced pressure, the heating time can be shortened. With this heat treatment, the thin film transistor can be normally off. Therefore, reliability of the thin film transistor can be improved.

Moisture remaining in a reaction atmosphere is removed in forming the oxide semiconductor layer including a channel formation region over the gate insulating layer, whereby the concentration of hydrogen and hydride in the oxide semiconductor layer can be reduced.

The above steps can be used for manufacture of backplanes (substrates over which thin film transistors are formed) of liquid crystal display panels, electroluminescent display panels, display devices using electronic ink, or the like. Since the above steps can be performed at a temperature of 400° C. or lower, they can also be applied to manufacturing steps where a glass substrate with a thickness of 1 mm or smaller and a side of longer than 1 m is used. In addition, since all of the above steps can be performed at a treatment temperature of 400° C. or lower, display panels can be manufactured without consuming much energy.

The logic circuits in Embodiments 1 and 2 including the above-described thin film transistors can have stable electric characteristics and high reliability.

This embodiment can be implemented in appropriate combination with the other embodiments.

Embodiment 7

In this embodiment, an example of thin film transistors included in the logic circuit in Embodiment 1 or Embodiment 2 is described.

One embodiment of a thin film transistor and a manufacturing method of the thin film transistor of this embodiment is described with reference to FIGS. 11A to 11E.

Figure 11A:
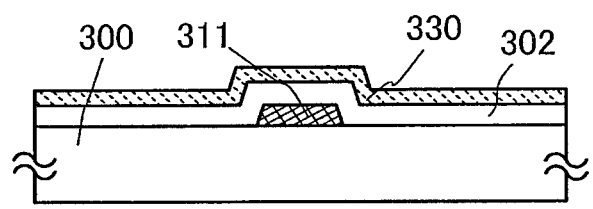
FIGS. 11A to 11E are cross-sectional views illustrating an example of a method for manufacturing a thin film transistor.
Figure 11B:
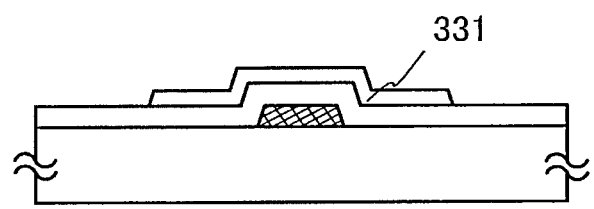
Figure 11C:
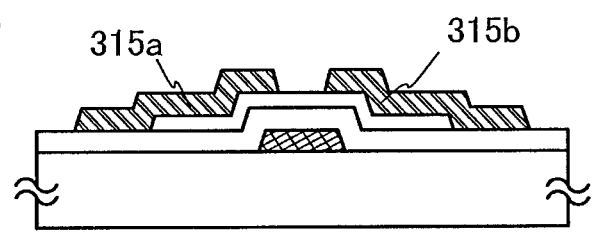
Figure 11D:
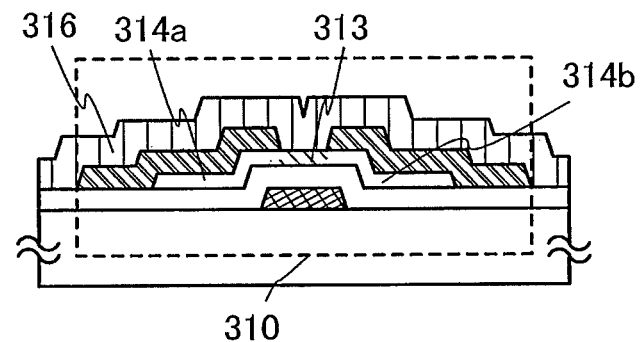
Figure 11E:
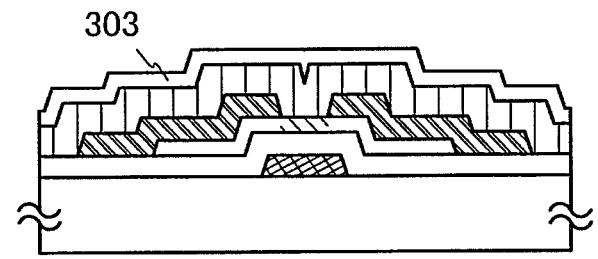

FIGS. 11A to 11E illustrate an example of a cross-sectional structure of a thin film transistor. A thin film transistor 310 illustrated in FIG. 11D is one of bottom gate thin film transistors and is also referred to as an inverted staggered thin film transistor.

Although description is given using a single-gate thin film transistor as the thin film transistor 310, a multi-gate thin film transistor including a plurality of channel formation regions may be formed as needed.

A process of manufacturing the thin film transistor 310 over a substrate 300 is described below with reference to FIGS. 11A to 11E.

First, after a conductive layer is formed over the substrate 300 having an insulating surface, a gate electrode layer 311 is formed in a first photolithography process. Note that a resist mask may be formed with an inkjet method. When the resist mask is formed with an inkjet method, a photomask is not used; therefore, manufacturing costs can be reduced.

There is no particular limitation on a substrate that can be used as the substrate 300 having an insulating surface as long as it has at least heat resistance enough to withstand heat treatment performed later. A glass substrate formed using barium borosilicate glass, aluminoborosilicate glass, or the like can be used.

When the temperature of the heat treatment performed later is high, a substrate having a strain point of 730° C. or higher is preferably used as the glass substrate. As a material of the glass substrate, a glass material such as aluminosilicate glass, aluminoborosilicate glass, or barium borosilicate glass is used, for example. Note that by containing a larger amount of barium oxide (BaO) than boron oxide ($B_2O_3$), a glass substrate is heat-resistant and of more practical use. Therefore, a glass substrate containing a larger amount of BaO than $B_2O_3$ is preferably used.

Note that, instead of the glass substrate described above, a substrate formed using an insulator such as a ceramic substrate, a quartz substrate, or a sapphire substrate may be used as the substrate. Alternatively, a crystallized glass substrate or the like may be used.

An insulating layer serving as a base layer may be provided between the substrate 300 and the gate electrode layer 311. The base layer has a function of preventing diffusion of an impurity element from the substrate 300, and can be formed with a single-layer structure or a layered structure using any of a silicon nitride layer, a silicon oxide layer, a silicon nitride oxide layer, and a silicon oxynitride layer.

Further, the gate electrode layer 311 can be formed with a single-layer structure or a layered structure using any of metal materials such as molybdenum, titanium, chromium, tantalum, tungsten, aluminum, copper, neodymium, and scandium, and an alloy material including any of these materials as a main component.

As a two-layer structure of the gate electrode layer 311, for example, a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, a two-layer structure in which a titanium nitride layer and a molybdenum layer are stacked, or a two-layer structure in which a tungsten nitride layer and a tungsten layer are stacked is preferable. As a three-layer structure, a stack of a tungsten layer or a tungsten nitride layer, an alloy layer of aluminum and silicon or an alloy layer of aluminum and titanium, and a titanium nitride layer or a titanium layer is preferable.

Then, the gate insulating layer 302 is formed over the gate electrode layer 311.

The gate insulating layer 302 can be formed with a single-layer structure or a layered structure using any of a silicon oxide layer, a silicon nitride layer, a silicon oxynitride layer, a silicon nitride oxide layer, and an aluminum oxide layer with a plasma CVD method, a sputtering method, or the like. For example, a silicon oxynitride layer may be formed with a plasma CVD method with $SiH_4$, oxygen, and nitrogen for a deposition gas. For example, the thickness of the gate insulating layer 302 is 100 nm to 500 nm inclusive, and in the case where the gate insulating layer 302 has a layered structure, a second gate insulating layer with a thickness of 5 nm to 300 nm inclusive is stacked over a first gate insulating layer with a thickness of 50 nm to 200 nm inclusive, for example.

In this embodiment, a silicon oxynitride layer having a thickness of smaller than or equal to 100 nm is formed as the gate insulating layer 302 with a plasma CVD method.

Then, an oxide semiconductor layer 330 is formed to a thickness of 2 nm to 200 nm inclusive over the gate insulating layer 302.

Note that before the oxide semiconductor layer 330 is formed with a sputtering method, dust attached to a surface of the gate insulating layer 302 is preferably removed with reverse sputtering in which an argon gas is introduced and plasma is generated. Note that instead of an argon atmosphere, a nitrogen atmosphere, a helium atmosphere, an oxygen atmosphere, or the like may be used.

The oxide semiconductor layer 330 is formed using an In—Ga—Zn—O-based oxide semiconductor layer, an In—Sn—Zn—O-based oxide semiconductor layer, an In—Al—Zn—O-based oxide semiconductor layer, a Sn—Ga—Zn—O-based oxide semiconductor layer, an Al—Ga—Zn—O-based oxide semiconductor layer, a Sn—Al—Zn—O-based oxide semiconductor layer, an In—Zn—O-based oxide semiconductor layer, a Sn—Zn—O-based oxide semiconductor layer, an Al—Zn—O-based oxide semiconductor layer, an In—O-based oxide semiconductor layer, a Sn—O-based oxide semiconductor layer, or a Zn—O-based oxide semiconductor layer. In this embodiment, the oxide semiconductor layer 330 is formed with a sputtering method with the use of an In—Ga—Zn—O-based oxide semiconductor target. FIG. 11A corresponds to a cross-sectional view at this stage. Further, the oxide semiconductor layer 330 can be formed with a sputtering method in a rare gas (typically, argon) atmosphere, an oxygen atmosphere, or a mixed atmosphere containing a rare gas (typically, argon) and oxygen. In the case of employing a sputtering method, a target containing $SiO_2$ at 2 wt % to 10 wt % inclusive may be used for film formation.

As a target for forming the oxide semiconductor layer 330 with a sputtering method, a metal oxide target containing zinc oxide as its main component can be used. As another example of a metal oxide target, a metal oxide target containing In, Ga, and Zn (in a composition ratio, $In_2O_3$:$Ga_2O_3$:ZnO=1:1:1 [mol], In:Ga:Zn=1:1:0.5 [atom]) can be used. Alternatively, a metal oxide target containing In, Ga, and Zn (the composition ratio of In:Ga:Zn=1:1:1 or 1:1:2 [atom]) may be used. The fill rate of the metal oxide target is 90% to 100% inclusive, preferably, 95% to 99.9% inclusive. With the use of the metal oxide target with high fill rate, a dense oxide semiconductor layer is formed.

It is preferable to use a high-purity gas from which an impurity such as hydrogen, water, a hydroxyl group, or hydride is removed to a concentration expressed by a level of ppm or ppb, as a sputtering gas used when the oxide semiconductor layer 330 is formed.

The substrate is held in a treatment chamber kept under reduced pressure, and the substrate temperature is set to 100° C. to 600° C., preferably 200° C. to 400° C. Film formation is performed while the substrate is heated, whereby the concentration of an impurity contained in the oxide semiconductor layer formed can be reduced. Further, damages due to sputtering can be reduced. Then, a sputtering gas from which hydrogen and moisture are removed is introduced into the treatment chamber from which remaining moisture is being removed, and the oxide semiconductor layer 330 is formed over the substrate 300 with the use of a metal oxide as a target. To remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the deposition chamber which is evacuated with the cryopump, a hydrogen atom, a compound containing a hydrogen atom, such as water ($H_2O$), (more preferably, also a compound containing a carbon atom), and the like are evacuated, whereby the concentration of an impurity in the oxide semiconductor layer formed in the deposition chamber can be reduced.

An example of the deposition condition is as follows: the distance between the substrate and the target is 100 mm, the pressure is 0.6 Pa, the electric power of the DC power source is 0.5 kW, and the atmosphere is an oxygen atmosphere (the flow rate of oxygen is 100%). It is preferable that a pulsed DC power source be used because powder substances generated in film formation can be reduced and the film thickness can be uniform. The oxide semiconductor layer preferably has a thickness of 5 nm to 30 nm inclusive. Note that the appropriate thickness depends on an oxide semiconductor material used and the thickness may be selected in accordance with a material.

Then, in a second photolithography process, the oxide semiconductor layer 330 is processed into an island-shaped oxide semiconductor layer. A resist mask for forming the island-shaped oxide semiconductor layer may be formed with an inkjet method. When the resist mask is formed with an inkjet method, a photomask is not used; therefore, manufacturing costs can be reduced.

Next, the oxide semiconductor layer is subjected to first heat treatment. With the first heat treatment, dehydration or dehydrogenation of the oxide semiconductor layer can be conducted. The temperature of the first heat treatment is higher than or equal to 400° C. and lower than or equal to 750° C., preferably higher than or equal to 400° C. and lower than the strain point of the substrate. Here, the substrate is introduced into an electric furnace which is one of heat treatment apparatuses, heat treatment is performed on the oxide semiconductor layer in a nitrogen atmosphere at 450° C. for one hour, and then, the oxide semiconductor layer is not exposed to the air so that entry of water and hydrogen into the oxide semiconductor layer is prevented; thus, an oxide semiconductor layer 331 is obtained (see FIG. 11B).

The apparatus for the heat treatment is not limited to the electric furnace and may be the one provided with a device for heating an object to be processed, using heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed due to heat treatment, such as nitrogen or a rare gas such as argon is used.

For example, as the first heat treatment, GRTA may be performed as follows. The substrate is transferred and put in an inert gas which has been heated to a high temperature of 650° C. to 700° C., heated for several minutes, and transferred and taken out of the inert gas which has been heated to a high temperature. GRTA enables high-temperature heat treatment in a short time.

Note that in the first heat treatment, it is preferable that water, hydrogen, and the like be not included in nitrogen or a rare gas such as helium, neon, or argon. Alternatively, it is preferable that nitrogen or a rare gas such as helium, neon, or argon introduced into an apparatus for the heat treatment have a purity of 6N (99.9999%) or more, preferably, 7N (99.99999%) or more (that is, an impurity concentration is set to 1 ppm or lower, preferably, 0.1 ppm or lower).

Further, the oxide semiconductor layer might be crystallized to be a microcrystalline layer or a polycrystalline layer depending on a condition of the first heat treatment or a material of the oxide semiconductor layer. For example, the oxide semiconductor layer may be crystallized to become a microcrystalline oxide semiconductor layer having a degree of crystallization of 90% or more, or 80% or more. Further, depending on the condition of the first heat treatment and the material of the oxide semiconductor layer, the oxide semiconductor layer may become an amorphous oxide semiconductor layer containing no crystalline component. The oxide semiconductor layer might become an oxide semiconductor layer in which a microcrystalline portion (with a grain diameter greater than or equal to 1 nm and less than or equal to 20 nm, typically greater than or equal to 2 nm and less than or equal to 4 nm) is mixed into an amorphous oxide semiconductor.

Alternatively, the first heat treatment of the oxide semiconductor layer may be performed on the oxide semiconductor layer 330 which has not yet been processed into the island-shaped oxide semiconductor layer. In that case, after the first heat treatment, the substrate is taken out of the heating apparatus and a photolithography process is performed.

The heat treatment having an effect of dehydration or dehydrogenation on the oxide semiconductor layer may be performed at any of the following timings: after the oxide semiconductor layer is formed; after a source electrode layer and a drain electrode layer are formed over the oxide semiconductor layer; and after a protective insulating layer is formed over the source electrode layer and the drain electrode layer.

In the case of forming a contact hole in the gate insulating layer 302, the step may be performed either before or after dehydration or dehydrogenation of the oxide semiconductor layer.

Note that the etching of the oxide semiconductor film is not limited to wet etching and may be dry etching.

The etching conditions (such as an etchant, etching time, and temperature) are appropriately adjusted depending on the material so that the material can be etched into a desired shape.

Next, a conductive layer is formed over the gate insulating layer 302 and the oxide semiconductor layer 331. The conductive layer may be formed with a sputtering method or a vacuum evaporation method. As the material of the conductive layer, there are an element selected from Al, Cr, Cu, Ta, Ti, Mo, or W; an alloy layer containing a combination of any of these elements; and the like. Further, one or more materials selected from manganese, magnesium, zirconium, beryllium, and thorium may be used. The conductive film may have a single-layer structure or a layered structure of two or more layers. For example, a single-layer structure of an aluminum layer including silicon, a two-layer structure in which a titanium layer is stacked over an aluminum layer, a three-layer structure in which a Ti layer, an aluminum layer, and a Ti layer are stacked in the order presented, and the like can be given. Alternatively, a layer, an alloy layer, or a nitride layer of a combination of Al and one or plurality of elements selected from the followings may be used: titanium (Ti), tantalum (Ta), tungsten (W), molybdenum (Mo), chromium (Cr), neodymium (Nd), and scandium (Sc).

If heat treatment is performed after formation of the conductive layer, it is preferable that the conductive layer have heat resistance enough to withstand the heat treatment.

A third photolithography process is performed. A resist mask is formed over the conductive layer and selective etching is performed, so that a source electrode layer 315a and a drain electrode layer 315b are formed. Then, the resist mask is removed (see FIG. 11C).

Ultraviolet, a KrF laser beam, or an ArF laser beam is used for light exposure for forming the resist mask in the third photolithography process. A channel length L of the thin film transistor to be formed later depends on a width of an interval between a bottom portion of the source electrode layer and a bottom portion of the drain electrode layer which are adjacent to each other over the oxide semiconductor layer 331. Note that when light exposure is performed in the case where the channel length L is shorter than 25 nm, extreme ultraviolet with extremely short wavelengths of several nanometers to several tens of nanometers is used for light exposure for forming the resist mask in the third photolithography process. Light exposure with extreme ultraviolet leads to a high resolution and a large focal depth. Accordingly, the channel length L of the thin film transistor to be formed later can be set to 10 nm to 1000 nm inclusive. Thus, the operation speed of a circuit can be increased, and further, an off-state current is significantly small, so that low power consumption can be achieved.

Note that materials and etching conditions are adjusted as appropriate so that the oxide semiconductor layer 331 is not removed when the conductive layer is etched.

In this embodiment, a Ti layer is used as the conductive layer, an In—Ga—Zn—O-based oxide semiconductor is used as the oxide semiconductor layer 331, and an ammonia hydrogen peroxide solution (a mixture of ammonia, water, and a hydrogen peroxide solution) is used as an etchant.

Note that in the third photolithography process, only part of the oxide semiconductor layer 331 is etched, whereby an oxide semiconductor layer having a groove (a depressed portion) might be formed. The resist mask used for forming the source electrode layer 315a and the drain electrode layer 315b may be formed with an inkjet method. When the resist mask is formed with an inkjet method, a photomask is not used; therefore, manufacturing costs can be reduced.

Further, an oxide conductive layer may be formed between the oxide semiconductor layer and the source and drain electrode layers. The oxide conductive layer and a metal layer for forming the source and drain electrode layers can be formed successively. The oxide conductive layer can function as a source region and a drain region.

When the oxide conductive layer is provided as the source region and the drain region between the oxide semiconductor layer and the source and drain electrode layers, the source region and the drain region can have lower resistance and the transistor can operate at high speed.

To reduce the number of photomasks and steps in a photolithography step, etching may be performed with the use of a resist mask formed using a multi-tone mask which is a light-exposure mask through which light is transmitted so as to have a plurality of intensities. Since a resist mask formed using a multi-tone mask has a plurality of thicknesses and can be further changed in shape by performing etching, the resist mask can be used in a plurality of etching steps to provide different patterns. Thus, a resist mask corresponding to at least two kinds of different patterns can be formed by using a single multi-tone mask. Accordingly, the number of light-exposure masks can be reduced and the number of corresponding photolithography steps can be also reduced, whereby simplification of a process can be realized.

Next, plasma treatment with a gas such as $N_2O$, $N_2$, or Ar is performed. With this plasma treatment, water adsorbed to a surface of an exposed portion of the oxide semiconductor layer is removed. Alternatively, plasma treatment may be performed using a mixed gas of oxygen and argon.

After the plasma treatment is performed, an oxide insulating layer 316 which serves as a protective insulating layer and is in contact with part of the oxide semiconductor layer is formed without exposure to the air.

The oxide insulating layer 316 can be formed to a thickness of longer than or equal to 1 nm with a sputtering method or the like as appropriate, which is a method with which an impurity such as water or hydrogen does not enter the oxide insulating layer 316. When hydrogen is contained in the oxide insulating layer 316, entry of the hydrogen to the oxide semiconductor layer or extraction of oxygen in the oxide semiconductor layer by the hydrogen is caused, whereby a backchannel of the oxide semiconductor layer comes to be n-type (to have a lower resistance) and thus a parasitic channel might be formed. Therefore, it is important that a formation method in which hydrogen is not used is employed so that the oxide insulating layer 316 is formed containing as little hydrogen as possible.

In this embodiment, a silicon oxide layer is formed to a thickness of 200 nm as the oxide insulating layer 316 with a sputtering method. The substrate temperature in film formation may be higher than or equal to room temperature and lower than or equal to 300° C. and in this embodiment, is 100° C. The silicon oxide layer can be formed with a sputtering method in a rare gas (typically, argon) atmosphere, an oxygen atmosphere, or a mixed atmosphere of a rare gas (typically, argon) and oxygen. Further, a silicon oxide target or a silicon target can be used as a target. For example, the silicon oxide layer can be formed using a silicon target with a sputtering method in an atmosphere containing oxygen and nitrogen. The oxide insulating layer 316 which is formed in contact with the oxide semiconductor layer in a region which is in an oxygen-deficient state and thus is n-type, that is, has a lower resistance is formed using an inorganic insulating layer that does not contain impurities such as moisture, a hydrogen ion, and OH⁻ and blocks entry of such impurities from the outside, typically, a silicon oxide layer, a silicon oxynitride layer, an aluminum oxide layer, or an aluminum oxynitride layer.

In that case, the oxide insulating layer 316 is preferably formed while removing moisture remaining in the treatment chamber. This is for preventing hydrogen, a hydroxyl group, and moisture from being contained in the oxide semiconductor layer 331 and the oxide insulating layer 316.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the deposition chamber which is evacuated with the cryopump, a hydrogen atom, a compound containing a hydrogen atom, such as water ($H_2O$), and the like are evacuated, whereby the concentration of an impurity in the oxide insulating layer 316 formed in the deposition chamber can be reduced.

It is preferable to use a high-purity gas from which an impurity such as hydrogen, water, a hydroxyl group, or hydride is removed to a concentration expressed by a level of ppm or ppb, as a sputtering gas used when the oxide insulating layer 316 is formed.

Next, second heat treatment (preferably 200° C. to 400° C. inclusive, for example, from 250° C. to 350° C. inclusive) is performed in an inert gas atmosphere or an oxygen gas atmosphere. For example, the second heat treatment is performed in a nitrogen atmosphere at 250° C. for one hour. With the second heat treatment, heat is applied while part of the oxide semiconductor layer (a channel formation region) is in contact with the oxide insulating layer 316.

Through the above steps, the oxide semiconductor layer has a lower resistance, that is, comes to be n-type when heat treatment for dehydration or dehydrogenation is performed on the formed oxide semiconductor layer. Then, the oxide insulating layer is formed in contact with the oxide semiconductor layer. Accordingly, part of the oxide semiconductor layer is selectively in an oxygen excess state. As a result, the channel formation region 313 overlapping with the gate electrode layer 311 becomes i-type. At that time, a high-resistance source region 314a which has higher carrier concentration than at least the channel formation region 313 and overlaps with the source electrode layer 315a and a high-resistance drain region 314b which has higher carrier concentration than at least the channel formation region 313 and overlaps with the drain electrode layer 315b are formed in a self-aligned manner. Through the above steps, the thin film transistor 310 is formed (see FIG. 11D).

Further, heat treatment may be performed at 100° C. to 200° C. inclusive for one hour to 30 hours inclusive in the air. In this embodiment, heat treatment is performed at 150° C. for 10 hours. This heat treatment may be performed at a fixed heating temperature. Alternatively, the following change in the heating temperature may be conducted plural times repeatedly: the heating temperature is increased from a room temperature to a temperature of 100° C. to 200° C. inclusive and then decreased to a room temperature. Further, this heat treatment may be performed under a reduced pressure before formation of the oxide insulating layer. Under a reduced pressure, the heating time can be shortened. With this heat treatment, hydrogen is introduced from the oxide semiconductor layer to the oxide insulating layer; thus, the thin film transistor can be normally off. Therefore, reliability of the thin film transistor can be improved. When a silicon oxide layer having a lot of defects is used as the oxide insulating layer, with this heat treatment, an impurity such as hydrogen, moisture, a hydroxyl group, or hydride contained in the oxide semiconductor layer can be diffused to the oxide insulating layer so that the impurity in the oxide semiconductor layer can be further reduced.

Note that by forming the high-resistance drain region 314b (and the high-resistance source region 314a) in the oxide semiconductor layer overlapping with the drain electrode layer 315b (and the source electrode layer 315a), reliability of the thin film transistor can be improved. Specifically, by forming the high-resistance drain region 314b, the structure can be obtained in which conductivities of the drain electrode layer 315b, the high-resistance drain region 314b, and the channel formation region 313 vary in a stepwise fashion. Therefore, in the case where the thin film transistor operates with the drain electrode layer 315b connected to a wiring for supplying a high power supply potential $V_{DD}$, the high-resistance drain region serves as a buffer and an electric field is not applied locally even if a high voltage is applied between the gate electrode layer 311 and the drain electrode layer 315b; thus, the withstand voltage of the thin film transistor can be increased.

Further, the high-resistance source region or the high-resistance drain region in the oxide semiconductor layer is formed in the entire thickness direction in the case where the thickness of the oxide semiconductor layer is 15 nm or smaller. In the case where the thickness of the oxide semiconductor layer is 30 nm or larger and 50 nm or smaller, in part of the oxide semiconductor layer, that is, in a region in the oxide semiconductor layer, which is in contact with the source electrode layer or the drain electrode layer, and the vicinity thereof, resistance is reduced and the high-resistance source region or the high-resistance drain region is formed, while a region in the oxide semiconductor layer, which is close to the gate insulating film, can be made to be i-type.

A protective insulating layer may be additionally formed over the oxide insulating layer 316. For example, a silicon nitride layer is formed with an RF sputtering method. An RF sputtering method is preferable as a formation method of the protective insulating layer because of high productivity. The protective insulating layer is formed using an inorganic insulating layer which does not contain impurities such as moisture, a hydrogen ion, and OH⁻ and blocks entry of these from the outside: for example, a silicon nitride layer, an aluminum nitride layer, a silicon nitride oxide layer, an aluminum nitride oxide layer, or the like is used. In this embodiment, as the protective insulating layer, a protective insulating layer 303 is formed using a silicon nitride layer (see FIG. 11E).

In this embodiment, the substrate 300 over which layers up to the oxide insulating layer 316 have been formed is heated to a temperature of 100° C. to 400° C., a sputtering gas from which hydrogen and moisture are removed and which contains high-purity nitrogen is introduced, and a silicon target is used, whereby a silicon nitride layer is formed as the protective insulating layer 303. In this case, the protective insulating layer 303 is preferably formed while removing moisture remaining in a treatment chamber, similarly to the oxide insulating layer 316.

Although not illustrated, a planarization insulating layer for planarization may be provided over the protective insulating layer 303.

The logic circuits in Embodiments 1 and 2 including the above-described thin film transistors can have stable electric characteristics and high reliability.

This embodiment can be implemented in appropriate combination with the other embodiments.

Embodiment 8

In this embodiment, an example of thin film transistors included in the logic circuit in Embodiment 1 or Embodiment 2 is described.

One embodiment of a thin film transistor and a manufacturing method of the thin film transistor of this embodiment is described with reference to FIGS. 12A to 12D.

Figure 12A:
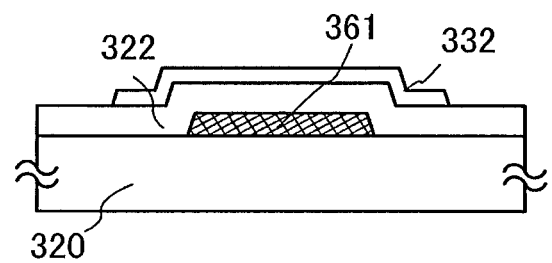
FIGS. 12A to 12D are cross-sectional views illustrating an example of a method for manufacturing a thin film transistor.
Figure 12B:
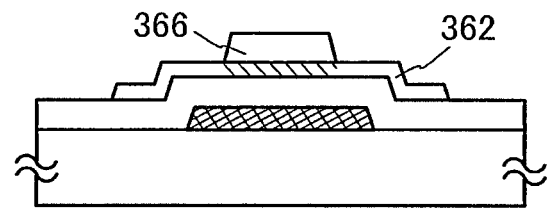
Figure 12C:
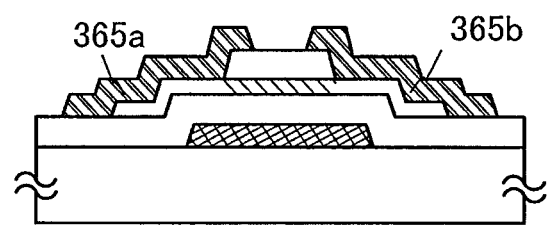
Figure 12D:
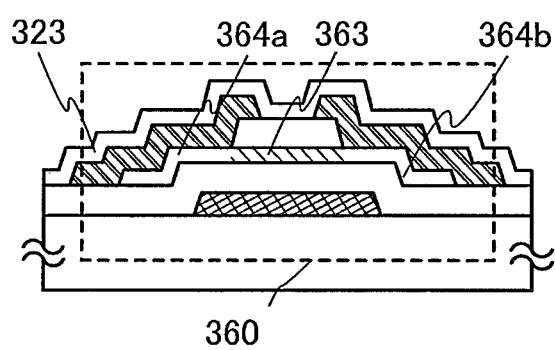

FIG. 12D illustrates an example of a cross-sectional structure of a thin film transistor. A thin film transistor 360 illustrated in FIG. 12D is one of bottom gate thin film transistors, which is called a channel protective thin film transistor (also referred to as a channel-stop thin film transistor), and is also referred to as an inverted staggered thin film transistor.

Although description is given using a single-gate thin film transistor as the thin film transistor 360, a multi-gate thin film transistor including a plurality of channel formation regions may be formed as needed.

A process of manufacturing the thin film transistor 360 over a substrate 320 is described below with reference to FIGS. 12A to 12D.

First, after a conductive layer is formed over the substrate 320 having an insulating surface, the gate electrode layer 361 is formed in a first photolithography process. Note that a resist mask may be formed with an inkjet method. When the resist mask is formed with an inkjet method, a photomask is not used; therefore, manufacturing costs can be reduced.

Further, the gate electrode layer 361 can be formed with a single-layer structure or a layered structure using any of metal materials such as molybdenum, titanium, chromium, tantalum, tungsten, aluminum, copper, neodymium, and scandium, and an alloy material including any of these materials as a main component.

Then, the gate insulating layer 322 is formed over the gate electrode layer 361.

In this embodiment, a silicon oxynitride layer having a thickness of smaller than or equal to 100 nm is formed as the gate insulating layer 322 with a plasma CVD method.

Then, an oxide semiconductor layer is formed to a thickness of 2 nm to 200 nm inclusive over the gate insulating layer 322 and processed into an island-shaped oxide semiconductor layer in a second photolithography process. In this embodiment, the oxide semiconductor layer is formed with a sputtering method with the use of an In—Ga—Zn—O-based metal oxide target.

In that case, the oxide semiconductor layer is preferably formed while removing moisture remaining in the treatment chamber. This is for preventing hydrogen, a hydroxyl group, and moisture from being contained in the oxide semiconductor layer.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the deposition chamber which is evacuated with the cryopump, a hydrogen atom, a compound containing a hydrogen atom, such as water ($H_2O$), and the like are evacuated, whereby the concentration of an impurity in the oxide semiconductor layer formed in the deposition chamber can be reduced.

It is preferable to use a high-purity gas from which an impurity such as hydrogen, water, a hydroxyl group, or hydride is removed to a concentration expressed by a level of ppm or ppb, as a sputtering gas used when the oxide semiconductor layer is formed.

Next, the oxide semiconductor layer is subjected to dehydration or dehydrogenation. The temperature of first heat treatment for dehydration or dehydrogenation is higher than or equal to 400° C. and lower than or equal to 750° C., preferably higher than or equal to 400° C. and lower than the strain point of the substrate. Here, the substrate is introduced into an electric furnace which is one of heat treatment apparatuses, heat treatment is performed on the oxide semiconductor layer in a nitrogen atmosphere at 450° C. for one hour, and then, the oxide semiconductor layer is not exposed to the air so that entry of water and hydrogen into the oxide semiconductor layer is prevented; thus, an oxide semiconductor layer 332 is obtained (see FIG. 12A).

Next, plasma treatment with a gas such as $N_2O$, $N_2$, or Ar is performed. With this plasma treatment, water adsorbed to a surface of an exposed portion of the oxide semiconductor layer is removed. Alternatively, plasma treatment may be performed using a mixed gas of oxygen and argon.

Next, after an oxide insulating layer is formed over the gate insulating layer 322 and the oxide semiconductor layer 332, a resist mask is formed in a third photolithography process. Selective etching is performed, so that the oxide insulating layer 366 is formed. Then, the resist mask is removed.

In this embodiment, a silicon oxide layer is formed to a thickness of 200 nm as the oxide insulating layer 366 with a sputtering method. The substrate temperature in film formation may be higher than or equal to room temperature and lower than or equal to 300° C. and in this embodiment, is 100° C. The silicon oxide layer can be formed with a sputtering method in a rare gas (typically, argon) atmosphere, an oxygen atmosphere, or a mixed atmosphere of a rare gas (typically, argon) and oxygen. Further, a silicon oxide target or a silicon target can be used as a target. For example, the silicon oxide layer can be formed using a silicon target with a sputtering method in an atmosphere containing oxygen and nitrogen.

In that case, the oxide insulating layer 366 is preferably formed while removing moisture remaining in the treatment chamber. This is for preventing hydrogen, a hydroxyl group, and moisture from being contained in the oxide semiconductor layer 332 and the oxide insulating layer 366.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the deposition chamber which is evacuated with the cryopump, a hydrogen atom, a compound containing a hydrogen atom, such as water ($H_2O$), and the like are evacuated, whereby the concentration of an impurity in the oxide insulating layer 366 formed in the deposition chamber can be reduced.

It is preferable to use a high-purity gas from which an impurity such as hydrogen, water, a hydroxyl group, or hydride is removed to a concentration expressed by a level of ppm or ppb, as a sputtering gas used when the oxide insulating layer 366 is formed.

Next, second heat treatment (preferably 200° C. to 400° C. inclusive, for example, from 250° C. to 350° C. inclusive) may be performed in an inert gas atmosphere or an oxygen gas atmosphere. For example, the second heat treatment is performed in a nitrogen atmosphere at 250° C. for one hour. With the second heat treatment, heat is applied while part of the oxide semiconductor layer (a channel formation region) is in contact with the oxide insulating layer 366.

In this embodiment, heat treatment is further performed on the oxide semiconductor layer 332 over which the oxide insulating layers 366 is provided and thus part of the oxide semiconductor layer 332 is exposed, in a nitrogen atmosphere, an inert gas atmosphere or under reduced pressure. By performing heat treatment in a nitrogen atmosphere, an inert gas atmosphere or under reduced pressure, the resistance of regions of the oxide semiconductor layers 332, which are not covered with the oxide insulating layer 366 and are thus exposed, can be increased. For example, heat treatment is performed in a nitrogen atmosphere at 250° C. for one hour.

With the heat treatment for the oxide semiconductor layer 332 provided with the oxide insulating layer 366 in a nitrogen atmosphere, the resistance of the exposed regions of the oxide semiconductor layer 332 is decreased. Thus, an oxide semiconductor layer 362 including regions with different resistances (indicated as shaded regions and white regions in FIG. 12B) are formed.

Next, after a conductive layer is formed over the gate insulating layer 322, the oxide semiconductor layer 362, and the oxide insulating layer 366, a resist mask is formed in a fourth photolithography process. Selective etching is performed, so that a source electrode layer 365a and a drain electrode layer 365b are formed. Then, the resist mask is removed (see FIG. 12C).

As the material of the source electrode layer 365a and the drain electrode layer 365b, there are an element selected from Al, Cr, Cu, Ta, Ti, Mo, or W; an alloy layer containing a combination of any of these elements; and the like. The metal conductive layer may have a single-layer structure or a layered structure of two or more layers.

Through the above steps, the oxide semiconductor layer comes to be in an oxygen-deficient state, accordingly the resistance thereof is reduced, that is, comes to be n-type when heat treatment for dehydration or dehydrogenation is performed on the formed oxide semiconductor layer. Then, the oxide insulating layer is formed in contact with the oxide semiconductor layer. Accordingly, part of the oxide semiconductor layer is selectively in an oxygen excess state. As a result, the channel formation region 363 overlapping with the gate electrode layer 361 becomes i-type. At that time, a high-resistance source region 364a which has higher carrier concentration than at least the channel formation region 363 and overlaps with the source electrode layer 365a and a high-resistance drain region 364b which has higher carrier concentration than at least the channel formation region 363 and overlaps with the drain electrode layer 365b are formed in a self-aligned manner. Through the above steps, the thin film transistor 360 is formed.

Further, heat treatment may be performed at 100° C. to 200° C. inclusive for one hour to 30 hours inclusive in the air. In this embodiment, heat treatment is performed at 150° C. for 10 hours. This heat treatment may be performed at a fixed heating temperature. Alternatively, the following change in the heating temperature may be conducted plural times repeatedly: the heating temperature is increased from a room temperature to a temperature of 100° C. to 200° C. inclusive and then decreased to a room temperature. Further, this heat treatment may be performed under a reduced pressure before formation of the oxide insulating layer. Under a reduced pressure, the heating time can be shortened. With this heat treatment, hydrogen is introduced from the oxide semiconductor layer to the oxide insulating layer; thus, the thin film transistor can be normally off. Therefore, reliability of the thin film transistor can be improved.

Note that by forming the high-resistance drain region 364b (and the high-resistance source region 364a) in the oxide semiconductor layer overlapping with the drain electrode layer 365b (and the source electrode layer 365a), reliability of the thin film transistor can be improved. Specifically, by forming the high-resistance drain region 364b, the structure can be obtained in which conductivities of the drain electrode layer 365b, the high-resistance drain region 364b, and the channel formation region 363 vary in a stepwise fashion. Therefore, in the case where the thin film transistor operates with the drain electrode layer 365b connected to a wiring for supplying a high power supply potential $V_{DD}$, the high-resistance drain region serves as a buffer and an electric field is not applied locally even if a high voltage is applied between the gate electrode layer 361 and the drain electrode layer 365b; thus, the withstand voltage of the thin film transistor can be increased.

A protective insulating layer 323 is formed over the source electrode layer 365a, the drain electrode layer 365b, and the oxide insulating layer 366. In this embodiment, the protective insulating layer 323 is formed using a silicon nitride layer (see FIG. 12D).

Note that an oxide insulating layer may be further formed over the source electrode layer 365a, the drain electrode layer 365*b*, and the oxide insulating layer 366, and the protective insulating layer 323 may be stacked over the oxide insulating layer.

The logic circuits in Embodiments 1 and 2 including the above-described thin film transistors can have stable electric characteristics and high reliability.

This embodiment can be implemented in appropriate combination with the other embodiments.

Embodiment 9

In this embodiment, an example of thin film transistors included in the logic circuit in Embodiment 1 or Embodiment 2 is described.

One embodiment of a thin film transistor and a manufacturing method of the thin film transistor of this embodiment is described with reference to FIGS. 13A to 13D.

Figure 13A:
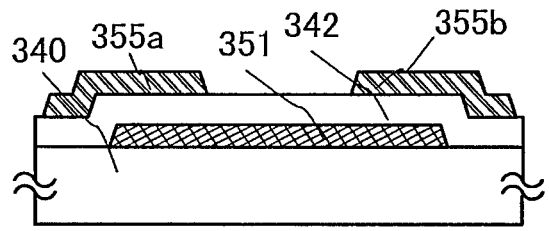
FIGS. 13A to 13D are cross-sectional views illustrating an example of a method for manufacturing a thin film transistor.
Figure 13B:
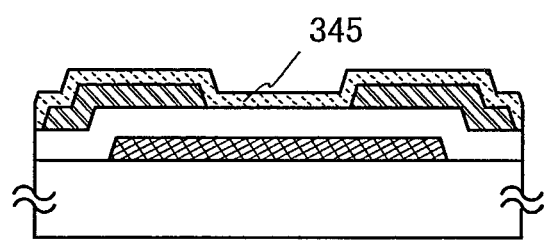
Figure 13C:
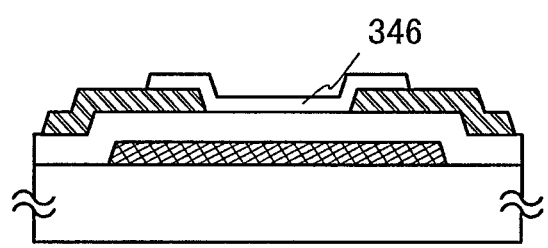
Figure 13D:
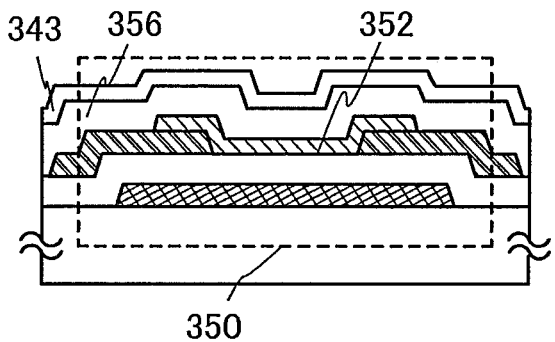

Although description is given using a single-gate thin film transistor as the thin film transistor 350 in FIG. 13D, a multi-gate thin film transistor including a plurality of channel formation regions may be formed as needed.

A process of manufacturing the thin film transistor 350 over a substrate 340 is described below with reference to FIGS. 13A to 13D.

First, after a conductive layer is formed over the substrate 340 having an insulating surface, a gate electrode layer 351 is formed in a first photolithography process. In this embodiment, a tungsten layer is formed as the gate electrode layer 351 to a thickness of 150 nm.

Then, a gate insulating layer 342 is formed over the gate electrode layer 351. In this embodiment, a silicon oxynitride layer is formed as the gate insulating layer 342 to a thickness of smaller than or equal to 100 nm with a plasma CVD method.

Next, after a conductive layer is formed over the gate insulating layer 342, a resist mask is formed in a second photolithography process. Selective etching is performed, so that a source electrode layer 355*a* and a drain electrode layer 355*b* are formed. Then, the resist mask is removed (see FIG. 13A).

Then, an oxide semiconductor layer 345 is formed (see FIG. 13B). In this embodiment, the oxide semiconductor layer 345 is formed with a sputtering method with the use of an In—Ga—Zn—O-based metal oxide target. The oxide semiconductor layer 345 is processed into an island-shaped oxide semiconductor layer in a third photolithography process.

In that case, the oxide semiconductor layer 345 is preferably formed while removing moisture remaining in the treatment chamber. This is for preventing hydrogen, a hydroxyl group, and moisture from being contained in the oxide semiconductor layer 345.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the deposition chamber which is evacuated with the cryopump, a hydrogen atom, a compound containing a hydrogen atom, such as water ($H_2O$), and the like are evacuated, whereby the concentration of an impurity in the oxide semiconductor layer 345 formed in the deposition chamber can be reduced.

It is preferable to use a high-purity gas from which an impurity such as hydrogen, water, a hydroxyl group, or hydride is removed to a concentration expressed by a level of ppm or ppb, as a sputtering gas used when the oxide semiconductor layer 345 is formed.

Next, the oxide semiconductor layer is subjected to dehydration or dehydrogenation. The temperature of first heat treatment for dehydration or dehydrogenation is higher than or equal to 400° C. and lower than or equal to 750° C., preferably higher than or equal to 400° C. and lower than the strain point of the substrate. Here, the substrate is introduced into an electric furnace which is one of heat treatment apparatuses, heat treatment is performed on the oxide semiconductor layer in a nitrogen atmosphere at 450° C. for one hour, and then, the oxide semiconductor layer is not exposed to the air so that entry of water and hydrogen into the oxide semiconductor layer is prevented; thus, an oxide semiconductor layer 346 is obtained (see FIG. 13C).

As the first heat treatment, GRTA may be performed as follows. The substrate is transferred and put in an inert gas which has been heated to a high temperature of 650° C. to 700° C., heated for several minutes, and transferred and taken out of the inert gas which has been heated to a high temperature. GRTA enables high-temperature heat treatment in a short time.

An oxide insulating layer 356 which serves as a protective insulating layer and is in contact with the oxide semiconductor layer 346 is formed.

The oxide insulating layer 356 can be formed to a thickness of longer than or equal to 1 nm with a sputtering method or the like as appropriate, which is a method with which an impurity such as water or hydrogen does not enter the oxide insulating layer 356. When hydrogen is contained in the oxide insulating layer 356, entry of the hydrogen to the oxide semiconductor layer or extraction of oxygen in the oxide semiconductor layer by the hydrogen is caused, whereby a backchannel of the oxide semiconductor layer comes to have a lower resistance (to be n-type) and thus a parasitic channel might be formed. Therefore, it is important that a formation method in which hydrogen is not used is employed so that the oxide insulating layer 356 is formed containing as little hydrogen as possible.

In this embodiment, a silicon oxide layer is formed to a thickness of 200 nm as the oxide insulating layer 356 with a sputtering method. The substrate temperature in film formation may be higher than or equal to room temperature and lower than or equal to 300° C. and in this embodiment, is 100° C. The silicon oxide layer can be formed with a sputtering method in a rare gas (typically, argon) atmosphere, an oxygen atmosphere, or a mixed atmosphere of a rare gas (typically, argon) and oxygen. Further, a silicon oxide target or a silicon target can be used as a target. For example, the silicon oxide layer can be formed using a silicon target with a sputtering method in an atmosphere containing oxygen and nitrogen. The oxide insulating layer 356 which is formed in contact with the oxide semiconductor layer in a region which is in an oxygen-deficient state and thus has a lower resistance is formed using an inorganic insulating layer that does not contain impurities such as moisture, a hydrogen ion, and OH⁻ and blocks entry of such impurities from the outside, typically, a silicon oxide layer, a silicon oxynitride layer, an aluminum oxide layer, or an aluminum oxynitride layer.

In that case, the oxide insulating layer 356 is preferably formed while removing moisture remaining in the treatment chamber. This is for preventing hydrogen, a hydroxyl group, and moisture from being contained in the oxide semiconductor layer 346 and the oxide insulating layer 356.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the deposition chamber which is evacuated with the cryopump, a hydrogen atom, a compound containing a hydrogen atom, such as water ($H_2O$), and the like are evacuated, whereby the concentration of an impurity in the oxide insulating layer 356 formed in the deposition chamber can be reduced.

It is preferable to use a high-purity gas from which an impurity such as hydrogen, water, a hydroxyl group, or hydride is removed to a concentration expressed by a level of ppm or ppb, as a sputtering gas used when the oxide insulating layer 356 is formed.

Next, second heat treatment (preferably 200° C. to 400° C. inclusive, for example, from 250° C. to 350° C. inclusive) is performed in an inert gas atmosphere or an oxygen gas atmosphere. For example, the second heat treatment is performed in a nitrogen atmosphere at 250° C. for one hour. With the second heat treatment, heat is applied while part of the oxide semiconductor layer (a channel formation region) is in contact with the oxide insulating layer 356.

Through the above steps, the oxide semiconductor layer which is in an oxygen-deficient state and thus has a lower resistance through dehydration or dehydrogenation is brought into an oxygen-excess state. As a result, an i-type oxide semiconductor layer 352 having a high resistance is formed. Through the above steps, the thin film transistor 350 is formed.

Further, heat treatment may be performed at 100° C. to 200° C. inclusive for one hour to 30 hours inclusive in the air. In this embodiment, heat treatment is performed at 150° C. for 10 hours. This heat treatment may be performed at a fixed heating temperature. Alternatively, the following change in the heating temperature may be conducted plural times repeatedly: the heating temperature is increased from a room temperature to a temperature of 100° C. to 200° C. inclusive and then decreased to a room temperature. Further, this heat treatment may be performed under a reduced pressure. Under a reduced pressure, the heating time can be shortened. With this heat treatment, hydrogen is introduced from the oxide semiconductor layer to the oxide insulating layer; thus, the thin film transistor can be normally off. Therefore, reliability of the semiconductor device can be improved.

A protective insulating layer 343 may be additionally formed over the oxide insulating layer 356. For example, a silicon nitride layer is formed with an RF sputtering method. In this embodiment, as the protective insulating layer, the protective insulating layer 343 is formed using a silicon nitride layer (see FIG. 13D).

Note that a planarization insulating layer for planarization may be provided over the protective insulating layer 343.

The logic circuits in Embodiments 1 and 2 including the above-described thin film transistors can have stable electric characteristics and high reliability This embodiment can be implemented in appropriate combination with the other embodiments.

Embodiment 10

In this embodiment, an example of thin film transistors included in the logic circuit in Embodiment 1 or Embodiment 2 is described.

Figure 14:
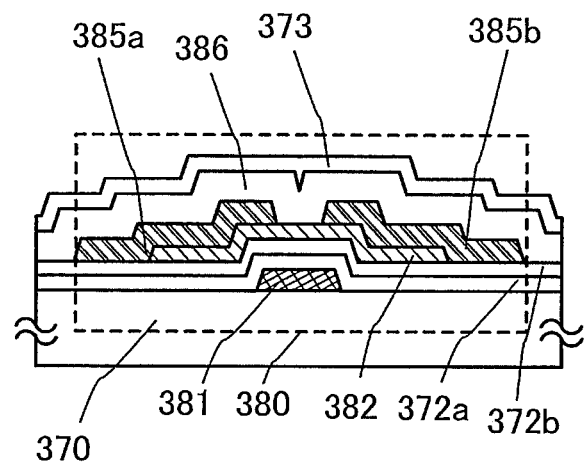
FIG. 14 is a cross-sectional view illustrating an example of a thin film transistor.

In this embodiment, an example which is partly different from Embodiment 7 in the manufacturing process of a thin film transistor will be described with reference to FIG. 14. Since FIG. 14 is the same as FIGS. 11A to 11E except for part of the steps, common reference numerals are used for the same portions, and detailed description of the same portions is omitted.

First, a gate electrode layer 381 is formed over a substrate 370, and a first gate insulating layer 372a and a second gate insulating layer 372b are stacked thereover in accordance with Embodiment 7. In this embodiment, a gate insulating layer has a two layer structure in which a nitride insulating layer and an oxide insulating layer are used as the first gate insulating layer 372a and the second gate insulating layer 372b, respectively.

As the oxide insulating layer, a silicon oxide layer, a silicon oxynitride layer, an aluminum oxide layer, an aluminum oxynitride layer, or the like may be used. As the nitride insulating layer, a silicon nitride layer, a silicon nitride oxide layer, an aluminum nitride layer, an aluminum nitride oxide layer, or the like may be used.

In this embodiment, the gate insulating layer may have a structure where a silicon nitride layer and a silicon oxide layer are stacked from the gate electrode layer 381 side. A silicon nitride layer ($SiN_y$ (y>0)) with a thickness of 50 nm to 200 nm inclusive (50 nm in this embodiment) is formed with a sputtering method as a first gate insulating layer 372a and a silicon oxide layer ($SiO_x$ (x>0)) with a thickness of 5 nm to 300 nm inclusive (100 nm in this embodiment) is stacked as a second gate insulating layer 372b over the first gate insulating layer 372a; thus, the gate insulating layer is formed.

Next, the oxide semiconductor layer is formed and then processed into an island-shaped oxide semiconductor layer in a photolithography process. In this embodiment, the oxide semiconductor layer is formed with a sputtering method with the use of an In—Ga—Zn—O-based metal oxide target.

In that case, the oxide semiconductor layer is preferably formed while removing moisture remaining in the treatment chamber. This is for preventing hydrogen, a hydroxyl group, and moisture from being contained in the oxide semiconductor layer.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the deposition chamber which is evacuated with the cryopump, a hydrogen atom, a compound containing a hydrogen atom, such as water ($H_2O$), and the like are evacuated, whereby the concentration of an impurity in the oxide semiconductor layer formed in the deposition chamber can be reduced.

It is preferable to use a high-purity gas from which an impurity such as hydrogen, water, a hydroxyl group, or hydride is removed to a concentration expressed by a level of ppm or ppb, as a sputtering gas used when the oxide semiconductor layer is formed.

Next, the oxide semiconductor layer is subjected to dehydration or dehydrogenation. The temperature of first heat treatment for dehydration or dehydrogenation is higher than or equal to 400° C. and lower than or equal to 750° C., preferably higher than or equal to 425° C. Note that in the case of the temperature that is 425° C. or more, the heat treatment time may be one hour or less, whereas in the case of the temperature less than 425° C., the heat treatment time is longer than one hour. Here, the substrate is introduced into an electric furnace which is one of heat treatment apparatuses, heat treatment is performed on the oxide semiconductor layer in a nitrogen atmosphere, and then, the oxide semiconductor layer is not exposed to the air so that entry of water and hydrogen into the oxide semiconductor layer is prevented. Thus, the oxide semiconductor layer is obtained. After that, a high-purity oxygen gas, a high-purity $N_2O$ gas, or an ultra-dry air (with a dew point of −40° C. or less, preferably −60° C. or less) is introduced into the same furnace and cooling is performed. It is preferable that water, hydrogen, and the like be not contained in the oxygen gas or the $N_2O$ gas. Alternatively, the purity of the oxygen gas or the $N_2O$ gas which is introduced into the heat treatment apparatus is preferably 6N (99.9999%) or more, more preferably 7N (99.99999%) or more (i.e., the impurity concentration of the oxygen gas or the $N_2O$ gas is preferably 1 ppm or lower, more preferably 0.1 ppm or lower).

Note that the heat treatment apparatus is not limited to the electric furnace, and for example, may be an RTA (rapid thermal annealing) apparatus such as a GRTA (gas rapid thermal annealing) apparatus or an LRTA (lamp rapid thermal annealing) apparatus. An LRTA apparatus is an apparatus for heating an object to be processed by radiation of light (electromagnetic wave) emitted from a lamp such as a halogen lamp, a metal halide lamp, a xenon arc lamp, a carbon arc lamp, a high pressure sodium lamp, or a high pressure mercury lamp. An LRTA apparatus may be provided with not only a lamp but also a device for heating an object to be processed by heat conduction or heat radiation from a heater such as a resistance heater. GRTA is a method for performing heat treatment using a high-temperature gas. As the gas, an inert gas which does not react with an object to be processed with heat treatment, such as nitrogen or a rare gas such as argon is used. Alternatively, the heat treatment may be performed at 600° C. to 750° C. for several minutes by an RTA method.

Moreover, after the first heat treatment for dehydration or dehydrogenation, heat treatment may be performed at from 200° C. to 400° C. inclusive, preferably from 200° C. to 300° C. inclusive, in an oxygen gas atmosphere or a $N_2O$ gas atmosphere.

The first heat treatment of the oxide semiconductor layer may be performed before processing the oxide semiconductor layer into the island-like oxide semiconductor layer. In that case, after the first heat treatment, the substrate is taken out of the heating apparatus and a photolithography step is performed.

Through the above process, an entire region of the oxide semiconductor layer is made to be in an oxygen excess state; thus, the oxide semiconductor layer has higher resistance, that is, the oxide semiconductor layer becomes i-type. Accordingly, an oxide semiconductor layer 382 whose entire region is i-type is obtained.

Next, a conductive layer is formed over the oxide semiconductor layer 382. A resist mask is formed in a photolithography process. Etching is performed selectively, whereby a source electrode layer 385a and a drain electrode layer 385b are formed. Then, an oxide insulating layer 386 is formed with a sputtering method.

In that case, the oxide insulating layer 386 is preferably formed while removing moisture remaining in the treatment chamber. This is for preventing hydrogen, a hydroxyl group, and moisture from being contained in the oxide semiconductor layer 382 and the oxide insulating layer 386.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the deposition chamber which is evacuated with the cryopump, a hydrogen atom, a compound containing a hydrogen atom, such as water ($H_2O$), and the like are evacuated, whereby the concentration of an impurity in the oxide insulating layer 386 formed in the deposition chamber can be reduced.

It is preferable to use a high-purity gas from which an impurity such as hydrogen, water, a hydroxyl group, or hydride is removed to a concentration expressed by a level of ppm or ppb, as a sputtering gas used when the oxide insulating layer 386 is formed.

Through the above steps, a thin film transistor 380 can be formed.

Next, in order to reduce variation in electric characteristics of the thin film transistors, heat treatment (preferably at 150° C. or higher and lower than 350° C.) may be performed in an inert gas atmosphere or a nitrogen gas atmosphere. For example, the heat treatment is performed in a nitrogen atmosphere at 250° C. for one hour.

Further, heat treatment may be performed at 100° C. to 200° C. inclusive for one hour to 30 hours inclusive in the air. In this embodiment, heat treatment is performed at 150° C. for 10 hours. This heat treatment may be performed at a fixed heating temperature. Alternatively, the following change in the heating temperature may be conducted plural times repeatedly: the heating temperature is increased from a room temperature to a temperature of 100° C. to 200° C. inclusive and then decreased to a room temperature. Under a reduced pressure, the heating time can be shortened. With this heat treatment, hydrogen is introduced from the oxide semiconductor layer to the oxide insulating layer; thus, the thin film transistor can be normally off. Therefore, reliability of the thin film transistor can be improved.

A protective insulating layer 373 is formed over the oxide insulating layer 386. In this embodiment, the protective insulating layer 373 is formed to a thickness of 100 nm with the use of a silicon nitride layer with a sputtering method.

The protective insulating layer 373 and the first gate insulating layer 372a each formed using a nitride insulating layer do not contain impurities such as moisture, hydrogen, hydride, and hydroxide and has an effect of blocking entry of these from the outside.

Therefore, in a manufacturing process after formation of the protective insulating layer 373, entry of an impurity such as moisture from the outside can be prevented. Further, even after a device is completed as a semiconductor device such as a liquid crystal display device, entry of an impurity such as moisture from the outside can be prevented in the long term; therefore, long-term reliability of the device can be achieved.

Further, part of the insulating layers between the protective insulating layer 373 formed using a nitride insulating layer and the first gate insulating layer 372a may be removed so that the protective insulating layer 373 and the first gate insulating layer 372a are in contact with each other.

Accordingly, impurities such as moisture, hydrogen, hydride, and hydroxide in the oxide semiconductor layer are reduced as much as possible and entry of such impurities is prevented, so that the concentration of impurities in the oxide semiconductor layer can be maintained to be low.

Although not illustrated, a planarization insulating layer for planarization may be provided over the protective insulating layer 373.

The logic circuits in Embodiments 1 and 2 including the above-described thin film transistors can have stable electric characteristics and high reliability This embodiment can be implemented in appropriate combination with the other embodiments.

Embodiment 11

Figure 15A:
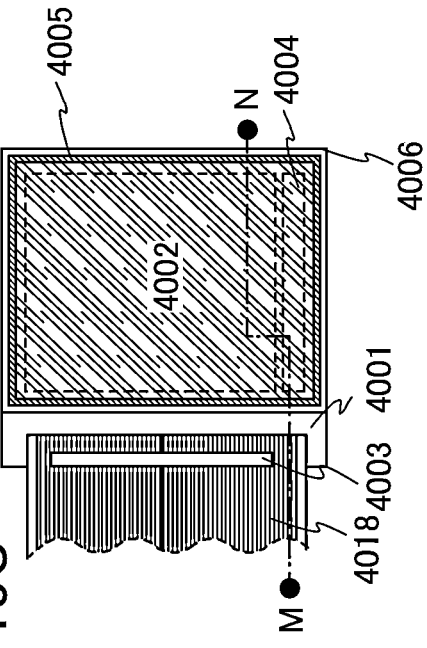
FIGS. 15A and 15C are plan views illustrating examples of semiconductor devices.
Figure 15C:
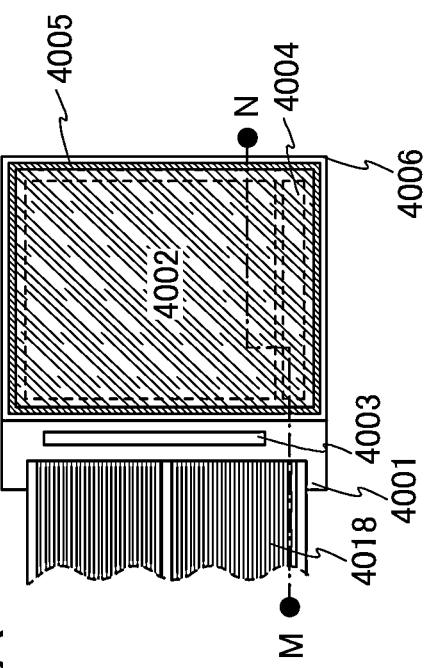
Figure 15B:
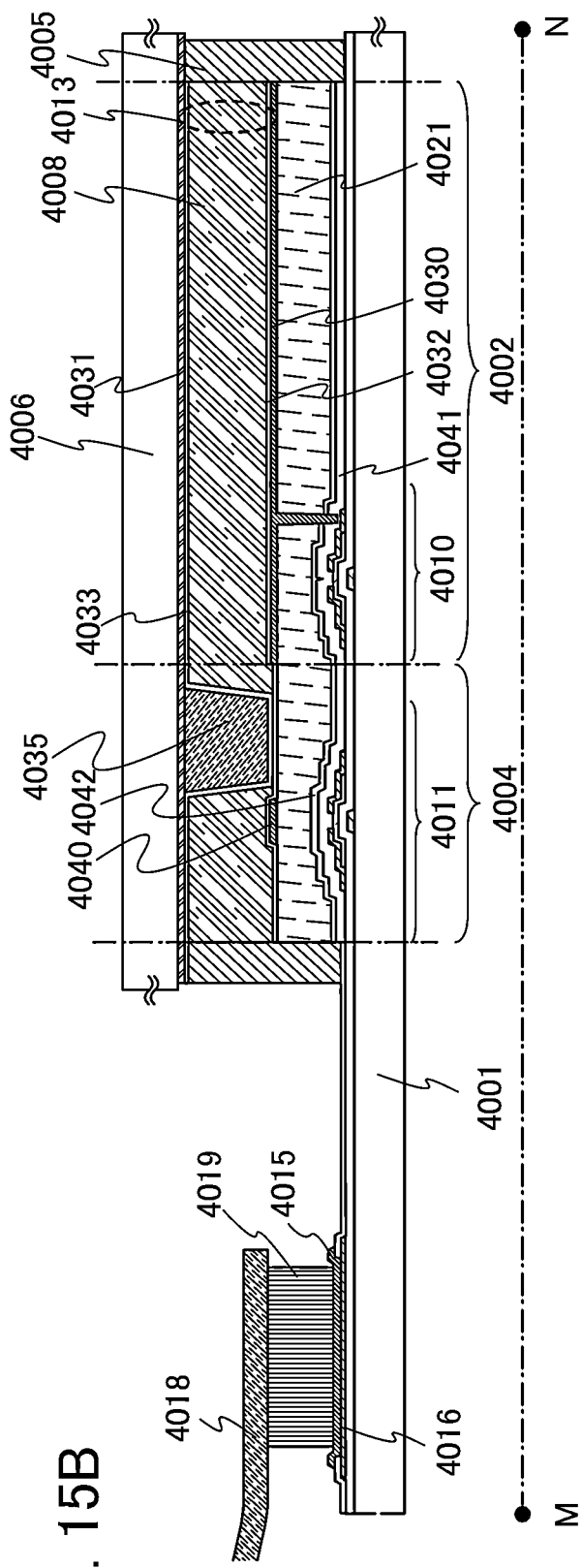
FIG. 15B is a cross-sectional view illustrating any of the examples of the semiconductor devices.

In this embodiment, examples of semiconductor devices each including the logic circuit in Embodiment 1 or Embodiment 2 are described. Specifically, appearances and a cross section of liquid crystal display panels in each of which a driver circuit includes the logic circuit in Embodiment 1 or Embodiment 2 are described with reference to FIGS. 15A to 15C. FIGS. 15A and 15C are plan views of panels in each of which thin film transistors 4010 and 4011 and a liquid crystal element 4013 are sealed between a first substrate 4001 and a second substrate 4006 with a sealant 4005. FIG. 15B is a cross-sectional view taken along a line M-N in FIG. 15A or 15C.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that there is no particular limitation on the connection method of the driver circuit which is separately formed, and a COG method, a wire bonding method, a TAB method, or the like can be used. FIG. 15A illustrates an example in which the signal line driver circuit 4003 is mounted by a COG method. FIG. 15C illustrates an example in which the signal line driver circuit 4003 is mounted by a TAB method.

The pixel portion 4002 and the scan line driver circuit 4004 provided over the first substrate 4001 include a plurality of thin film transistors. FIG. 15B illustrates the thin film transistor 4010 included in the pixel portion 4002 and the thin film transistor 4011 included in the scan line driver circuit 4004, as an example. Insulating layers 4041, 4042, and 4021 are provided over the thin film transistors 4010 and 4011.

Any of the thin film transistors of Embodiments 3 to 10 can be used as appropriate as the thin film transistors 4010 and 4011, and they can be formed using steps and materials similar to those for the thin film transistors of Embodiments 3 to 10. Hydrogen or water is reduced in the oxide semiconductor layers of the thin film transistors 4010 and 4011. Thus, the thin film transistors 4010 and 4011 are highly reliable thin film transistors. In this embodiment, the thin film transistors 4010 and 4011 are n-channel thin film transistors.

A conductive layer 4040 is provided over part of the insulating layer 4021, which overlaps with a channel formation region of an oxide semiconductor layer in the thin film transistor 4011. The conductive layer 4040 is provided in the position overlapping with the channel formation region of the oxide semiconductor layer, whereby the amount of change in threshold voltage of the thin film transistor 4011 before and after the BT test can be reduced. A potential of the conductive layer 4040 may be the same or different from that of a gate electrode layer of the thin film transistor 4011. The conductive layer 4040 can also function as a second gate electrode layer. Further, the potential of the conductive layer 4040 may be GND, 0 V, or the conductive layer 4040 may be in a floating state. Note that the conductive layer 4040 is not necessarily provided.

A pixel electrode layer 4030 included in the liquid crystal element 4013 is electrically connected to a source or drain electrode layer of the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 functioning as alignment films, respectively, and the liquid crystal layer 4008 is sandwiched between the electrode layers with the insulating layers 4032 and 4033 therebetween.

Note that a light-transmitting substrate can be used as the first substrate 4001 and the second substrate 4006; glass, ceramics, or plastics can be used. The plastic may be a fiberglass-reinforced plastics (FRP) plate, a polyvinyl fluoride (PVF) film, a polyester film, or an acrylic resin film.

Reference numeral 4035 denotes a columnar spacer obtained by selective etching of an insulating film, and the columnar spacer is provided in order to control the distance (a cell gap) between the pixel electrode layer 4030 and the counter electrode layer 4031. Alternatively, a spherical spacer may be used as the spacer 4035. The counter electrode layer 4031 is electrically connected to a common potential line formed over the substrate where the thin film transistor 4010 is formed. The counter electrode layer 4031 and the common potential line can be electrically connected to each other through conductive particles provided between the pair of substrates using the common connection portion. Note that the conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while the temperature of cholesteric liquid crystal is increased. Since the blue phase is only generated within a narrow temperature range, a liquid crystal composition containing a chiral agent at 5 wt % or more is used for the liquid crystal layer 4008 in order to improve the temperature range. The liquid crystal composition including liquid crystal exhibiting a blue phase and a chiral agent has a short response time of 1 msec or less and is optically isotropic; therefore, alignment treatment is not necessary and viewing angle dependence is small. In addition, since an alignment film does not need to be provided and rubbing treatment is unnecessary, electrostatic breakdown caused by the rubbing treatment can be prevented and defects and damage of the liquid crystal display device can be reduced in the manufacturing process. Thus, productivity of the liquid crystal display device can be increased. A thin film transistor formed using an oxide semiconductor layer particularly has a possibility that electric characteristics of the thin film transistor may fluctuate significantly by the influence of static electricity and deviate from the designed range. Therefore, it is more effective to use a blue phase liquid crystal material for a liquid crystal display device including a thin film transistor formed using an oxide semiconductor layer.

Note that this embodiment can also be applied to a transflective liquid crystal display device in addition to a transmissive liquid crystal display device.

Although a polarizing plate is provided on the outer surface of the substrate (on the viewer side) and a coloring layer and an electrode layer used for a display element are sequentially provided on the inner surface of the substrate in the example of the liquid crystal display device, the polarizing plate may be provided on the inner surface of the substrate. The stacked structure of the polarizing plate and the coloring layer is not limited to that in this embodiment and may be set as appropriate depending on materials of the polarizing plate and the coloring layer or conditions of the manufacturing process. Further, a light-blocking film serving as a black matrix may be provided in a portion other than the display portion.

Over the thin film transistors 4011 and 4010, the insulating layer 4041 is formed in contact with the oxide semiconductor layers. The insulating layer 4041 can be formed using a material and a method which are similar to those of the oxide insulating layer described in any of the embodiments. Here, as the insulating layer 4041, a silicon oxide layer is formed by a sputtering method. Further, the protective insulating layer 4042 is formed on and in contact with the insulating layer 4041. The protective insulating layer 4042 can be formed using a silicon nitride layer, for example. In order to reduce the surface roughness caused by the thin film transistors, the insulating layer 4021 serving as a planarization insulating layer is formed.

The insulating layer 4021 is formed as a planarization insulating layer. As the insulating layer 4021, an organic material having heat resistance such as polyimide, acrylic, benzocyclobutene, polyamide, or epoxy can be used. Other than such organic materials, it is possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating layers formed of these materials.

There is no particular limitation on the method for forming the insulating layer 4021. The insulating layer 4021 can be formed, depending on the material, by a method such as a sputtering method, an SOG method, a spin coating method, a dipping method, a spray coating method, or a droplet discharge method (e.g., an inkjet method, screen printing, or offset printing), or a tool (equipment) such as a doctor knife, a roll coater, a curtain coater, or a knife coater. A baking step of the insulating layer 4021 also serves as annealing of the semiconductor layer, whereby a semiconductor device can be manufactured efficiently.

The pixel electrode layer 4030 and the counter electrode layer 4031 can be formed using a light-transmitting conductive material such as indium tin oxide (ITO), indium zinc oxide (IZO) in which zinc oxide (ZnO) is mixed in indium oxide, a conductive material in which silicon oxide ($SiO_2$) is mixed in indium oxide, organic indium, organotin, indium oxide containing tungsten oxide, indium zinc oxide containing tungsten oxide, indium oxide containing titanium oxide, indium tin oxide containing titanium oxide, or the like. Further, in the case where a light-transmitting property is not needed or a reflecting property is needed in a reflective liquid crystal display device, the pixel electrode layer 4030 and the counter electrode layer 4031 can be formed using one or more kinds of materials selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy of these metals; and a nitride of these metals.

A conductive composition containing a conductive high molecule (also referred to as a conductive polymer) can be used for the pixel electrode layer 4030 and the counter electrode layer 4031. The pixel electrode formed using the conductive composition preferably has a sheet resistance of less than or equal to 10000 ohms per square and a transmittance of greater than or equal to 70% at a wavelength of 550 nm. Further, the resistivity of the conductive high molecule contained in the conductive composition is preferably less than or equal to 0.1 Ω·cm.

As the conductive high molecule, a so-called π-electron conjugated conductive polymer can be used. For example, polyaniline or a derivative thereof, polypyrrole or a derivative thereof, polythiophene or a derivative thereof, a copolymer of two or more kinds of them, and the like can be given.

Further, a variety of signals and potentials are supplied to the signal line driver circuit 4003 which is formed separately, the scan line driver circuit 4004, or the pixel portion 4002 from an FPC 4018.

A connection terminal electrode 4015 is formed using the same conductive film as the pixel electrode layer 4030 included in the liquid crystal element 4013, and a terminal electrode 4016 is formed using the same conductive film as source and drain electrode layers of the thin film transistors 4010 and 4011.

The connection terminal electrode 4015 is electrically connected to a terminal included in the FPC 4018 through an anisotropic conductive film 4019.

Note that FIGS. 15A to 15C illustrate examples in each of which the signal line driver circuit 4003 is formed separately and mounted on the first substrate 4001; however, the present invention is not limited to this structure. The scan line driver circuit may be separately formed and then mounted, or only part of the signal line driver circuit or part of the scan line driver circuit may be separately formed and then mounted.

A black matrix (a light-blocking layer), an optical member (an optical substrate) such as a polarizing member, a retardation member, or an anti-reflection member, and the like are provided as appropriate. For example, circular polarization may be employed by using a polarizing substrate and a retardation substrate. In addition, a backlight, a sidelight, or the like may be used as a light source.

In an active matrix liquid crystal display device, display patterns are formed on a screen by driving of pixel electrodes that are arranged in matrix. Specifically, voltage is applied between a selected pixel electrode and a counter electrode corresponding to the pixel electrode, and thus, a liquid crystal layer disposed between the pixel electrode and the counter electrode is optically modulated. This optical modulation is recognized as a display pattern by a viewer.

A liquid crystal display device has a problem in that, when displaying a moving image, image sticking occurs or the moving image is blurred because the response speed of liquid crystal molecules themselves is low. As a technique for improving moving image characteristics of a liquid crystal display device, there is a driving technique so-called black insertion by which an entirely black image is displayed every other frame.

Alternatively, a driving method called double-frame rate driving may be employed in which a vertical synchronizing frequency is 1.5 times or more, preferably 2 times or more as high as a normal vertical synchronizing frequency, whereby response speed is improved.

Furthermore, as a technique for improving moving image characteristics of a liquid crystal display device, there is another driving technique in which, as a backlight, a surface light source including a plurality of LED (light-emitting diode) light sources or a plurality of EL light sources is used, and each light source included in the surface light source is independently driven so as to perform intermittent lighting in one frame period. As the surface light source, three or more kinds of LEDs may be used, or a white-light-emitting LED may be used. Since a plurality of LEDs can be controlled independently, the timing at which the LEDs emit light can be synchronized with the timing at which optical modulation of a liquid crystal layer is switched. In this driving technique, part of LEDs can be turned off. Therefore, especially in the case of displaying an image in which the proportion of a black image area in one screen is high, a liquid crystal display device can be driven with low power consumption.

When combined with any of these driving techniques, a liquid crystal display device can have better display characteristics such as moving image characteristics than conventional liquid crystal display devices.

Since the thin film transistor is easily broken due to static electricity or the like, the protective circuit is preferably provided over the same substrate as the pixel portion and the driver circuit portion. The protective circuit is preferably formed using a non-linear element including an oxide semiconductor layer. For example, a protective circuit is provided between the pixel portion, and a scan line input terminal and a signal line input terminal. In this embodiment, a plurality of protective circuits are provided so that the pixel transistor and the like are not broken when surge voltage due to static electricity or the like is applied to the scan line, the signal line, or a capacitor bus line. Accordingly, the protective circuit has a structure for releasing electric charge to a common wiring when surge voltage is applied to the protective circuit. The protective circuit includes non-linear elements which are arranged in parallel with the scan line. Each of the non-linear elements includes a two-terminal element such as a diode or a three-terminal element such as a transistor. For example, the non-linear element can be formed through the same steps as the thin film transistor of the pixel portion. For example, characteristics similar to those of a diode can be achieved by connecting a gate terminal to a drain terminal.

Further, for the liquid crystal display module, a twisted nematic (TN) mode, an in-plane-switching (IPS) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be used.

There is no particular limitation in the semiconductor device disclosed in this specification, and a liquid crystal display device including a TN liquid crystal, an OCB liquid crystal, an STN liquid crystal, a VA liquid crystal, an ECB liquid crystal, a GH liquid crystal, a polymer dispersed liquid crystal, a discotic liquid crystal, or the like can be used. In particular, a normally black liquid crystal panel such as a transmissive liquid crystal display device utilizing a vertical alignment (VA) mode is preferable. Some examples are given as a vertical alignment mode. For example, an MVA (multi-domain vertical alignment) mode, a PVA (patterned vertical alignment) mode, an ASV mode, or the like can be employed.

Further, this embodiment can also be applied to a VA liquid crystal display device. The VA liquid crystal display device has a kind of form in which alignment of liquid crystal molecules in a liquid crystal display panel is controlled. In the VA liquid crystal display device, liquid crystal molecules are aligned in a vertical direction with respect to a panel surface when no voltage is applied. Further, a method called multi-domain or multi-domain design, by which a pixel is divided into some regions (subpixels), and liquid crystal molecules are aligned in different directions in their respective regions, can be used.

This embodiment can be implemented in appropriate combination with any of the other embodiments.

Embodiment 12

In this embodiment, examples of semiconductor devices each including the logic circuit in Embodiment 1 or Embodiment 2 are described. Specifically, examples of manufacturing active-matrix light-emitting display devices in each of which a driver circuit includes the logic circuit in Embodiment 1 or Embodiment 2 are described. Note that in this embodiment, examples of light-emitting display devices including light-emitting elements utilizing electroluminescence will be described.

Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. Then, the carriers (electrons and holes) recombine, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

Figure 16:
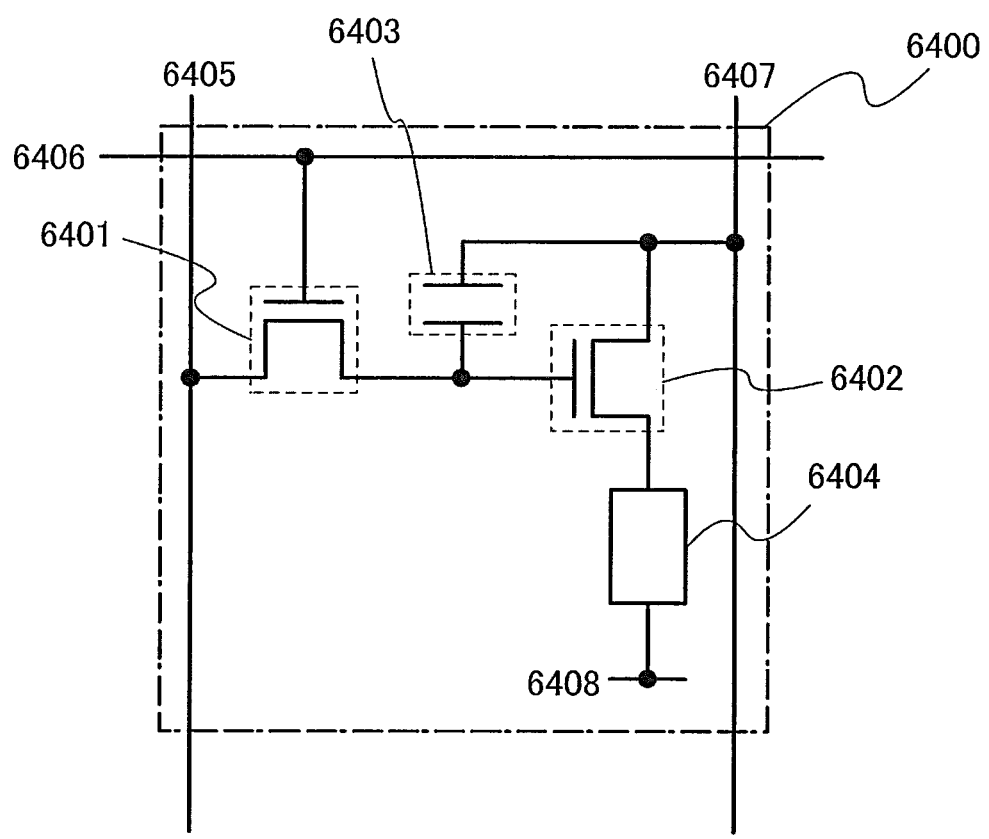
FIG. 16 is a diagram illustrating an example of a pixel equivalent circuit of a semiconductor device.

FIG. 16 illustrates an example of a pixel structure to which digital time grayscale driving can be applied, as an example of a semiconductor device.

A structure and operation of a pixel to which digital time grayscale driving can be applied are described. Here, one pixel includes two n-channel transistors each of which includes an oxide semiconductor layer as a channel formation region.

A pixel 6400 includes a switching transistor 6401, a driving transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driving transistor 6402. The gate of the driving transistor 6402 is connected to a power supply line 6407 through the capacitor 6403, a first electrode of the driving transistor 6402 is connected to the power supply line 6407, and a second electrode of the driving transistor 6402 is connected to a first electrode (pixel electrode) of the light-emitting element 6404. A second electrode of the light-emitting element 6404 corresponds to a common electrode. The common electrode is electrically connected to a common potential line 6408 provided over the same substrate as the common electrode.

The second electrode (common electrode) of the light-emitting element 6404 is set to a low power supply potential. Note that the low power supply potential is a potential satisfying the low power supply potential <a high power supply potential with reference to the high power supply potential that is set to the power supply line 6407. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is higher than a forward voltage drop of the light-emitting element 6404.

When the gate capacitance of the driving transistor 6402 is used as a substitute for the capacitor 6403, the capacitor 6403 can be omitted. The gate capacitance of the driving transistor 6402 may be formed between a channel formation region and a gate electrode.

Here, in the case of using a voltage-input voltage driving method, a video signal to enable the driving transistor 6402 to completely turn on or off, is input to the gate of the driving transistor 6402. That is, the driving transistor 6402 operates in a linear region. Since the driving transistor 6402 operates in a linear region, voltage higher than the voltage of the power supply line 6407 is applied to the gate of the driving transistor 6402. Note that a voltage greater than or equal to (power supply line voltage+$V_{th}$ of the driving transistor 6402) is applied to the signal line 6405.

Further, in the case of using analog grayscale driving instead of the digital time ratio grayscale driving, the pixel structure the same as that of FIG. 16 can be employed by inputting signals in a different way.

In the case of using the analog grayscale method, a voltage greater than or equal to forward voltage of the light-emitting element 6404+$V_{th}$ of the driving transistor 6402 is applied to the gate of the driving transistor 6402. The forward voltage of the light-emitting element 6404 indicates voltage at which a desired luminance is obtained. By inputting a video signal to enable the driving transistor 6402 to operate in a saturation region, current can be supplied to the light-emitting element 6404. In order that the driving transistor 6402 can operate in the saturation region, the potential of the power supply line 6407 is made higher than a gate potential of the driving transistor 6402. When an analog video signal is used, it is possible to feed current to the light-emitting element 6404 in accordance with the video signal and perform analog grayscale driving.

Note that the pixel structure illustrated in FIG. 16 is not limited thereto. For example, a switch, a resistor, a capacitor, a transistor, a logic circuit, or the like may be added to the pixel shown in FIG. 16.

Next, structures of the light-emitting element will be described with reference to FIGS. 17A to 17C. Here, a cross-sectional structure of a pixel will be described by taking an n-channel driving TFT as an example. Driving TFTs 7011, 7021, and 7001 used for semiconductor devices illustrated in FIGS. 17A, 17B, and 17C can be manufactured in a manner similar to that of the thin film transistor described in any of the embodiments and are thin film transistors each including an oxide semiconductor layer, as examples.

In order to extract light emission from the light-emitting element, at least one of an anode and a cathode is required to be transparent. A thin film transistor and a light-emitting element are formed over a substrate. The light-emitting element can have a top emission structure in which light emission is extracted through a surface opposite to the substrate; a bottom emission structure in which light emission is extracted through a surface on the substrate side; or a dual emission structure in which light emission is extracted through the surface opposite to the substrate and the surface on the substrate side. The pixel structure can be applied to a light-emitting element having any of these emission structures.

Next, a light-emitting element having a bottom emission structure is described with reference to FIG. 17A.

Figure 17A:
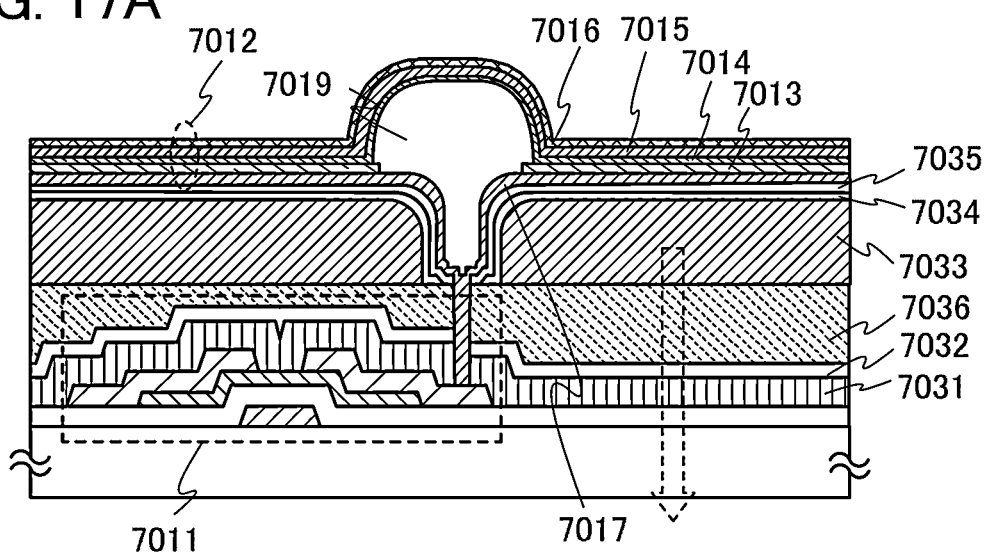
FIGS. 17A to 17C are cross-sectional views illustrating examples of semiconductor devices.

FIG. 17A is a cross-sectional view of a pixel of the case where a driving TFT 7011 is of an n-type and light is emitted from a light-emitting element 7012 to a first electrode 7013 side. In FIG. 17A, the first electrode 7013 of the light-emitting element 7012 is formed over a light-transmitting conductive layer 7017 which is electrically connected to a drain electrode layer of the driving TFT 7011, and an EL layer 7014 and a second electrode 7015 are stacked in the order presented, over the first electrode 7013.

As the light-transmitting conductive layer 7017, a light-transmitting conductive layer of indium oxide including tungsten oxide, indium zinc oxide including tungsten oxide, indium oxide including titanium oxide, indium tin oxide including titanium oxide, indium tin oxide, indium zinc oxide, indium tin oxide to which silicon oxide is added, or the like can be used.

A variety of materials can be used for the first electrode 7013 of the light-emitting element. For example, in the case where the first electrode 7013 is used as a cathode, the first electrode 7013 is preferably formed using, for example, a material having a low work function such as an alkali metal such as Li or Cs; an alkaline earth metal such as Mg, Ca, or Sr; an alloy containing any of these metals (e.g., Mg:Ag or Al:Li); or a rare earth metal such as Yb or Er. In FIG. 17A, the first electrode 7013 is approximately formed to a thickness such that light is transmitted (preferably, approximately 5 nm to 30 nm). For example, an aluminum layer having a thickness of 20 nm is used for the first electrode 7013.

Note that the light-transmitting conductive layer 7017 and the first electrode 7013 may be formed by stacking a light-transmitting conductive layer and an aluminum layer and then performing selective etching. In this case, the etching can be performed using the same mask, which is preferable.

Further, the periphery of the first electrode 7013 is covered with a partition wall 7019. The partition wall 7019 is formed using an organic resin film of polyimide, acrylic, polyamide, epoxy, or the like; an inorganic insulating film; or organic polysiloxane. It is particularly preferable that the partition wall 7019 be formed using a photosensitive resin material to have an opening over the first electrode 7013 so that a sidewall of the opening is formed to have an inclined surface with continuous curvature. In the case where a photosensitive resin material is used for the partition wall 7019, a step of forming a resist mask can be omitted.

As the EL layer 7014 formed over the first electrode 7013 and the partition wall 7019, an EL layer including at least a light-emitting layer is acceptable. Further, the EL layer 7014 may be formed to have either a single-layer structure or a stacked-layer structure. When the EL layer 7014 is formed using a plurality of layers, an electron-injection layer, an electron-transport layer, a light-emitting layer, a hole-transport layer, and a hole-injection layer are stacked in the order presented over the first electrode 7013 functioning as a cathode. Note that not all of these layers need to be provided except for the light-emitting layer.

The stacking order is not limited to the order presented above. The first electrode 7013 may serve as an anode, and a hole-injection layer, a hole-transport layer, a light-emitting layer, an electron-transport layer, and an electron-injection layer may be stacked in the order presented over the first electrode 7013. However, considering power consumption, it is preferable that the first electrode 7013 serve as a cathode and an electron-injection layer, an electron-transport layer, a light-emitting layer, a hole-transport layer, and a hole-injection layer be stacked in the order presented over the first electrode 7013 because an increase in voltage of a driver circuit portion can be prevented and power consumption can be reduced more effectively than in the case of using the first electrode 7013 as the anode.

Further, any of a variety of materials can be used for the second electrode 7015 formed over the EL layer 7014. For example, in the case where the second electrode 7015 is used as an anode, a material having a high work function, for example, ZrN, Ti, W, Ni, Pt, Cr, or the like; or a transparent conductive material such as ITO, IZO, or ZnO is preferable. Further, a shielding film 7016, for example, a metal which blocks light, a metal which reflects light, or the like is provided over the second electrode 7015. In this embodiment, an ITO film is used as the second electrode 7015, and a Ti layer is used as the shielding film 7016.

The light-emitting element 7012 corresponds to a region where the EL layer 7014 including the light-emitting layer is sandwiched between the first electrode 7013 and the second electrode 7015. In the case of the element structure illustrated in FIG. 17A, light emitted from the light-emitting element 7012 is ejected to the first electrode 7013 side as indicated by an arrow.

Note that in the example illustrated in FIG. 17A, a light-transmitting conductive layer is used as a gate electrode layer and a thin light-transmitting film is used as source and drain electrode layers. Light emitted from the light-emitting element 7012 passes through a color filter layer 7033, and can be ejected through the substrate.

The color filter layer 7033 is formed by a droplet discharge method such as an inkjet method, a printing method, an etching method with the use of a photolithography technique, or the like.

The color filter layer 7033 is covered with the overcoat layer 7034, and also covered with the protective insulating layer 7035. Note that although the overcoat layer 7034 with a small thickness is illustrated in FIG. 17A, the overcoat layer 7034 has a function to planarize roughness due to the color filter layer 7033.

A contact hole which is formed in a planarization insulating layer 7036, the insulating layer 7032, and the insulating layer 7031, and which reaches the drain electrode layer is provided in a portion which overlaps with the partition wall 7019.

A light-emitting element having a dual emission structure is described with reference to FIG. 17B.

Figure 17B:
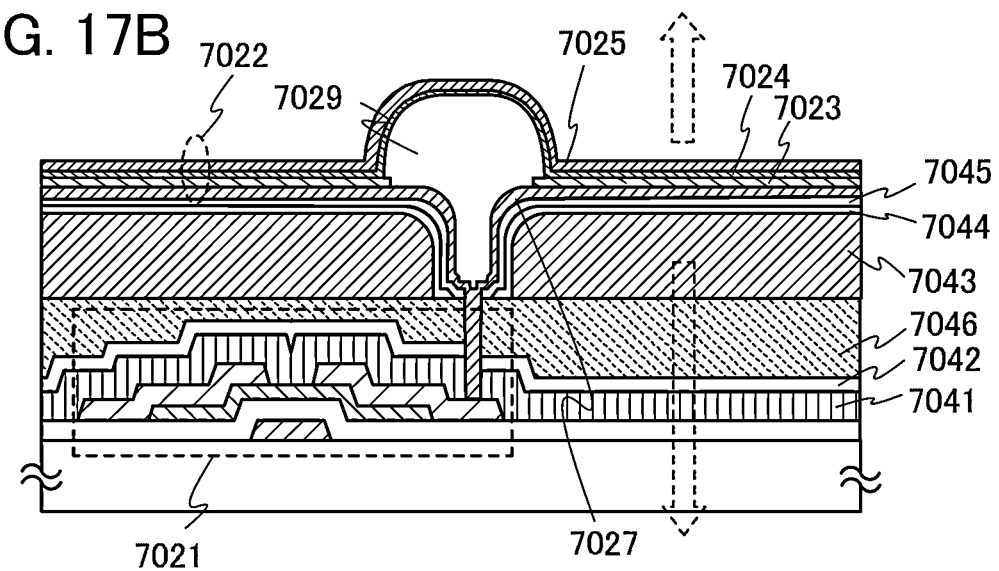

In FIG. 17B, a first electrode 7023 of a light-emitting element 7022 is formed over a light-transmitting conductive layer 7027 which is electrically connected to a drain electrode layer of the driving TFT 7021, and an EL layer 7024 and a second electrode 7025 are stacked in the order presented over the first electrode 7023.

As the light-transmitting conductive layer 7027, a light-transmitting conductive layer of indium oxide including tungsten oxide, indium zinc oxide including tungsten oxide, indium oxide including titanium oxide, indium tin oxide including titanium oxide, indium tin oxide, indium zinc oxide, indium tin oxide to which silicon oxide is added, or the like can be used.

A variety of materials can be used for the first electrode 7023. For example, in the case where the first electrode 7023 is used as a cathode, the first electrode 7023 is preferably formed using, for example, a material having a low work function such as an alkali metal such as Li or Cs; an alkaline earth metal such as Mg, Ca, or Sr; an alloy containing any of these metals (e.g., Mg:Ag or Al:Li); or a rare earth metal such as Yb or Er. In this embodiment, the first electrode 7023 is used as a cathode, and the first electrode 7023 is approximately formed to a thickness such that light is transmitted (preferably, approximately 5 nm to 30 nm). For example, an aluminum layer having a thickness of 20 nm is used as the cathode.

Note that the light-transmitting conductive layer 7027 and the first electrode 7023 may be formed by stacking the light-transmitting conductive layer and the aluminum layer and then performing selective etching. In this case, the etching can be performed using the same mask, which is preferable.

Further, the periphery of the first electrode 7023 is covered with a partition wall 7029. The partition wall 7029 is formed using an organic resin film of polyimide, acrylic, polyamide, epoxy, or the like; an inorganic insulating film; or organic polysiloxane. It is particularly preferable that the partition wall 7029 be formed using a photosensitive resin material to have an opening over the first electrode 7023 so that a sidewall of the opening is formed to have an inclined surface with continuous curvature. In the case where a photosensitive resin material is used for the partition wall 7029, a step of forming a resist mask can be omitted.

As the EL layer 7024 formed over the first electrode 7023 and the partition wall 7029, an EL layer including a light-emitting layer is acceptable. Further, the EL layer 7024 may be formed to have either a single-layer structure or a stacked-layer structure. When the EL layer 7024 is formed using a plurality of layers, an electron-injection layer, an electron-transport layer, a light-emitting layer, a hole-transport layer, and a hole-injection layer are stacked in the order presented over the first electrode 7023 functioning as a cathode. Note that not all of these layers need to be provided except for the light-emitting layer.

The stacking order is not limited to the order presented above. The first electrode 7023 may serve as an anode and a hole-injection layer, a hole-transport layer, a light-emitting layer, an electron-transport layer, and an electron-injection layer may be stacked in the order presented over the first electrode 7023. However, considering power consumption, it is preferable that the first electrode 7023 is used as a cathode and an electron-injection layer, an electron-transport layer, a light-emitting layer, a hole-transport layer, and a hole-injection layer be stacked in the order presented over the cathode because power consumption can be reduced more effectively than in the case of using the first electrode 7023 as the anode.

Further, a variety of materials can be used for the second electrode 7025 formed over the EL layer 7024. For example, in the case where the second electrode 7025 is used as an anode, a material having a high work function, for example, a transparent conductive material such as ITO, IZO, or ZnO is preferable. In this embodiment, the second electrode 7025 is formed using an ITO layer including silicon oxide and is used as an anode.

The light-emitting element 7022 corresponds to a region where the EL layer 7024 including the light-emitting layer is sandwiched between the first electrode 7023 and the second electrode 7025. In the case of the element structure illustrated in FIG. 17B, light emitted from the light-emitting element 7022 is ejected to both the second electrode 7025 side and the first electrode 7023 side as indicated by arrows.

Note that in the example illustrated in FIG. 17B, a light-transmitting conductive layer is used as a gate electrode layer and a thin light-transmitting film is used as source and drain electrode layers. Light emitted from the light-emitting element 7022 to the first electrode 7023 side passes through a color filter layer 7043, and can be ejected through the substrate.

The color filter layer 7043 is formed by a droplet discharge method such as an inkjet method, a printing method, an etching method with the use of a photolithography technique, or the like.

The color filter layer 7043 is covered with the overcoat layer 7044, and also covered with the protective insulating layer 7045.

A contact hole which is formed in a planarization insulating layer 7046, the insulating layer 7042, and the insulating layer 7041, and which reaches the drain electrode layer is provided in a portion which overlaps with the partition wall 7029.

Note that in the case where full-color display is realized on both display surfaces by using a light-emitting element having a dual emission structure, light emitted from the second electrode 7025 side does not pass through the color filter layer 7043; therefore, it is preferable that a sealing substrate having a color filter layer be further provided over the second electrode 7025.

Next, a light-emitting element having a top emission structure is described with reference to FIG. 17C.

Figure 17C:
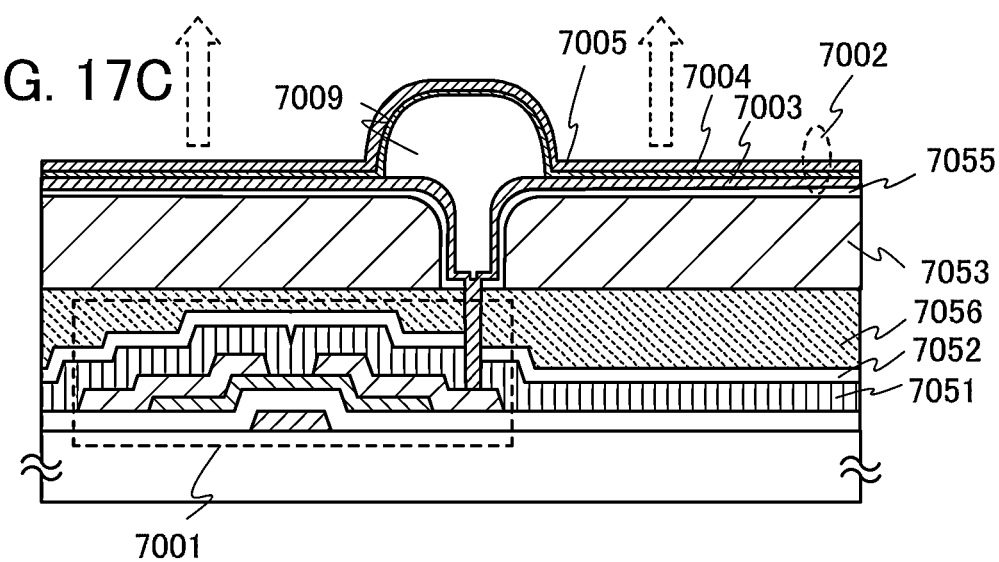

FIG. 17C is a cross-sectional view of a pixel of the case where a driving TFT 7001 is of an n-type and light emitted from a light-emitting element 7002 passes through a second electrode 7005. In FIG. 17C, a drain electrode layer of the driving TFT 7001 and a first electrode 7003 are in contact with each other, and the driving TFT 7001 and the first electrode 7003 of the light-emitting element 7002 are electrically connected to each other. An EL layer 7004 and the second electrode 7005 are stacked over the first electrode 7003 in the order presented.

Further, a variety of materials can be used for the first electrode 7003. For example, in the case where the first electrode 7003 is used as a cathode, the first electrode 7003 is preferably formed using a material having a low work function such as an alkali metal such as Li or Cs; an alkaline earth metal such as Mg, Ca, or Sr; an alloy containing any of these metals (e.g., Mg:Ag or Al:Li); or a rare earth metal such as Yb or Er.

Further, the periphery of the first electrode 7003 is covered with a partition wall 7009. The partition wall 7009 is formed using an organic resin film of polyimide, acrylic, polyamide, epoxy, or the like; an inorganic insulating film; or organic polysiloxane. It is particularly preferable that the partition wall 7009 be formed using a photosensitive resin material to have an opening over the first electrode 7003 so that a sidewall of the opening is formed to have an inclined surface with continuous curvature. In the case where a photosensitive resin material is used for the partition wall 7009, a step of forming a resist mask can be omitted.

As the EL layer 7004 formed over the first electrode 7003 and the partition wall 7009, an EL layer including at least a light-emitting layer is acceptable. Further, the EL layer 7004 may be formed to have either a single-layer structure or a stacked-layer structure. When the EL layer 7004 is formed using a plurality of layers, an electron-injection layer, an electron-transport layer, a light-emitting layer, a hole-transport layer, and a hole-injection layer are stacked in the order presented over the first electrode 7003 used as a cathode. Note that not all of these layers need to be provided except for the light-emitting layer.

The stacking order is not limited to the order presented above, and a hole-injection layer, a hole-transport layer, a light-emitting layer, an electron-transport layer, and an electron-injection layer may be stacked in the order presented over the first electrode 7003 used as an anode.

In FIG. 17C, a hole-injection layer, a hole-transport layer, a light-emitting layer, an electron-transport layer, and an electron-injection layer are stacked in the order presented over a stacked-layer film in which a Ti layer, an aluminum layer, and a Ti layer are stacked in the order presented, and thereover, a stacked layer of a thin Mg:Ag alloy film and ITO is formed.

However, in the case where the driving TFT 7001 is of an n-type, it is preferable that an electron-injection layer, an electron-transport layer, a light-emitting layer, a hole-transport layer, and a hole-injection layer be stacked in the order presented over the first electrode 7003 because an increase in voltage of a driver circuit can be prevented and power consumption can be reduced more effectively than in the case of using the layers stacked in the above order.

The second electrode 7005 is formed using a light-transmitting conductive material. For example, a light-transmitting conductive layer of indium oxide including tungsten oxide, indium zinc oxide including tungsten oxide, indium oxide including titanium oxide, indium tin oxide including titanium oxide, indium tin oxide, indium zinc oxide, or indium tin oxide to which silicon oxide is added, or the like can be used.

The light-emitting element 7002 corresponds to a region where the EL layer 7004 including the light-emitting layer is sandwiched between the first electrode 7003 and the second electrode 7005. In the case of the pixel illustrated in FIG. 17C, light emitted from the light-emitting element 7002 is ejected to the second electrode 7005 side as indicated by an arrow.

In FIG. 17C, the drain electrode layer of the driving TFT 7001 is electrically connected to the first electrode 7003 through a contact hole formed in a silicon oxide layer 7051, a protective insulating layer 7052, a planarization insulating layer 7056, a planarization insulating layer 7053, and an insulating layer 7055. The planarization insulating layers 7036, 7046, 7053, and 7056 can be formed using a resin material such as polyimide, acrylic, benzocyclobutene, polyamide, or epoxy. Other than such resin materials, it is also possible to use a low-dielectric constant material (low-k material), a siloxane-based resin, phosphosilicate glass (PSG), borophosphosilicate glass (BPSG), or the like. Note that the planarization insulating layers 7036, 7046, 7053, and 7056 may be formed by stacking a plurality of insulating layers formed using these materials. The planarization insulating layers 7036, 7046, 7053, and 7056 can be formed, depending on the material, with a method such as a sputtering method, an SOG method, a spin coating method, a dipping method, a spray coating method, or a droplet discharge method (e.g., an inkjet method, screen printing, or offset printing), or a tool (equipment) such as a doctor knife, a roll coater, a curtain coater, or a knife coater.

The partition wall 7009 is provided in order to insulate the first electrode 7003 from a first electrode of an adjacent pixel. The partition wall 7009 is formed using an organic resin film of polyimide, acrylic, polyamide, epoxy, or the like; an inorganic insulating film; or organic polysiloxane. It is particularly preferable that the partition wall 7009 be formed using a photosensitive resin material to have an opening over the first electrode 7003 so that a sidewall of the opening is formed as an inclined surface with continuous curvature. In the case where a photosensitive resin material is used for the partition wall 7009, a step of forming a resist mask can be omitted.

In the structure illustrated in FIG. 17C, for performing full-color display, the light-emitting element 7002, one of adjacent light-emitting elements, and the other of the adjacent light-emitting elements are, for example, a green emissive light-emitting element, a red emissive light-emitting element, and a blue emissive light-emitting element, respectively. Alternatively, a light-emitting display device capable of full color display may be manufactured using four kinds of light-emitting elements which include a white light-emitting element in addition to three kinds of light-emitting elements.

In the structure of FIG. 17C, a light-emitting display device capable of full color display may be manufactured in such a way that all of a plurality of light-emitting elements which is arranged is white light-emitting elements and a sealing substrate having a color filter or the like is arranged over the light-emitting element 7002. A material which exhibits a single color such as white is formed and combined with a color filter or a color conversion layer, whereby full color display can be performed.

Any of the thin film transistors of the embodiments can be used as appropriate as the driving TFTs 7001, 7011, and 7021 used for semiconductor devices, and they can be formed using steps and materials similar to those for the TFTs of the embodiments. Hydrogen or water is reduced in the oxide semiconductor layers of the driving TFTs 7001, 7011, and 7021. Thus, the driving TFTs 7001, 7011, and 7021 are highly reliable thin film transistors.

Needless to say, display of monochromatic light can also be performed. For example, a lighting system may be formed with the use of white light emission, or an area-color light-emitting device may be formed with the use of a single color light emission.

If necessary, an optical film such as a polarizing film including a circularly polarizing plate may be provided.

Note that, although the organic EL elements are described here as the light-emitting elements, an inorganic EL element can also be provided as a light-emitting element.

Note that the example is described in which a thin film transistor (a driving TFT) which controls the driving of a light-emitting element is electrically connected to the light-emitting element; however, a structure may be employed in which a TFT for current control is connected between the driving TFT and the light-emitting element.

Figure 18A:
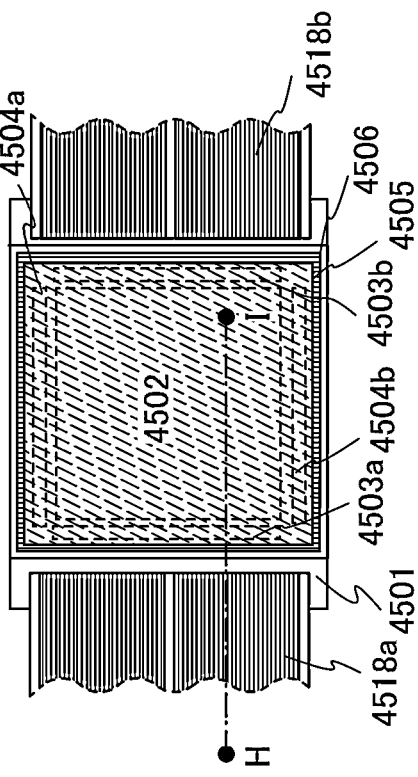
FIG. 18A is a plan view illustrating an example of a semiconductor device.
Figure 18B:
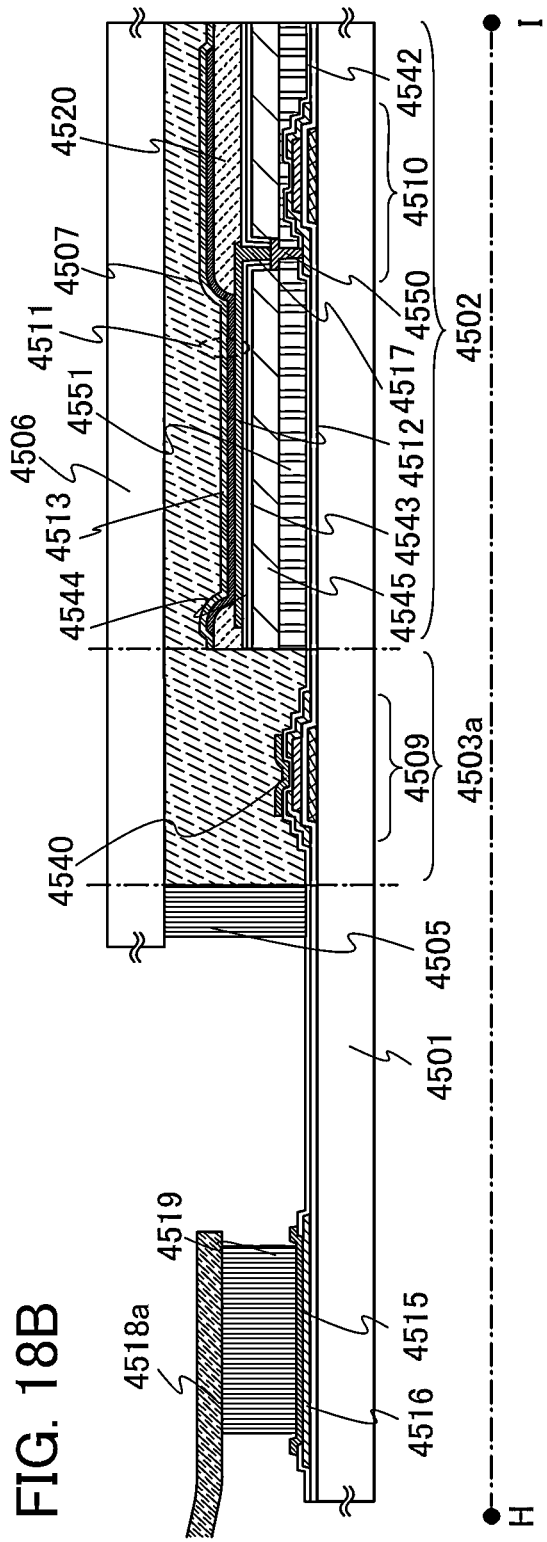
FIG. 18B is a cross-sectional view illustrating the example of the semiconductor device.

FIGS. 18A and 18B illustrate an appearance and a cross section of a light-emitting display panel (also referred to as a light-emitting panel). FIG. 18A is a plan view of a panel in which a thin film transistor and a light-emitting element that are formed over a first substrate are sealed between the first substrate and a second substrate with a sealant. FIG. 18B is a cross-sectional view taken along a line H-I in FIG. 18A.

A sealant 4505 is provided to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a panel be packaged (sealed) with a protective film (such as a laminate film or an ultraviolet curable resin film) or a cover material with high air-tightness and little degasification so that the panel is not exposed to the outside air, in this manner.

The pixel portion 4502, the signal line driver circuits 4503a and 4503b, and the scan line driver circuits 4504a and 4504b, which are formed over the first substrate 4501, each include a plurality of thin film transistors. A thin film transistor 4510 included in the pixel portion 4502 and a thin film transistor 4509 included in the signal line driver circuit 4503a are illustrated as an example in FIG. 18B.

Any of the thin film transistors of the embodiments can be used as appropriate as the thin film transistors 4509 and 4510, and they can be formed using steps and materials similar to those for the thin film transistors of the embodiments. Hydrogen or water is reduced in the oxide semiconductor layers of the thin film transistors 4509 and 4510. Thus, the thin film transistors 4509 and 4510 are highly reliable thin film transistors.

A conductive layer is provided over a portion overlapping with the channel formation region of the oxide semiconductor layer in the thin film transistor 4509. In this embodiment, the thin film transistors 4509 and 4510 are n-channel thin film transistors.

The conductive layer 4540 is provided over part of an oxide silicon layer 4542, which overlaps with the channel formation region of the oxide semiconductor layer in the thin film transistor 4509. The conductive layer 4540 is provided at the position overlapping with the channel formation region of the oxide semiconductor layer, whereby the amount of change in threshold voltage of the thin film transistor 4509 before and after the BT test can be reduced. A potential of the conductive layer 4540 may be the same or different from that of a gate electrode layer in the thin film transistor 4509. The conductive layer 4540 can also function as a second gate electrode layer. Alternatively, the potential of the conductive layer 4540 may be GND, 0 V, or the conductive layer 4540 may be in a floating state.

Further, the silicon oxide layer 4542 is formed to cover the oxide semiconductor layer of the thin film transistor 4510. The source or drain electrode layer of the thin film transistor 4510 is electrically connected to a wiring layer 4550 in an opening formed in the silicon oxide layer 4542 and an insulating layer 4551 which are formed over the thin film transistor. The wiring layer 4550 is formed in contact with a first electrode 4517, and the thin film transistor 4510 is electrically connected to the first electrode 4517 through the wiring layer 4550.

A color filter layer 4545 is formed over the insulating layer 4551 so as to overlap with a light-emitting region of a light-emitting element 4511.

Further, in order to reduce the surface roughness of the color filter layer 4545, the color filter layer 4545 is covered with an overcoat layer 4543 functioning as a planarization insulating film.

An insulating layer 4544 is formed over the overcoat layer 4543. As the insulating layer 4544, a silicon nitride layer may be formed by a sputtering method, for example.

Reference numeral 4511 denotes a light-emitting element. The first electrode 4517 which is a pixel electrode included in the light-emitting element 4511 is electrically connected to a source electrode layer or a drain electrode layer of the thin film transistor 4510, through the wiring layer 4550. Note that the light-emitting element 4511 has a stacked-layer structure of the first electrode 4517, an electroluminescent layer 4512, and a second electrode 4513, and there is no particular limitation on the structure. The structure of the light-emitting element 4511 can be changed as appropriate depending on the direction in which light is extracted from the light-emitting element 4511, or the like.

A partition wall 4520 is formed using an organic resin film, an inorganic insulating film, or organic polysiloxane. It is particularly preferable that the partition wall 4520 be formed using a photosensitive material to have an opening portion over the first electrode 4517 so that a sidewall of the opening portion is formed as a tilted surface with continuous curvature.

The electroluminescent layer 4512 may be formed to have either a single-layer structure or a stacked-layer structure.

In order to prevent entry of oxygen, hydrogen, moisture, carbon dioxide, or the like into the light-emitting element 4511, a protective layer may be formed over the second electrode 4513 and the partition wall 4520. As the protective layer, a silicon nitride layer, a silicon nitride oxide layer, a DLC layer, or the like can be formed.

In addition, a variety of signals and potentials are supplied to the signal line driver circuits 4503a and 4503b, the scan line driver circuits 4504a and 4504b, or the pixel portion 4502 from FPCs 4518a and 4518b.

A connection terminal electrode 4515 is formed using the same conductive layer as the first electrode 4517 included in the light-emitting element 4511, and a terminal electrode 4516 is formed using the same conductive layer as the source and drain electrode layers included in the thin film transistor 4509.

The connection terminal electrode 4515 is electrically connected to a terminal included in the FPC 4518a through an anisotropic conductive layer 4519.

The second substrate located in the direction in which light is extracted from the light-emitting element 4511 should have a light-transmitting property. In that case, a light-transmitting material such as a glass plate, a plastic plate, a polyester film, or an acrylic film is used for the second substrate 4506.

As the filler 4507, an ultraviolet curable resin or a thermosetting resin can be used, as well as an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. For example, nitrogen is used for the filler.

In addition, if needed, an optical film, such as a polarizing plate, a circularly polarizing plate (including an elliptically polarizing plate), or a retardation plate (a quarter-wave plate or a half-wave plate) may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface to reduce the glare can be performed.

The sealant can be formed using a screen printing method, an inkjet apparatus, or a dispensing apparatus. As the sealant, typically, a material containing a visible light curable resin, an ultraviolet curable resin, or a thermosetting resin can be used. Further, a filler may be contained.

As the signal line driver circuits 4503a and 4503b and the scan line driver circuits 4504a and 4504b, driver circuits formed using a single crystal semiconductor film or a polycrystalline semiconductor film over a substrate separately prepared may be used and mounted. Alternatively, only the signal line driver circuits or a part thereof, or only the scan line driver circuits or a part thereof may be separately formed and mounted. This embodiment is not limited to the structure illustrated in FIGS. 18A and 18B.

Through the above process, a highly reliable light-emitting display device (display panel) as a semiconductor device can be manufactured.

This embodiment can be implemented in appropriate combination with any of the other embodiments.

Embodiment 13

In this embodiment, an example of a semiconductor device including the logic circuit in Embodiment 1 or Embodiment 2 is described. Specifically, an example of electronic paper in which a driver circuit includes the logic circuit in Embodiment 1 or Embodiment 2 is described.

Figure 19:
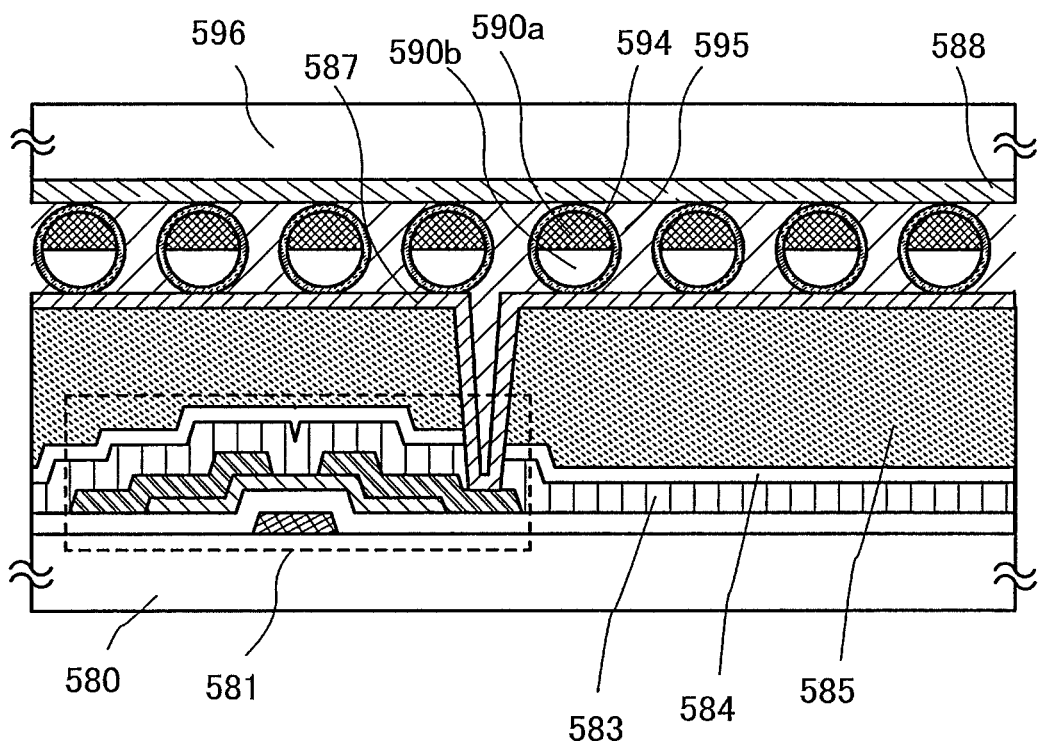
FIG. 19 is a cross-sectional view illustrating an example of a semiconductor device.

FIG. 19 is a cross-sectional view illustrating active matrix electronic paper. Any of the thin film transistors of the embodiments can be used as appropriate as a thin film transistor 581 used for electronic paper, and it can be formed using steps and materials similar to those for the thin film transistors of the embodiments. In this embodiment, the thin film transistor described in Embodiment 6 is used as the thin film transistor 581, for example. Hydrogen or water is reduced in the oxide semiconductor layer of the thin film transistor 581. Thus, the thin film transistor 581 is a highly reliable thin film transistor.

The electronic paper in FIG. 19 is an example of a display device using a twisting ball display system. The twisting ball display system refers to a system in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 formed over a substrate 580 has a bottom-gate structure in which source and drain electrode layers are electrically connected to a first electrode layer 587 through an opening formed in a silicon oxide layer 583, a protective insulating layer 584 and an insulating layer 585.

Between the first electrode layer 587 and the second electrode layer 588, spherical particles are provided. Each spherical particle includes a black region 590a and a white region 590b, and a cavity 594 filled with liquid around the black region 590a and the white region 590b. The circumference of the spherical particle is filled with a filler 595 such as a resin (see FIG. 19). In this embodiment, the first electrode layer 587 corresponds to a pixel electrode and the second electrode layer 588 provided on a counter substrate 596 corresponds to a common electrode.

Further, instead of the twisting ball, an electrophoretic element can also be used. A microcapsule having a diameter of about 10 µm to 200 µm in which transparent liquid, positively or negatively charged white microparticles, and black microparticles charged with the polarity opposite to that of the white microparticles are encapsulated, is used. In the microcapsule provided between the first electrode layer and the second electrode layer, when an electric field is applied by the first electrode layer and the second electrode layer, the white microparticles and the black microparticles move in opposite directions to each other, so that white or black can be displayed. A display element using this principle is an electrophoretic display element, and is called electronic paper in general. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

The electronic paper of this embodiment is a reflective display device, in which display is performed by controlling voltage applied to the twisting ball with a driver circuit.

This embodiment can be implemented in appropriate combination with any of the other embodiments.

Embodiment 14

In this embodiment, examples of semiconductor devices each including the logic circuit in Embodiment 1 or Embodiment 2 are described. Specifically, examples of electronic devices (including an amusement machine in its category) in which a driver circuit includes the logic circuit in Embodiment 1 or Embodiment 2 are described. Examples of electronic devices include a television set (also referred to as a television or a television receiver), a monitor of a computer or the like, a digital camera, a digital video camera, a digital photo frame, a mobile phone (also referred to as a mobile phone device), a portable game machine, a portable information terminal, an audio reproducing device, a large game machine such as a pinball machine, and the like.

Figure 20A:
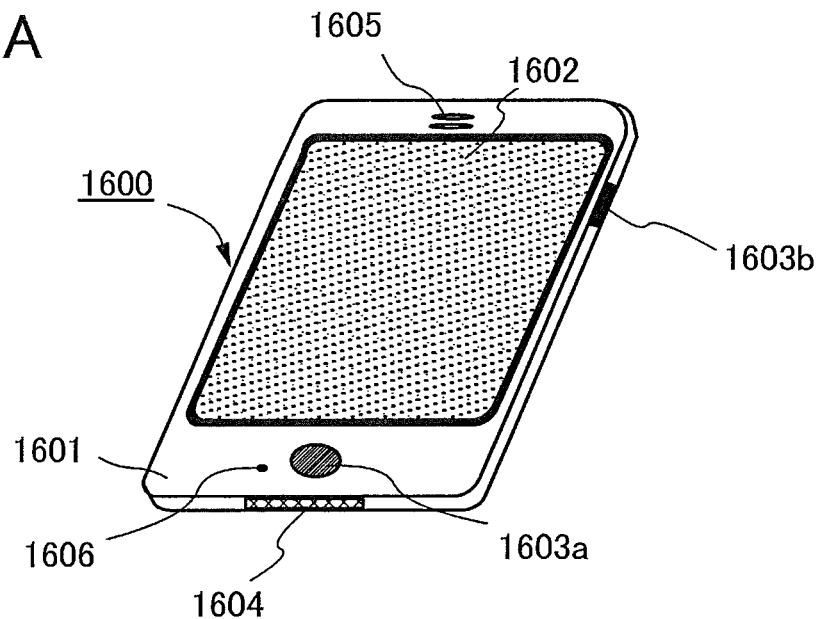
FIGS. 20A and 20B illustrate examples of semiconductor devices.

FIG. 20A illustrates an example of a mobile phone. A mobile phone 1600 is provided with a display portion 1602 incorporated in a housing 1601, operation buttons 1603a and 1603b, an external connection port 1604, a speaker 1605, a microphone 1606, and the like.

When the display portion 1602 of the mobile phone 1600 illustrated in FIG. 20A is touched with a finger or the like, data can be input into the mobile phone 1600. Further, operations such as making a call and composing a mail can be performed by touching the display portion 1602 with a finger or the like.

There are mainly three screen modes of the display portion 1602. The first mode is a display mode mainly for displaying an image. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1602 so that text displayed on a screen can be input. In this case, it is preferable to display a keyboard or number buttons on almost all area of the screen of the display portion 1602.

When a detection device including a sensor for detecting inclination, such as a gyroscope or an acceleration sensor, is provided inside the mobile phone 1600, display of the screen on the display portion 1602 can be automatically switched by determining the direction of the mobile phone 1600 (whether the mobile phone 1600 is placed horizontally or vertically for a landscape mode or a portrait mode).

The screen modes are switched by touching the display portion 1602 or operating the operation buttons 1603a and 1603b of the housing 1601. Alternatively, the screen modes may be switched depending on the kind of the image displayed on the display portion 1602. For example, when a signal for an image displayed in the display portion is data of moving images, the screen mode is switched to the display mode. When the signal is text data, the screen mode is switched to the input mode.

Further, in the input mode, when input by touching the display portion 1602 is not performed for a certain period while a signal detected by the optical sensor in the display portion 1602 is detected, the screen mode may be controlled so as to be switched from the input mode to the display mode.

The display portion 1602 may function as an image sensor. For example, an image of the palm print, the fingerprint, or the like is taken by touching the display portion 1602 with the palm or the finger, whereby personal authentication can be performed. Further, by providing a backlight or sensing light source emitting a near-infrared light for the display portion, an image of a finger vein, a palm vein, or the like can be taken.

Any of the semiconductor devices described in the embodiments can be applied to the display portion 1602. For example, a plurality of thin film transistors described in the embodiments can be disposed as switching elements in pixels.

Figure 20B:
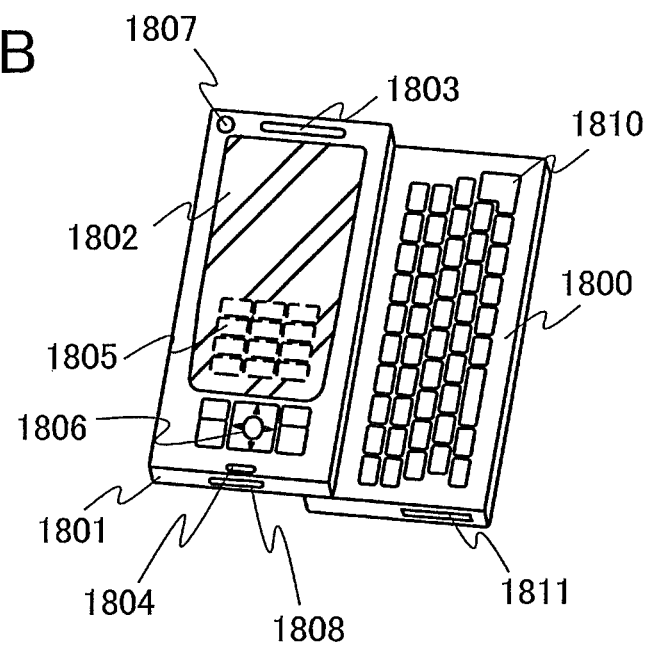

FIG. 20B also illustrates an example of a mobile phone. A portable information terminal whose example is illustrated in FIG. 20B can have a plurality of functions. For example, in addition to a telephone function, such a portable information terminal can have a function of processing a variety of pieces of data by incorporating a computer.

The portable information terminal illustrated in FIG. 20B has a housing 1800 and a housing 1801. The housing 1801 includes a display panel 1802, a speaker 1803, a microphone 1804, a pointing device 1806, a camera lens 1807, an external connection terminal 1808, and the like. The housing 1800 includes a keyboard 1810, an external memory slot 1811, and the like. In addition, an antenna is incorporated in the housing 1801.

The display panel 1802 is provided with a touch panel. A plurality of operation keys 1805 displayed as images is indicated by dashed lines in FIG. 20B.

Further, in addition to the above structure, a contactless IC chip, a small memory device, or the like may be incorporated.

In the display panel 1802, the direction of display is changed appropriately depending on an application mode. Further, the portable information terminal is provided with the camera lens 1807 on the same surface as the display panel 1802, and thus it can be used as a video phone. The speaker 1803 and the microphone 1804 can be used for videophone calls, recording, playing sound, etc. as well as voice calls. Moreover, the housings 1800 and 1801 in a state where they are developed as illustrated in FIG. 20B can be slid so that one is lapped over the other; therefore, the size of the portable information terminal can be reduced, which makes the portable information terminal suitable for being carried.

The external connection terminal 1808 can be connected to an AC adapter and various types of cables such as a USB cable, and charging and data communication with a personal computer are possible. Moreover, a storage medium can be inserted into the external memory slot 1811 so that a large amount of data can be stored and can be moved.

Further, in addition to the above functions, an infrared communication function, a television reception function, or the like may be provided.

Figure 21A:
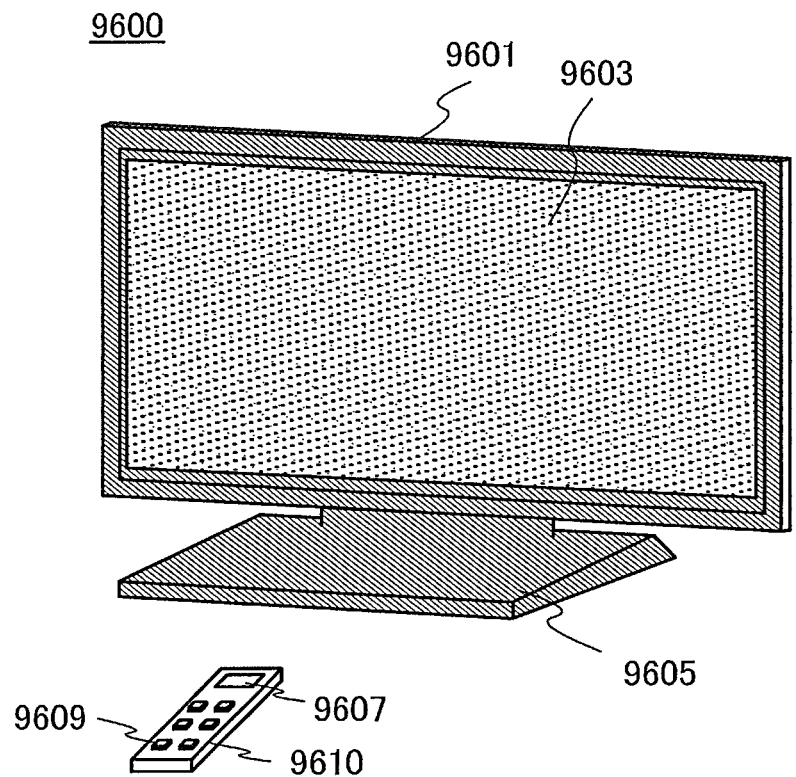
FIGS. 21A and 21B illustrate examples of semiconductor devices.

FIG. 21A illustrates an example of a television set. In a television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels can be switched and volume can be controlled with operation keys 9609 of the remote controller 9610, whereby an image displayed on the display portion 9603 can be controlled. Moreover, the remote controller 9610 may be provided with a display portion 9607 for displaying data outputted from the remote controller 9610.

Note that the television set 9600 is provided with a receiver, a modem, and the like. With the use of the receiver, general TV broadcasts can be received. Moreover, when the display device is connected to a communication network with or without wires via the modem, one-way (from a sender to a receiver) or two-way (between a sender and a receiver or between receivers) information communication can be performed.

In the display portion 9603, the plurality of thin film transistors described in any of the embodiments can be provided as switching elements of pixels.

Figure 21B:
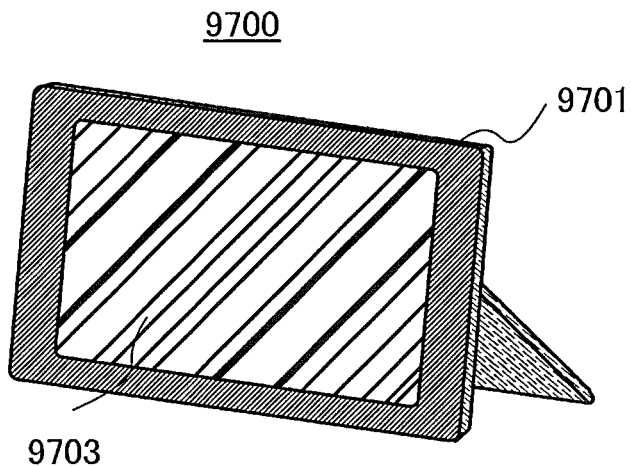

FIG. 21B illustrates an example of a digital photo frame. For example, in a digital photo frame 9700, a display portion 9703 is incorporated in a housing 9701. The display portion 9703 can display a variety of images. For example, the display portion 9703 can display data of an image taken with a digital camera or the like and function as a normal photo frame.

In the display portion 9703, the plurality of thin film transistors described in any of the embodiments can be provided as switching elements of pixels.

Note that the digital photo frame 9700 is provided with an operation portion, an external connection terminal (a USB terminal, a terminal connectable to a variety of cables such as a USB cable, or the like), a recording medium insertion portion, and the like. Although these components may be provided on the same surface as the display portion, it is preferable to provide them on the side surface or the back surface for design aesthetics. For example, a memory storing data of an image taken with a digital camera is inserted in the recording medium insertion portion of the digital photo frame and the data is loaded, whereby the image can be displayed on the display portion 9703.

The digital photo frame 9700 may be configured to transmit and receive data wirelessly. Through wireless communication, desired image data can be loaded to be displayed.

Figure 22:
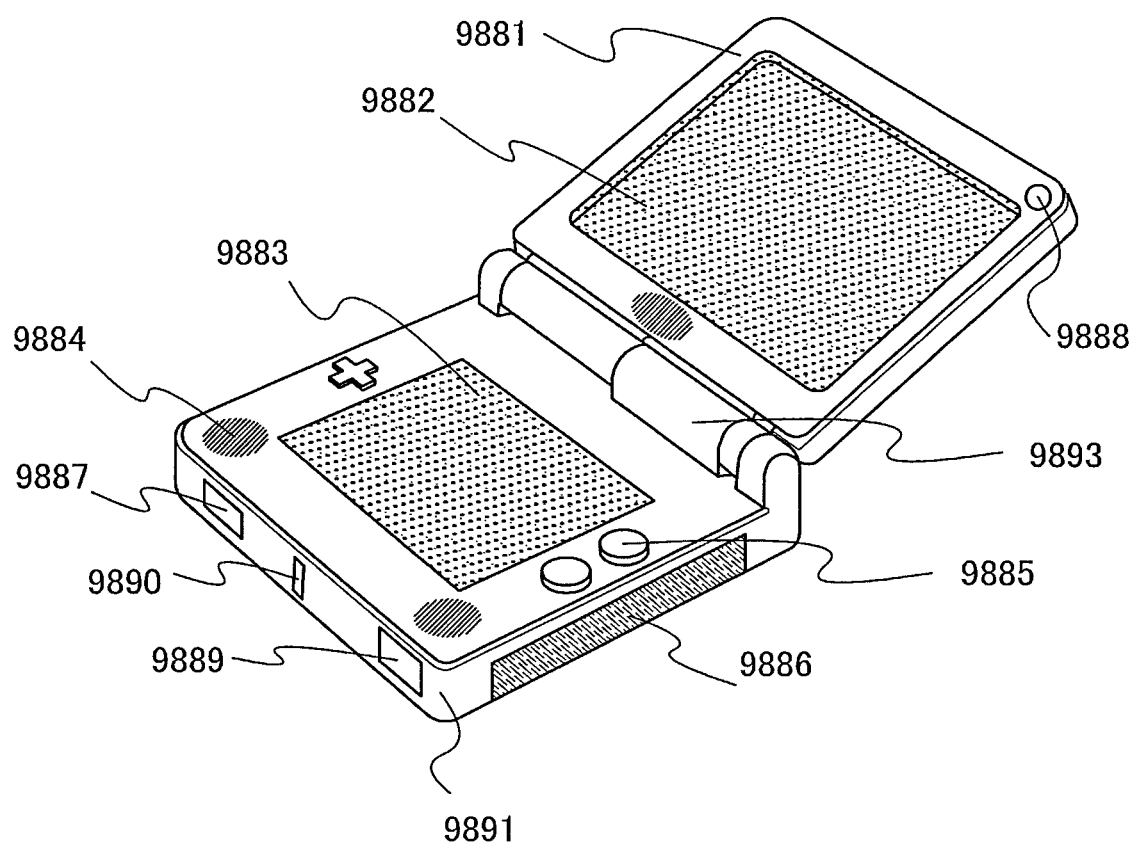
FIG. 22 illustrates an example of a semiconductor device.

FIG. 22 is a portable game machine and is constituted by two housings of a housing 9881 and a housing 9891 which are connected with a joint portion 9893 so that the portable game machine can be opened or folded. A display portion 9882 and a display portion 9883 are incorporated in the housing 9881 and the housing 9891, respectively.

In the display portion 9883, the plurality of thin film transistors described in any of the embodiments can be provided as switching elements of pixels.

In addition, the portable game machine illustrated in FIG. 22 is provided with a speaker portion 9884, a recording medium insertion portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, smell, or infrared ray), and a microphone 9889), and the like. Needless to say, the structure of the portable game machine is not limited to the above and other structures provided with at least the thin film transistor disclosed in this specification can be employed. The portable game machine may include an additional accessory as appropriate. The portable game machine illustrated in FIG. 22 has a function of reading a program or data stored in the recording medium to display it on the display portion, and a function of sharing data with another portable game machine by wireless communication. Note that a function of the portable game machine illustrated in FIG. 22 is not limited to these, and the portable game machine can have a variety of functions.

As described above, the logic circuit in Embodiment 1 or Embodiment 2 can be applied to display panels of various electronic devices and thus, electronic devices having high reliability can be provided.

Embodiment 15

In this embodiment, an example of a semiconductor device including the logic circuit in Embodiment 1 or Embodiment 2 is described. Specifically, an electronic paper in which a driver circuit includes the logic circuit in Embodiment 1 or Embodiment 2 can be used in electronic devices in all fields as long as they display information. For example, electronic paper can be applied to an e-book reader (an electronic book), a poster, an advertisement in a vehicle such as a train, or displays of various cards such as a credit card. An example of such electronic devices is illustrated in FIG. 23.

Figure 23:
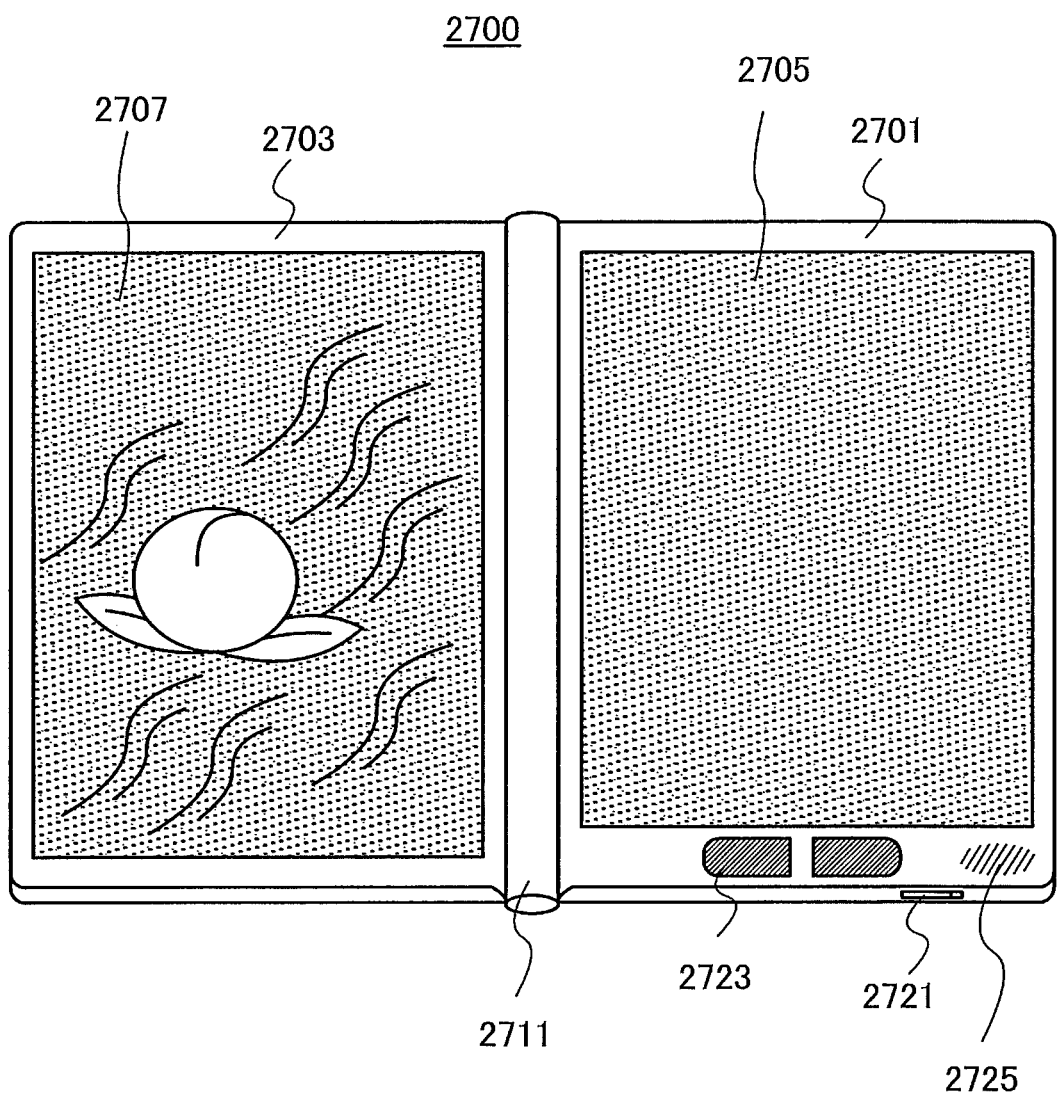
FIG. 23 illustrates an example of a semiconductor device.

FIG. 23 illustrates an example of an e-book reader. For example, an e-book reader 2700 includes two housings of a housing 2701 and a housing 2703. The housing 2701 and the housing 2703 are combined with a hinge 2711 so that the e-book reader 2700 can be opened and closed with the hinge 2711 as an axis. Such a structure enables the e-book reader 2700 to operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 23) can display text and a display portion on the left side (the display portion 2707 in FIG. 23) can display graphics.

FIG. 23 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may also be provided on the surface of the housing, on which the display portion is provided. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

This embodiment can be implemented in appropriate combination with any of the other embodiments.

Embodiment 16

In accordance with an embodiment of the present invention, impurities to be suppliers of carriers (donors or acceptors) in an oxide semiconductor are reduced to a very low level, whereby an intrinsic or substantially intrinsic oxide semiconductor is formed, and the oxide semiconductor is used for a thin film transistor.

Figure 24:
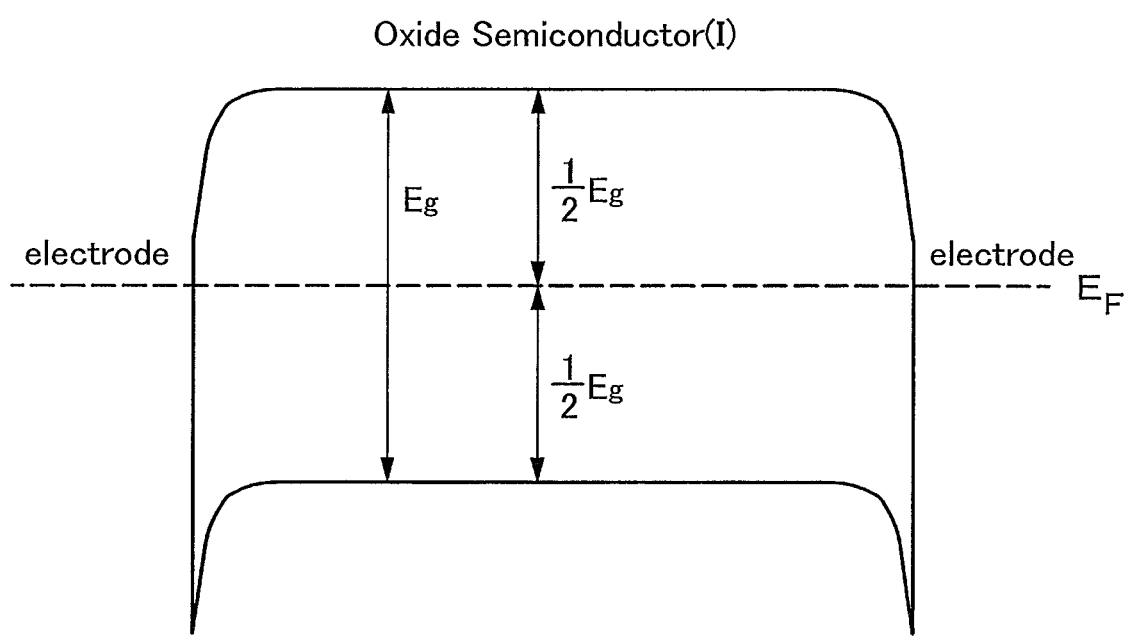
FIG. 24 illustrates a band structure of a portion between a source and a drain of a MOS transistor formed using an oxide semiconductor.

FIG. 24 is a band structure of a portion between a source and a drain of such a transistor. For a highly purified oxide semiconductor, the Fermi level is located in the middle of the forbidden band under an ideal condition.

In this case, at a junction surface, the Fermi level of metal for an electrode is the same as the level of the conduction band of an oxide semiconductor if the equation $\phi_m = \chi$ is satisfied, where $\phi_m$ is a work function and x is an electron affinity of the oxide semiconductor. When the right side of the equation is greater than the left side, an ohmic contact is provided. It is assumed that an oxide semiconductor has a band gap of 3.15 eV and an electron affinity of 4.3 eV and is in an intrinsic state (the carrier density: approximately $1 \times 10^{-7}/cm^3$), and a source electrode and a drain electrode are formed using titanium (Ti) having a work function of 4.3 eV. Under these conditions, a Schottky barrier with respect to electrons is not formed as illustrated in FIG. 24.

Figure 25:
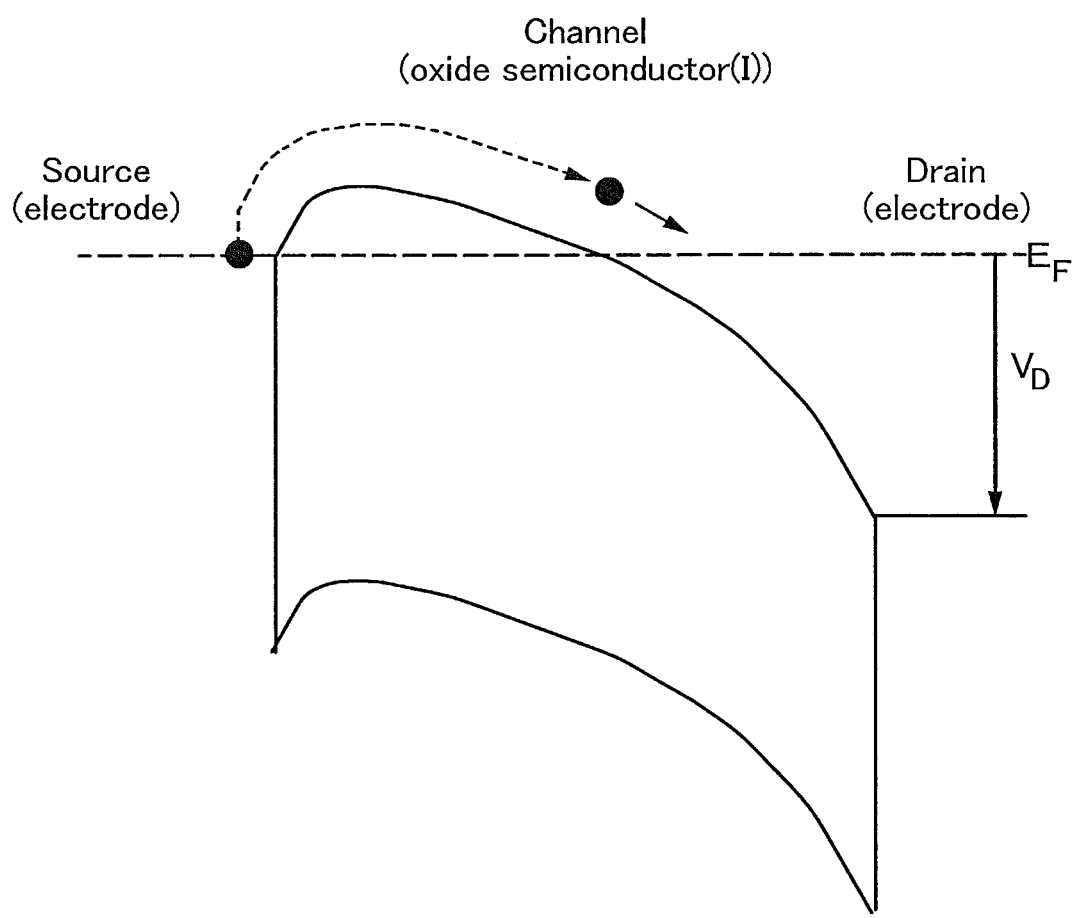
FIG. 25 illustrates a state where positive voltage is applied to the drain side in FIG. 24.

FIG. 25 illustrates a state where positive voltage is applied to the drain side in a transistor formed using an oxide semiconductor. Since the band gap of an oxide semiconductor is wide, the intrinsic carrier density of a highly purified oxide semiconductor which is intrinsic or substantially intrinsic is zero or as close as zero. However, when voltage is applied between a source and a drain, carriers (electrons) might be injected from the source side and flow into the drain side.

Figure 26A:
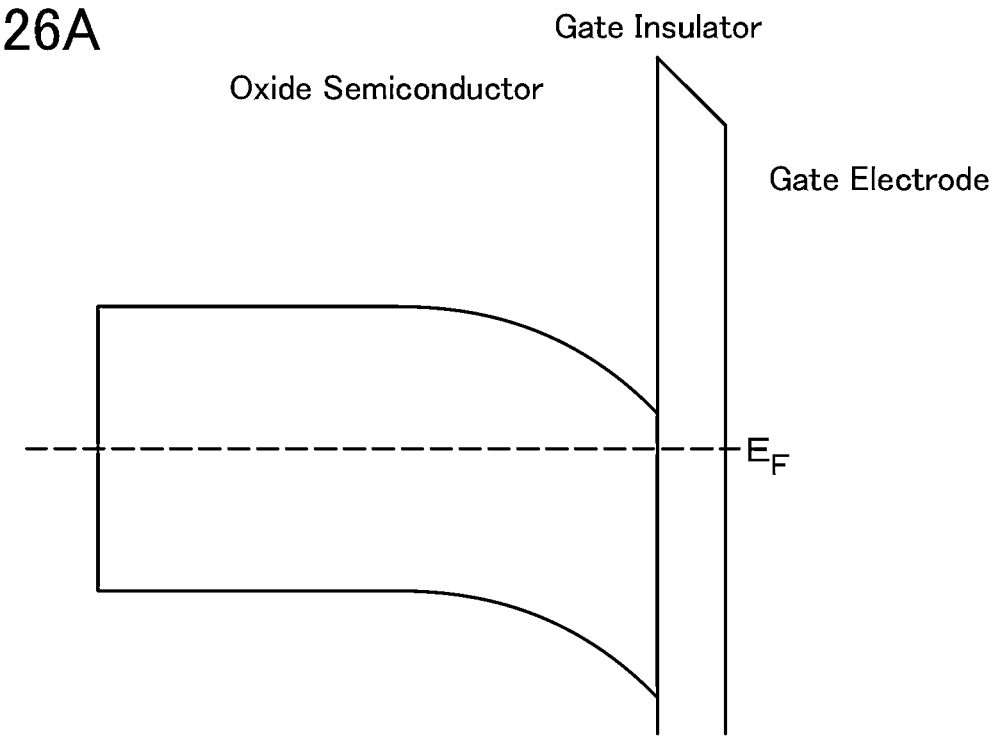
FIGS. 26A and 26B are energy band diagrams of a MOS structure of a MOS transistor formed using an oxide semiconductor, where a positive gate voltage is applied (FIG. 26A) or a negative gate voltage is applied (FIG. 26B).

FIG. 26A is an energy band diagram of a MOS transistor formed using an oxide semiconductor, to which a positive gate voltage is applied. In this case, almost no thermally excited carriers exist in a highly purified oxide semiconductor. Thus, carriers are not accumulated even in the vicinity of a gate insulating film. However, as illustrated in FIG. 25, transmission of carriers (electrons) injected from the source side is possible.

Figure 26B:
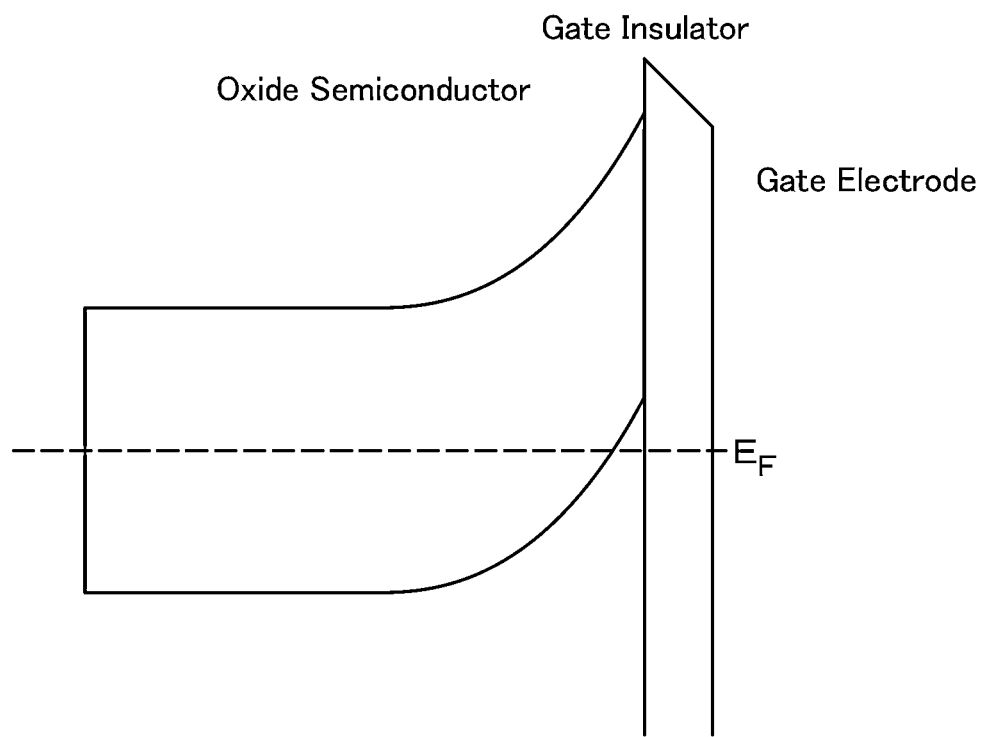

FIG. 26B is an energy band diagram of a MOS transistor formed using an oxide semiconductor, to which a negative gate voltage is applied. There are almost no minority carriers (holes) in an oxide semiconductor; therefore, carriers are not accumulated even in the vicinity of a gate insulating film. This means that off-state current is small.

Figure 27:
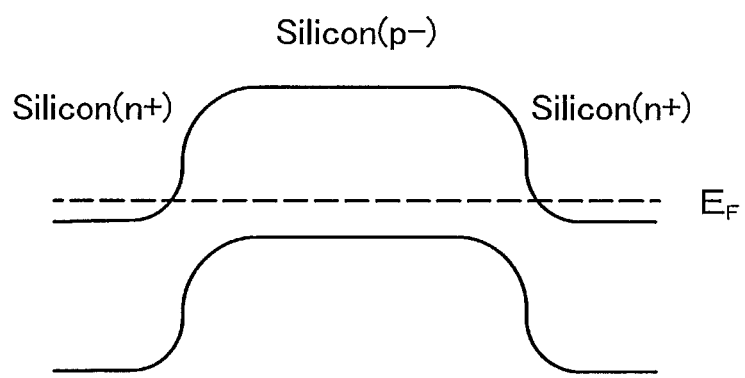
FIG. 27 illustrates a band structure of a portion between a source and a drain of a silicon MOS transistor.

FIG. 27 is a band diagram of a transistor formed using a silicon semiconductor. For a silicon semiconductor, the band gap is 1.12 eV and the intrinsic carrier density is $1.45 \times 10^{10}/cm^3$ (300 K). The thermally excited carriers are not negligible even at room temperatures. Thus, off-state current is greatly varied depending on a temperature.

In such a manner, not only by simply using an oxide semiconductor with a wide band gap for a transistor, but also by reducing impurities to be donors, such as hydrogen, and thus setting the carrier density to $1 \times 10^{14}/cm^3$ or less, preferably $1 \times 10^{12}/cm^3$ or less, thermally excited carriers at practical operation temperatures can be removed, so that a transistor can be operated by only carriers injected from the source side. Accordingly, it is possible to obtain a transistor whose off-state current is reduced to $1 \times 10^{-13}$ [A] or less and is hardly changed due to temperature change, whereby the transistor can be operated in an extremely stable manner.

Embodiment 17

In this embodiment, measured values of off-state current using a test element group (also referred to as a TEG) will be described below.

Figure 28:
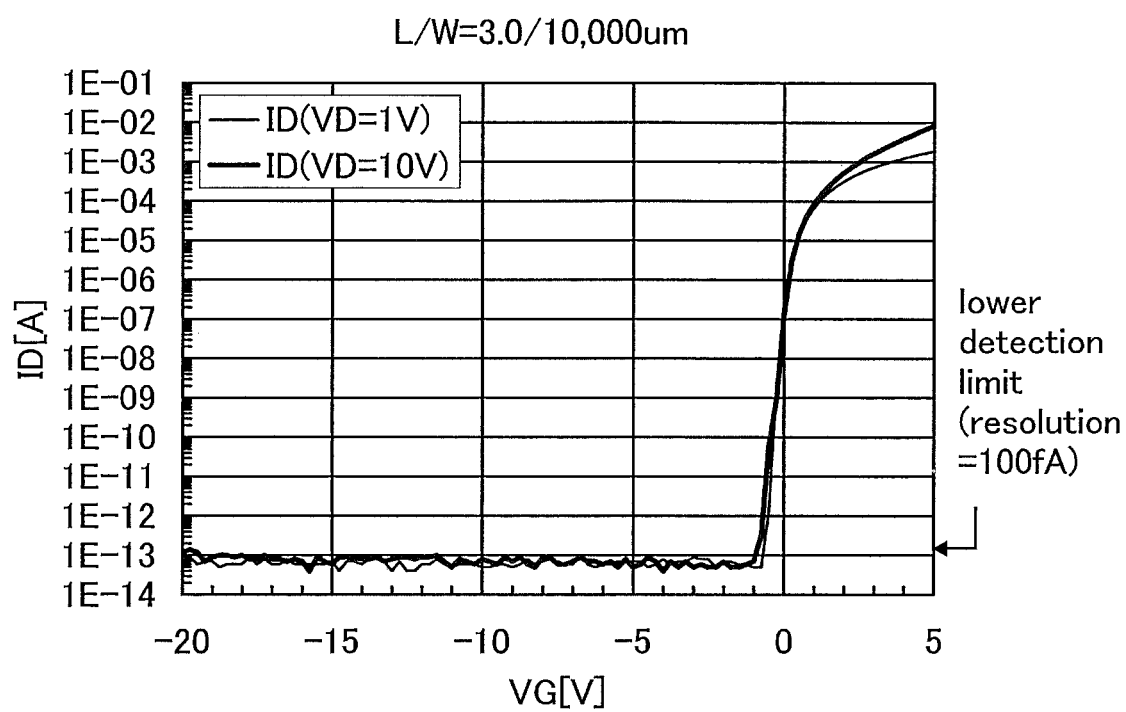
FIG. 28 is a graph illustrating initial characteristics of an example of a thin film transistor.
Figure 29A:
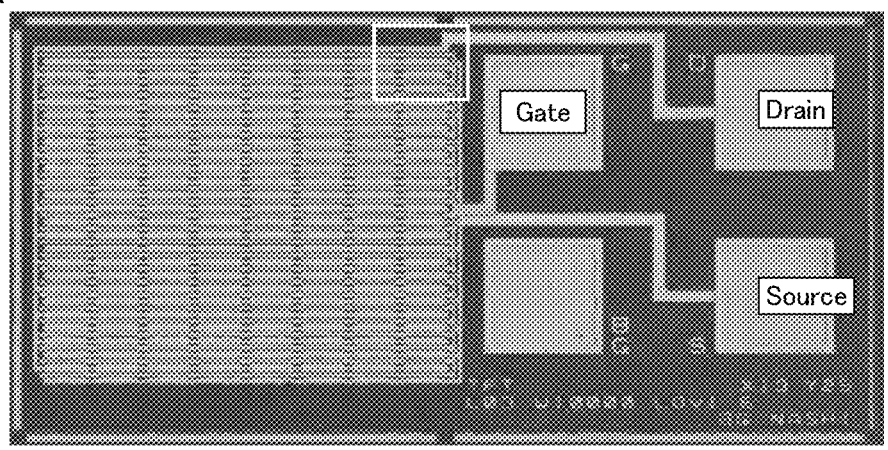
FIGS. 29A and 29B are top views of an element for evaluation, which is an example of a thin film transistor.
Figure 29B:
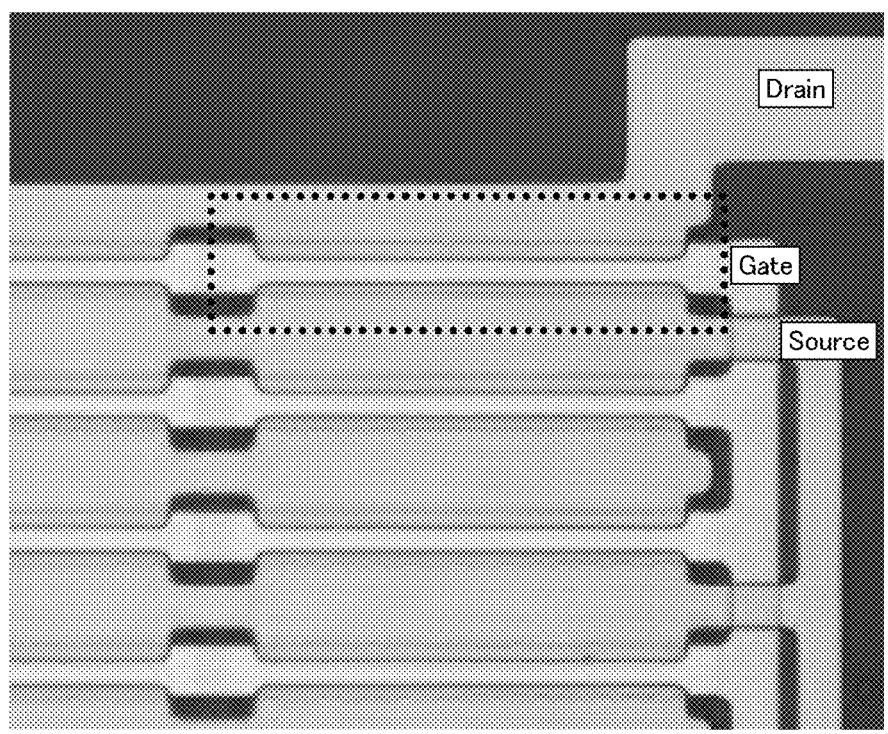

FIG. 28 shows initial characteristics of a thin film transistor with effectively L/W=3 μm/10000 μm, in which 200 thin film transistors each with L/W=3 μm/50 μm are connected in parallel. In addition, a top view is shown in FIG. 29A and a partially enlarged top view thereof is show in FIG. 29B. The region enclosed by a dotted line in FIG. 29B is a thin film transistor of one stage with L/W=3 μm/50 μm and Lov=1.5 m. In order to measure initial characteristics of the thin film transistor, the transfer characteristics of the source-drain current (hereinafter referred to as a drain current or Id), i.e., Vg-Id characteristics, were measured, under the conditions where the substrate temperature was set to room temperature, the voltage between source and drain (hereinafter, a drain voltage or Vd) was set to 10 V, and the voltage between source and gate (hereinafter, a gate voltage or Vg) was changed from −20 V to +20 V. Note that FIG. 28 shows Vg in the range of from −20 V to +5 V.

As shown in FIG. 28, the thin film transistor having a channel width W of 10000 μm has an off-state current of $1 \times 10^{-13}$ A or less at Vd of 1 V and 10 V, which is less than or equal to the resolution (100 fA) of a measurement device (a semiconductor parameter analyzer, Agilent 4156C manufactured by Agilent Technologies Inc.).

A method for manufacturing the thin film transistor used for the measurement is described.

First, a silicon nitride layer was formed as a base layer over a glass substrate by a CVD method, and a silicon oxynitride layer was formed over the silicon nitride layer. A tungsten layer was formed as a gate electrode layer over the silicon oxynitride layer by a sputtering method. Here, the gate electrode layer was formed by selectively etching the tungsten layer.

Then, a silicon oxynitride layer having a thickness of 100 nm was formed as a gate insulating layer over the gate electrode layer by a CVD method.

Then, an oxide semiconductor layer having a thickness of 50 nm was formed over the gate insulating layer by a sputtering method using an In—Ga—Zn—O-based metal oxide target (at a molar ratio of $In_2O_3:Ga_2O_3:ZnO=1:1:2$). Here, an island-shaped oxide semiconductor layer was formed by selectively etching the oxide semiconductor layer.

Then, first heat treatment was performed on the oxide semiconductor layer in a nitrogen atmosphere in a clean oven at 450° C. for 1 hour.

Then, a titanium layer (having a thickness of 150 nm) was formed as a source electrode layer and a drain electrode layer over the oxide semiconductor layer by a sputtering method. Here, the source electrode layer and the drain electrode layer were formed by selective etching such that 200 thin film transistors each having a channel length L of 3 μm and a channel width W of 50 μm were connected in parallel to obtain a thin film transistor effectively with L/W=3 μm/10000 μm.

Then, a silicon oxide layer having a thickness of 300 nm was formed as a protective insulating layer in contact with the oxide semiconductor layer by a reactive sputtering method. Here, opening portions were formed over the gate electrode layer, the source electrode layer, and the drain electrode layer by selectively etching the silicon oxide layer which is a protective layer. After that, second heat treatment was performed in a nitrogen atmosphere at 250° C. for 1 hour.

Then, heat treatment was performed at 150° C. for 10 hours before the measurement of Vg-Id characteristics.

Through the above process, a bottom-gate thin film transistor was manufactured.

The reason why the thin film transistor has an off-state current of approximately $1 \times 10^{-13}$ A as shown in FIG. 28 is that the concentration of hydrogen in the oxide semiconductor layer could be sufficiently reduced in the above manufacturing process. The concentration of hydrogen in the oxide semiconductor layer is $5 \times 10^{19}/cm^3$ or less, preferably $5 \times 10^{18}/cm^3$ or less, still preferably $5 \times 10^{17}/cm^3$ or less. Note that the concentration of hydrogen in the oxide semiconductor layer was measured by secondary ion mass spectrometry (SIMS).

Although the example of using an In—Ga—Zn—O-based oxide semiconductor is described, this embodiment is not particularly limited thereto. Another oxide semiconductor material, such as an In—Sn—Zn—O-based oxide semiconductor, a Sn—Ga—Zn—O-based oxide semiconductor, an Al—Ga—Zn—O-based oxide semiconductor, a Sn—Al—Zn—O-based oxide semiconductor, an In—Zn—O-based oxide semiconductor, an In—Sn—O-based oxide semiconductor, a Sn—Zn—O-based oxide semiconductor, an Al—Zn—O-based oxide semiconductor, an In—O-based oxide semiconductor, a Sn—O-based oxide semiconductor, or a Zn—O-based oxide semiconductor, can also be used.

Furthermore, as an oxide semiconductor material, an In—Al—Zn—O-based oxide semiconductor mixed with $AlO_x$ of 2.5 wt % to 10 wt % or an In—Zn—O-based oxide semiconductor mixed with $SiO_x$ of 2.5 wt % to 10 wt % can be used.

The carrier concentration of the oxide semiconductor layer which is measured by a carrier measurement device is preferably less than or equal to $1.45 \times 10^{10}/cm^3$, which is intrinsic carrier density of silicon. Specifically, the carrier concentration is $5 \times 10^{14}/cm^3$, preferably $5 \times 10^2/cm^3$. In other words, the carrier concentration of the oxide semiconductor layer can be made as close to zero as possible.

The thin film transistor can also have a channel length L of 10 nm to 1000 nm inclusive, which enables an increase in circuit operation speed, and the off-state current is extremely small, which enables a further reduction in power consumption.

In addition, in circuit design, the oxide semiconductor layer can be regarded as an insulator when the thin film transistor is in an off state.

After that, the temperature characteristics of off-state current of the thin film transistor manufactured in this embodiment were evaluated. Temperature characteristics are important in considering the environmental resistance, maintenance of performance, or the like of an end product in which the thin film transistor is used. It is to be understood that a smaller amount of change is more preferable, which increases the degree of freedom for product designing.

For the temperature characteristics, the Vg-Id characteristics were obtained using a constant-temperature chamber under the conditions where substrates provided with thin film transistors were kept at respective constant temperatures of −30° C., 0° C., 25° C., 40° C., 60° C., 80° C., 100° C., and 120° C., the drain voltage was set to 6 V, and the gate voltage was changed from −20 V to +20V.

Figure 30A:
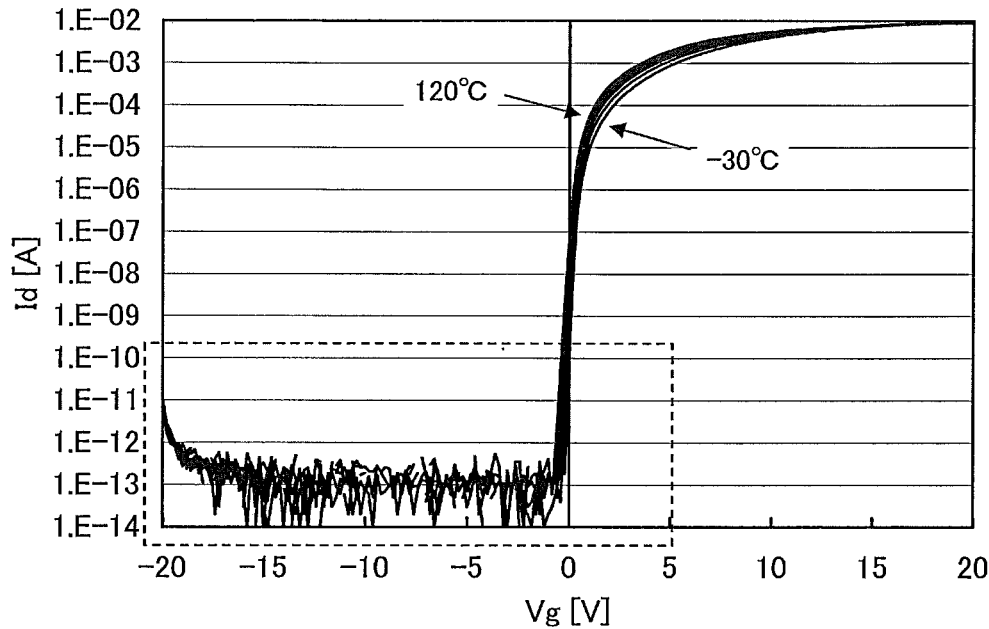
FIGS. 30A and 30B are graphs illustrating Vg-Id characteristics of an element for evaluation, which is an example of a thin film transistor.
Figure 30B:
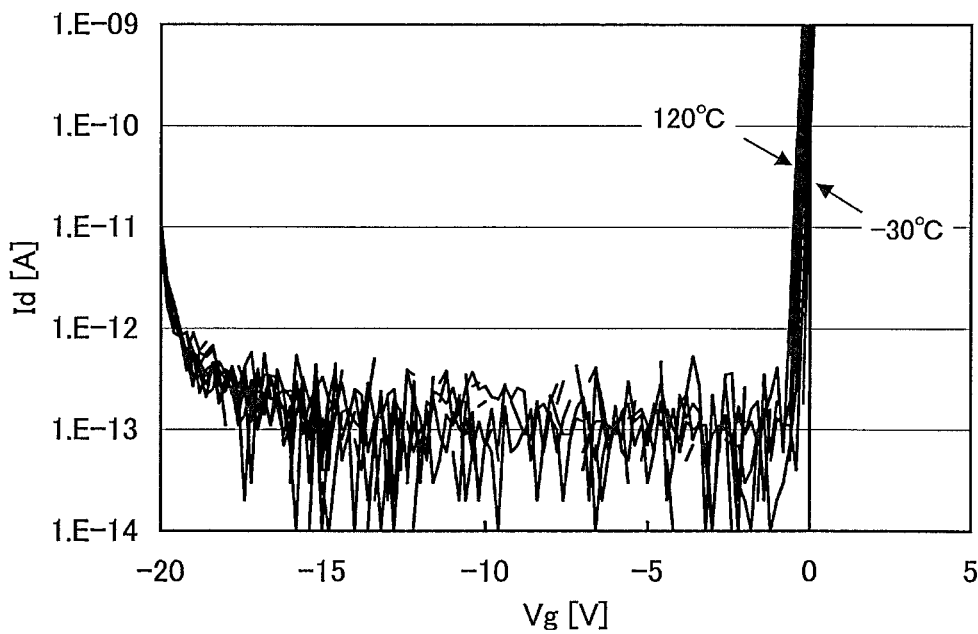

FIG. 30A shows Vg-Id characteristics measured at the above temperatures and superimposed on one another, and FIG. 30B shows an enlarged view of a range of off-state current enclosed by a dotted line in FIG. 30A. The rightmost curve indicated by an arrow in the diagram is a curve obtained at −30° C.; the leftmost curve is a curve obtained at 120° C.; and curves obtained at the other temperatures are located therebetween. The temperature dependence of on-state currents can hardly be observed. On the other hand, as clearly shown also in the enlarged view of FIG. 30B, the off-state currents are less than or equal to $1 \times 10^{-12}$ A, which is near the resolution of the measurement device, at all temperatures except in the vicinity of a gate voltage of −20 V, and the temperature dependence thereof is not observed. In other words, even at a high temperature of 120° C., the off-state current is kept less than or equal to $1 \times 10^{-12}$ A, and further in consideration that the effective channel width W is 10000 μm, it can be seen that the off-state current is significantly small.

A thin film transistor including a purified oxide semiconductor (purified OS) as described above shows almost no dependence of off-state current on temperature. This also results from the fact that the oxide semiconductor has an energy gap of 3 eV or more and includes very few intrinsic carriers. In addition, the source region and the drain region are in a degenerated state, which is also a factor for showing no temperature dependence. The thin film transistor is mainly operated with carriers which are injected from the degenerated source region to the oxide semiconductor, and the above characteristics (independence of off-state current on temperature) can be explained by independence of carrier density on temperature.

In the case where a memory circuit (memory element) or the like is manufactured using a thin film transistor having such an extremely small off-state current, there is very little leakage due to the small off-state current. Therefore, memory data can be held for a longer period of time.

This application is based on Japanese Patent Application serial no. 2009-238914 filed with Japan Patent Office on Oct. 16, 2009, the entire contents of which are hereby incorporated by reference.

REFERENCE NUMERALS

11: thin film transistor, 12: thin film transistor, 13: thin film transistor, 14: thin film transistor, 15: capacitor, 21: thin film transistor, 22: thin film transistor, 23: thin film transistor, 24: thin film transistor, 25: capacitor, 31: thin film transistor, 41: thin film transistor, 101: thin film transistor, 102: thin film transistor, 103: thin film transistor, 104: thin film transistor, 105: capacitor, 110: pulse output circuit, 111: thin film transistor, 112: thin film transistor, 113: thin film transistor, 114: thin film transistor, 115: capacitor, 120: pulse output circuit, 121: thin film transistor, 122: thin film transistor, 123: thin film transistor, 124: thin film transistor, 125: capacitor, 130: pulse output circuit, 201: thin film transistor, 202: thin film transistor, 203: thin film transistor, 204: thin film transistor, 205: capacitor, 210: pulse output circuit, 211: thin film transistor, 212: thin film transistor, 213: thin film transistor, 214: thin film transistor, 215: capacitor, 220: pulse output circuit, 221: thin film transistor, 222: thin film transistor, 223: thin film transistor, 224: thin film transistor, 225: capacitor, 230: pulse output circuit, 300: substrate, 302: gate insulating layer, 303: protective insulating layer, 310: thin film transistor, 311: gate electrode layer, 313: channel formation region, 314*a*: high-resistance source region, 314*b*: high-resistance drain region, 315*a*: source electrode layer, 315*b*: drain electrode layer, 316: oxide insulating layer, 320: substrate, 322: gate insulating layer, 323: protective insulating layer, 330: oxide semiconductor layer, 331: oxide semiconductor layer, 332: oxide semiconductor layer, 340: substrate, 342: gate insulating layer, 343: protective insulating layer, 345: oxide semiconductor layer, 346: oxide semiconductor layer, 350: thin film transistor, 351: gate electrode layer, 352: oxide semiconductor layer, 355*a*: source electrode layer, 355*b*: drain electrode layer, 356: oxide insulating layer, 360: thin film transistor, 361: gate electrode layer, 362: oxide semiconductor layer, 363: channel formation region, 364*a*: high-resistance source region, 364*b*: high-resistance drain region, 365*a*: source electrode layer, 365*b*: drain electrode layer: 366: oxide insulating layer, 370: substrate, 372*a*: first gate insulating layer, 372*b*: second gate insulating layer, 373: protective insulating layer, 380: thin film transistor, 381: gate electrode layer, 382: oxide semiconductor layer, 385*a*: source electrode layer, 385*b*: drain electrode layer, 386: oxide insulating layer, 390: thin film transistor, 391: gate electrode layer, 392: oxide semiconductor layer, 393: oxide semiconductor layer, 394: substrate, 395*a*: source electrode layer, 395*b*: drain electrode layer, 396: oxide insulating layer, 397: gate insulating layer, 398: protective insulating layer, 399: oxide semiconductor layer, 400: substrate, 402: gate insulating layer, 407: insulating layer, 410: thin film transistor, 411: gate electrode layer, 412: oxide semiconductor layer, 414*a*: wiring layer, 414*b*: wiring layer, 415*a*: source or drain electrode layer, 415*b*: source or drain electrode layer, 420: silicon substrate, 421*a*: opening, 421*b*: opening, 422: insulating layer, 423: opening, 424: conductive layer, 425: thin film transistor, 426: thin film transistor, 427: conductive layer, 450: substrate, 452: gate insulating layer, 457: insulating layer, 460: thin film transistor, 461: gate electrode layer, 461*a*: gate electrode layer, 461*b*: gate electrode layer, 462: oxide semiconductor layer, 464: wiring layer, 465*a*: source or drain electrode layer, 465*a*1: source or drain electrode layer, 465*a*2: source or drain electrode layer, 465*b*: source or drain electrode layer, 468: wiring layer, 580: substrate, 581: thin film transistor, 583: silicon oxide layer, 584: protective insulating layer, 585: insulating layer, 587: electrode layer, 588: electrode layer, 590*a*: black region, 590*b*: white region, 594: cavity, 595: filler, 596: counter substrate, 1600: mobile phone, 1601: housing, 1602: display portion, 1603*a*: operation button, 1603*b*: operation button, 1604: external connection port, 1605: speaker, 1606: microphone, 1800: housing, 1801: housing, 1802: display panel, 1803: speaker, 1804: microphone, 1805: operation key, 1806: pointing device, 1807: camera lens, 1808: external connection terminal, 1810: keyboard, 1811: external memory slot, 2700: e-book reader, 2701: housing, 2703: housing, 2705: display portion, 2707: display portion, 2711: hinge, 2721: power switch, 2723: operation key, 2725: speaker, 4001: substrate, 4002: pixel portion, 4003: signal line driver circuit, 4004: scan line driver circuit, 4005: sealant, 4006: substrate, 4008: liquid crystal layer, 4010: thin film transistor, 4011: thin film transistor, 4013: liquid crystal element, 4015: connection terminal electrode, 4016: terminal electrode, 4018: FPC, 4019: anisotropic conductive film, 4021: insulating layer, 4030: pixel electrode layer, 4031: counter electrode layer, 4032: insulating layer, 4033: insulating layer, 4040: conductive layer, 4041: insulating layer, 4042: insulating layer, 4501: substrate, 4502: pixel portion, 4503*a* signal line driver circuit, 4503*b*: signal line driver circuit, 4504*a*: scan line driver circuit, 4504*b*: scan line driver circuit, 4505: sealant, 4506: substrate, 4507: filler, 4509: thin film transistor, 4510: thin film transistor, 4511: light-emitting element, 4512: electroluminescent layer, 4513: electrode, 4515: connection terminal electrode, 4516: terminal electrode, 4517: electrode, 4518*a*: FPC, 4518*b*: FPC, 4519: anisotropic conductive layer, 4520: partition wall, 4540: conductive layer, 4542: silicon oxide layer, 4543: overcoat layer, 4544: insulating layer, 4545: color filter layer, 4550: wiring layer, 4551: insulating layer, 6400: pixel, 6401: switching transistor, 6402: driving transistor, 6403: capacitor, 6404: light-emitting element, 6405: signal line, 6406: scan line, 6407: power supply line, 6408: common potential line, 7001: driving TFT, 7002: light-emitting element, 7003: electrode, 7004: EL layer, 7005: electrode, 7009: partition wall, 7011: driving TFT, 7012: light-emitting element, 7013: electrode, 7014: EL layer, 7015: electrode, 7016: shielding film, 7017: conductive layer, 7019: partition wall, 7021: driving TFT, 7022: light-emitting element, 7023: electrode, 7024: EL layer, 7025: electrode, 7026: electrode, 7027: conductive layer, 7029: partition wall, 7031: insulating layer, 7032: insulating layer, 7033: color filter layer, 7034: overcoat layer, 7035: protective insulating layer, 7036: planarization insulating layer, 7041: insulating layer, 7042: insulating layer, 7043: color filter layer, 7044: overcoat layer, 7045: protective insulating layer, 7046: planarization insulating layer, 7051: silicon oxide layer, 7052: protective insulating layer, 7053: planarization insulating layer, 7055: insulating layer, 7056: planarization insulating layer, 9600: television set, 9601: housing, 9603: display portion, 9605: stand, 9607: display portion, 9609: operation key, 9610: remote controller, 9700: digital photo frame, 9701: housing, 9703: display portion, 9881: housing, 9882: display portion, 9883: display portion, 9884: speaker portion, 9885: operation key, 9886: recording medium insertion portion, 9887: connection terminal, 9888: sensor, 9889: microphone, 9890: LED lamp, 9891: housing, 9893: joint portion

What is claimed is:

1. A semiconductor device comprising:
  a display portion, the display portion comprising:
    a light-emitting element; and
    a first transistor electrically connected to a first electrode of the light-emitting element, the first transistor comprising:
      a first gate electrode layer over a substrate and a first insulating layer;
      a second insulating layer over the first gate electrode layer;
      an oxide semiconductor layer over the second insulating layer;
      a first wiring layer electrically connected to the oxide semiconductor layer via a first opening provided in a third insulating layer;
      a second wiring layer electrically connected to the oxide semiconductor layer via a second opening provided in the third insulating layer; and
      a second gate electrode layer over the third insulating layer, wherein the first transistor is provided below the first electrode of the light-emitting element, wherein the third insulating layer is provided over and in contact with the oxide semiconductor layer, wherein the second gate electrode layer overlaps with the oxide semiconductor layer and the first gate electrode layer, wherein the oxide semiconductor layer comprises indium, gallium, and zinc, wherein the first gate electrode layer and the second gate electrode layer are electrically connected to each other, wherein, in a cross-sectional view, the first wiring layer and the second wiring layer do not overlap with the first gate electrode layer and the second gate electrode layer, wherein the first electrode of the light-emitting element overlaps with a channel formation region of the first transistor, and wherein the oxide semiconductor layer is an island-shaped layer.

2. A semiconductor device comprising:
a display portion, the display portion comprising:
   a light-emitting element; and
   a first transistor electrically connected to a first electrode of the light-emitting element, the first transistor comprising:
      a first gate electrode layer over a substrate;
      a first insulating layer over the first gate electrode layer;
      an oxide semiconductor layer over the first insulating layer;
      a first wiring layer electrically connected to the oxide semiconductor layer via a first opening provided in a second insulating layer;
      a second wiring layer electrically connected to the oxide semiconductor layer via a second opening provided in the second insulating layer; and
      a second gate electrode layer over the second insulating layer, wherein the first transistor is provided below the first electrode of the light-emitting element, wherein the second insulating layer is provided over and in contact with the oxide semiconductor layer, wherein the second gate electrode layer overlaps with the oxide semiconductor layer and the first gate electrode layer, wherein the first gate electrode layer and the second gate electrode layer are electrically connected to each other, wherein, in a cross-sectional view, the first wiring layer and the second wiring layer do not overlap with the first gate electrode layer and the second gate electrode layer, wherein the first electrode of the light-emitting element overlaps with a channel formation region of the first transistor, and wherein the oxide semiconductor layer is an island-shaped layer.

3. A semiconductor device comprising:
a first transistor, the first transistor comprising:
   a first gate electrode layer over a substrate;
   a first insulating layer over the first gate electrode layer;
   an oxide semiconductor layer over the first insulating layer;
   a first wiring layer electrically connected to the oxide semiconductor layer via a first opening provided in a second insulating layer;
   a second wiring layer electrically connected to the oxide semiconductor layer via a second opening provided in the second insulating layer; and
   a second gate electrode layer over the second insulating layer, wherein the second insulating layer is provided over and in contact with the oxide semiconductor layer, wherein the second gate electrode layer overlaps with the oxide semiconductor layer and the first gate electrode layer, wherein the first gate electrode layer and the second gate electrode layer are connected to each other, wherein, in a cross-sectional view, the first wiring layer and the second wiring layer do not overlap with the first gate electrode layer and the second gate electrode layer, wherein the oxide semiconductor layer is an island-shaped layer, wherein the oxide semiconductor layer comprises a crystalline portion, and wherein a grain diameter of the crystalline portion is greater than or equal to 1 nm and less than or equal to 20 nm.

* * * * *